United States Patent
Ohta et al.

(10) Patent No.: US 6,307,897 B1
(45) Date of Patent: Oct. 23, 2001

(54) RADIO RECEIVING APPARATUS FOR RECEIVING COMMUNICATION SIGNALS OF DIFFERENT BANDWIDTHS

(75) Inventors: Gen-ichiro Ohta; Kazunori Inogai; Hiroaki Sudo; Fujio Sasaki, all of Kanagawa (JP)

(73) Assignee: Matsushita Electric Industiral Co., Ltd., Osaka (JP)

( * ) Notice: Subject to any disclaimer, the term of this patent is extended or adjusted under 35 U.S.C. 154(b) by 0 days.

(21) Appl. No.: 09/456,469

(22) Filed: Dec. 8, 1999

Related U.S. Application Data

(62) Division of application No. 08/824,774, filed on Mar. 26, 1997, now Pat. No. 6,026,129.

(30) Foreign Application Priority Data

Mar. 27, 1996 (JP) .......................................... 8-95891
Jan. 29, 1997 (JP) .......................................... 9-28271

(51) Int. Cl.[7] .................................................. H04L 27/22
(52) U.S. Cl. ................................................ 375/316; 375/350
(58) Field of Search ........................................ 375/316, 324, 375/329, 344, 345, 348, 350; 370/488, 497; 708/300, 313

(56) References Cited

U.S. PATENT DOCUMENTS

| | | |
|---|---|---|
| 4,893,316 | 1/1990 | Janc et al. . |
| 5,122,879 | 6/1992 | Ito . |
| 5,163,159 | 11/1992 | Rich et al. . |
| 5,375,146 * | 12/1994 | Chalmers ............................. 375/350 |
| 5,490,173 * | 2/1996 | Whikehart et al. ................... 375/316 |
| 5,548,619 | 8/1996 | Horiike et al. . |
| 5,642,382 * | 6/1997 | Juan .................................... 375/232 |
| 5,737,035 | 4/1998 | Rotzoll . |
| 5,754,601 * | 5/1998 | Horng et al. ......................... 375/350 |
| 5,757,867 * | 5/1998 | Caulfield et al. .................... 375/350 |
| 5,799,037 | 8/1998 | Strolle et al. . |
| 5,926,513 * | 7/1999 | Suominen et al. ................... 375/346 |
| 5,999,575 * | 12/1999 | Tanaka et al. ....................... 375/329 |

FOREIGN PATENT DOCUMENTS

| | | |
|---|---|---|
| Sho. 62-171228 | 10/1987 | (JP) . |
| Hei. 6-164243 | 6/1994 | (JP) . |

* cited by examiner

Primary Examiner—Young T. Tse
(74) Attorney, Agent, or Firm—Pearne & Gordon LLP

(57) ABSTRACT

A received signal obtained from an antenna is subjected to high-frequency amplification. The amplified signal is supplied to a first bandpass filter, which extracts only signals of all the channels of a communications system concerned while filtering out other radio signals. The extracted signals are frequency-converted by using a local oscillation frequency, and only a desired wave is passed by a second bandpass filter. The desired wave is supplied to a sample-and-hold circuit, which performs sampling according to the bandwidth-limiting sampling theorem. A resulting discrete signal is supplied to an I-axis-component and Q-axis-component separating circuits, where the polarity of sample values is inverted for every other clock pulse with respect to each of the I and Q axes to thereby effect Hilbert transform. Resulting two orthogonal components on a phase plane are supplied to a complex coefficient filter.

5 Claims, 42 Drawing Sheets

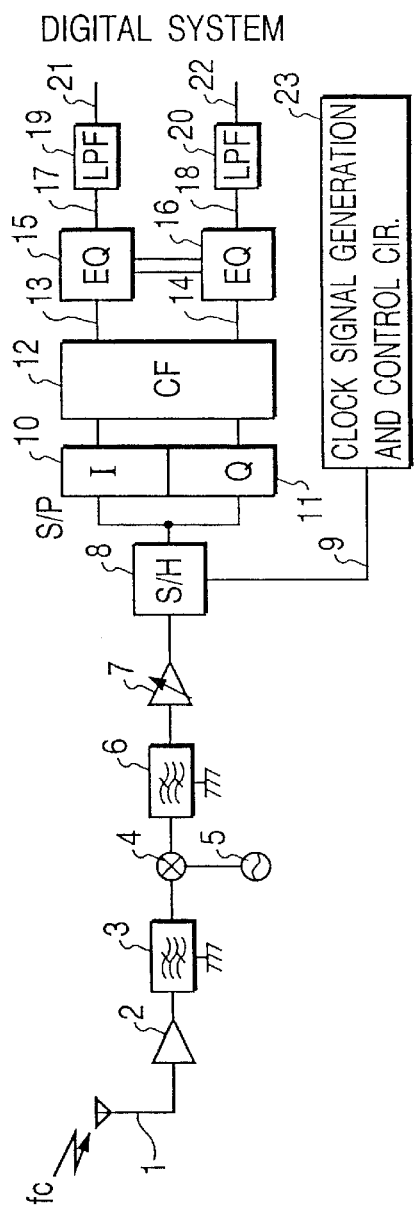
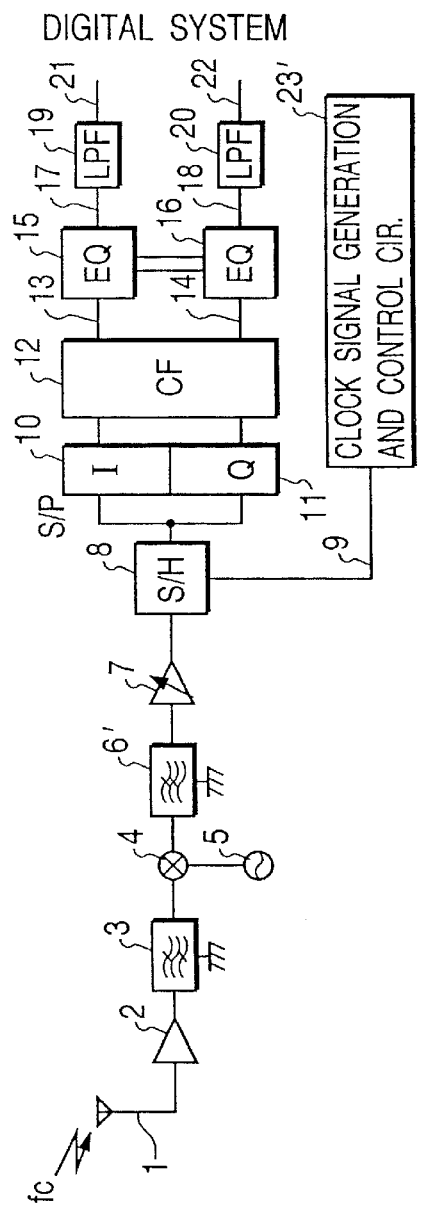

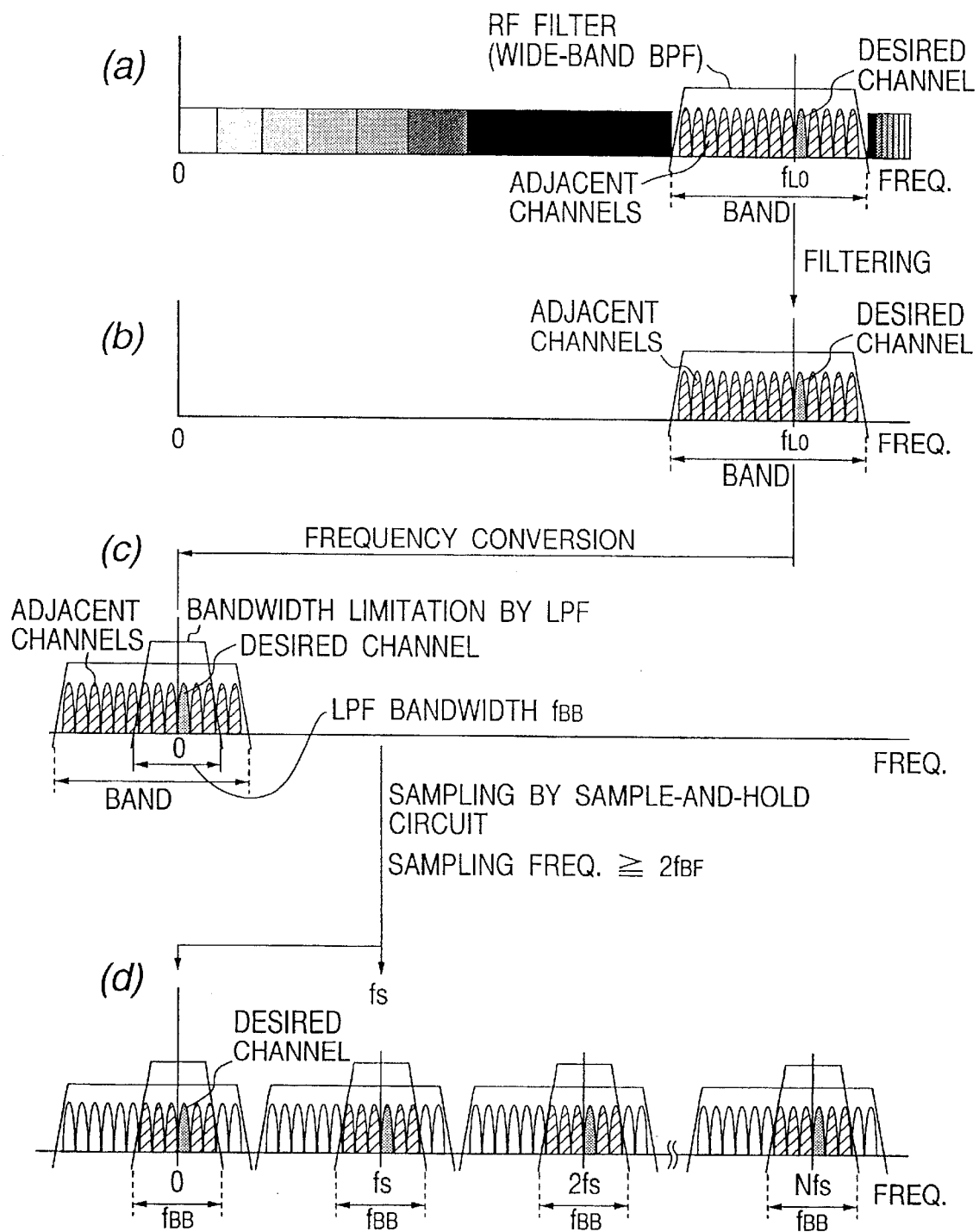

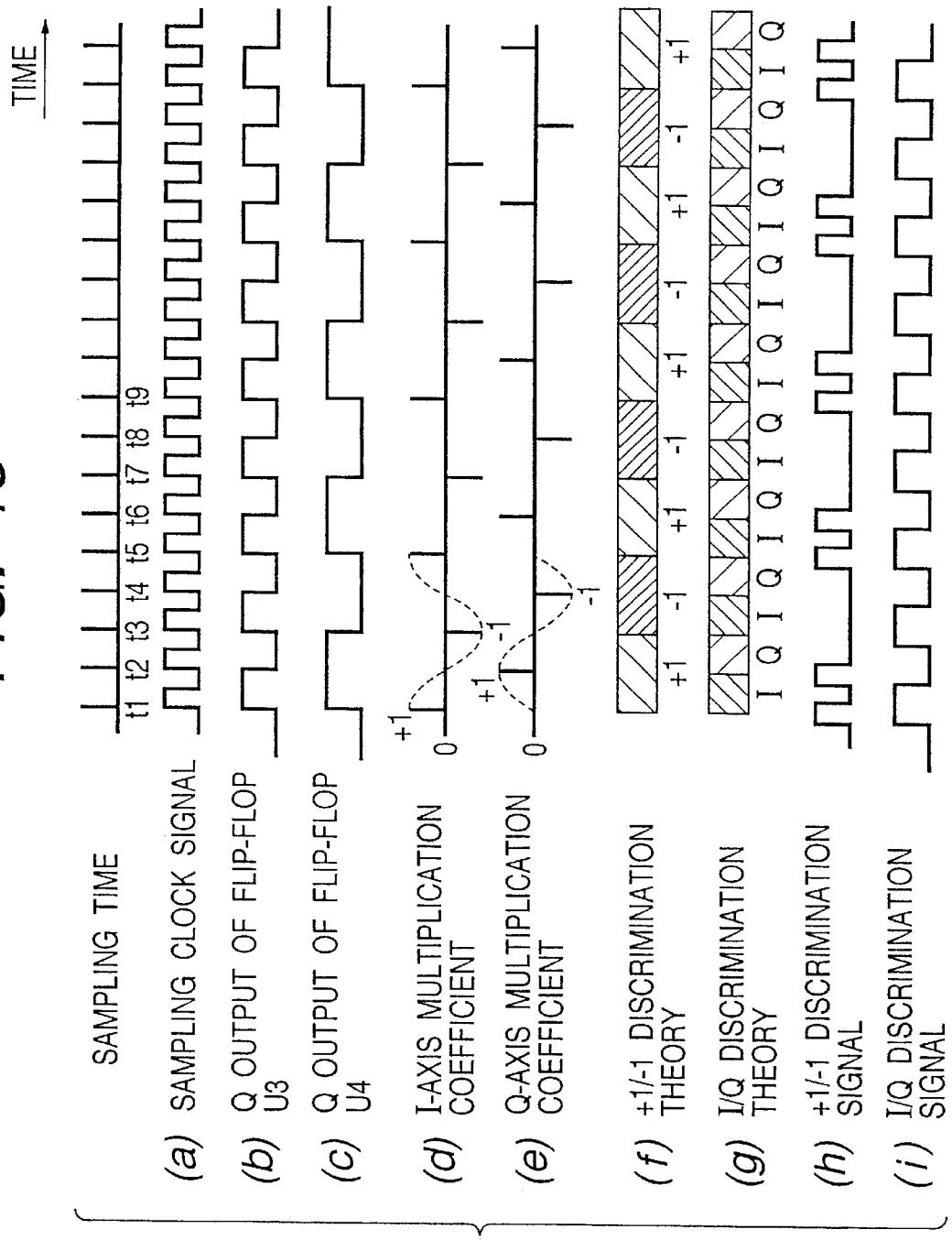

COMPLEX COEFFICIENT FILTER I

MULTIPLIER (DELAYING DEVICE)

$$H(z) = -\frac{C_1}{C}z^{-1}$$

MULTIPLIER (INVERTER)

$$H(z) = -\frac{C_1}{C}$$

MULTIPLYING ADDER $$H(z) = -\left(\frac{C_1}{C}v_1 + \frac{C_2}{C}v_2 + \frac{C_3}{C}v_3\right)$$

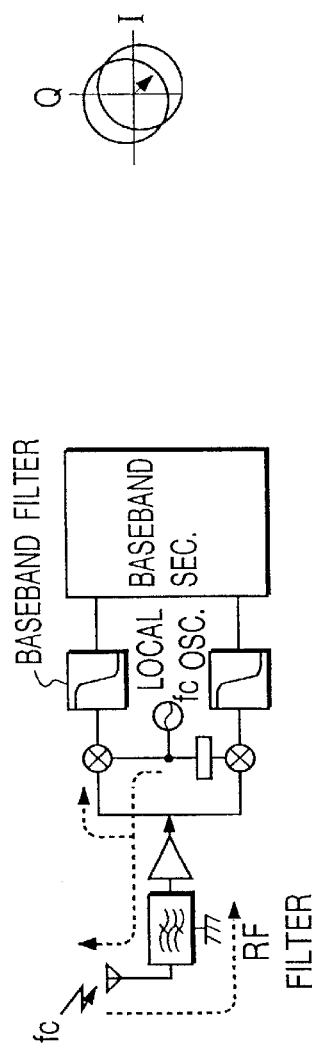
FIG. 40(a) PRIOR ART
FIG. 40(b) PRIOR ART
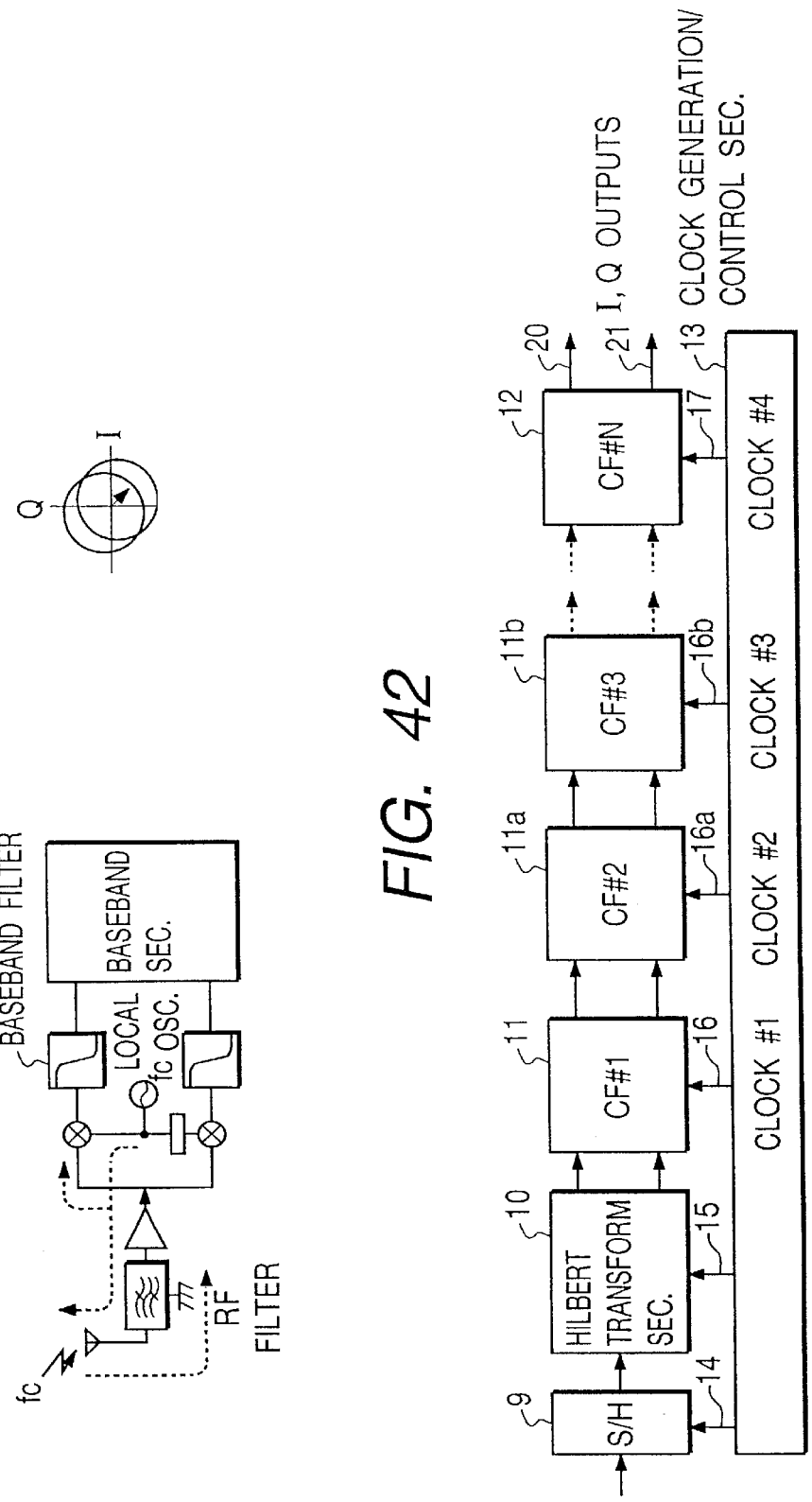
FIG. 42

BANDWIDTH: 8fb

BANDWIDTH: 4fb

BANDWIDTH: 2fb

BANDWIDTH: fb

RADIO RECEIVING APPARATUS FOR RECEIVING COMMUNICATION SIGNALS OF DIFFERENT BANDWIDTHS

CROSS-REFERENCE TO RELATED APPLICATION

The present application is a division of application Ser. No. 08/824,774 filed Mar. 26, 1997 issued U.S. Pat. No. 6,026,129.

BACKGROUND OF THE INVENTION

1. Field of the Invention

The present invention relates to a radio receiving apparatus used in mobile communications equipment, and more particularly to a radio receiving apparatus which can reduce the number of high-frequency circuit parts, and hence can reduce factors of high power consumption and factors causing unstable operation which factors are present in high-frequency circuits.

The invention also relates to communications equipment which transmits information while changing the bandwidth in accordance with its type, and more particularly it is intended to implement, in a simple configuration, a radio receiving apparatus for receiving communication signals of different bandwidths.

2. Description of the Related Art

One of the important points of a radio receiving apparatus in mobile communications equipment is how to reduce the number of high-frequency circuit parts to reduce factors of high power consumption and factors causing unstable operation, which are present in high-frequency circuits, thereby reducing the manufacturing cost and a space occupied by the high-frequency circuit parts. One of the causes for the fact that the high-frequency parts of the radio receiving apparatus are made complex is that it is very difficult to realize a sharply-attenuating channel filter for separating a desired channel band from its adjacent channels, and a desired filtering characteristic needs to be established step by step.

An example of the configuration of a radio receiving scheme used in current mobile communications equipment is shown in FIG. 38. In addition, as another conventional example, FIG. 39 shows a direct demodulation scheme in which the local oscillation frequency is set at a carrier frequency, i.e., a direct-conversion receiving scheme for direct conversion into a baseband (Japanese Unexamined Patent Publication No. Hei. 6-164243).

In FIG. 38, a radio signal having a frequency fc enters an antenna ANT, and is amplified by a low-noise amplifier LNA. The amplified radio signal is passed through a bandpass filter BPF1 to separate overall subject frequency channels of the communications system from other communication signal groups. Its output is converted into a first intermediate frequency by a frequency converter MIX1, and signal components other than the desired frequency channel are eliminated by a first intermediate frequency filter IF1–FLT as much as possible. Its output is amplified by a first intermediate frequency amplifier IF1–AMP, and is then supplied to a frequency converter MIX2.

As for the received signal which has been converted into a second intermediate frequency, signal components other than the desired frequency channel are further eliminated by a second intermediate frequency amplifier IF2–FLT. Its output is amplified by a second intermediate frequency amplifier IF2–AMP, and is then inputted to a quadrature wave detector Q-DET.

Here, the received signal is subjected also to frequency conversion with a second intermediate frequency fL0, into the baseband. The received signal is passed through a lowpass filter LPF to eliminate the signal components other than the frequency channel and to eliminate image signals in frequency conversion. Thus the desired channel signal is extracted, and is amplified to a predetermined signal strength by a baseband amplifier BF-AMP, thereby providing a reception output.

Accordingly, a description will be first given of problems encountered in the radio receiving apparatus of communications equipment which is used in the vicinity of a microwave band and which is shown in FIG. 38 illustrating a conventional example.

As a first problem, as seen in the conventional example in FIG. 38, frequency conversion in three stages is carried out including quadrature detection, and filtering in four stages and amplification in four stages are effected. Three local oscillators of L01, L02, and fL0 are needed. Therefore, the radio receiving apparatus requires numerous parts.

A second problem is that these numerous parts result in large power consumption.

Next, a consideration will be made of the example of FIG. 39, i.e., the direct-conversion receiving apparatus in which an attempt is made to simplify the radio receiving apparatus. In FIG. 39, a received AM high-frequency signal is inputted to a pair of mixers 18 and 19 and mixed with respective high-frequency signals whose frequency is equal to the carrier frequency and phases are different from each other by 90°.

Outputs of the mixers 18 and 19 are respectively inputted to phase shifters 27 and 28 via lowpass filters 23 and 24 and A/D converters 25 and 26. The respective signals whose phases are delayed in such a manner as to be mutually different by 90° by the phase shifters 27 and 28 are inputted to a matrix circuit 29 where signals representing the sum of and the difference between the respective signals are derived.

The signals from the matrix circuit 29 are converted to analog signals by D/A converters 30 and 31, modulated signals in both sidebands of the AM high-frequency signal are separated, and a signal with less noise is selectively outputted to a speaker 35. A direct-conversion receiving apparatus which has less noise and radio interference is realized.

Consideration will be given to the power consumption of the circuits and the performance required of the parts in this conventional example. In the conventional example of FIG. 39, the channel filter for separating and extracting the received signal from adjacent interfering signals is implemented by the lowpass filters 23 and 24 and digital filters provided in digital circuits after A/D conversion.

Where signal processing is carried out by digital circuits in a demodulation circuit 42, it is possible to simplify the filters 23 and 24 for the radio system. However, in order to obtain sufficient amplitude-separating capabilities and frequency-separating capabilities, the calculation clock rate must be sufficiently higher than the highest frequency component of the analog signal. Hence, since the operating speed of the operating portion becomes high and the operating amplitude in the digital system 42 is fixed and large at several volts, there is a drawback in that this results in an increase in power consumption which is several times greater than in a case where processing is effected by an analog system.

Further, many processing systems operate in parallel in logical circuits. That is, even if the calculation clock rate is close to a baseband frequency, the total power consumption of the circuitry becomes (square of the voltage amplitude)×(processing speed)×(electrostatic capacitance of the circuit system load)×(number of parallels), so that the total power consumption becomes large. Namely, the fact that the signal is processed by a digital circuit has a negative factor for increasing the power consumption.

As a third problem, in a case where an attempt is made to digitize the signal processing, there results an increase in power consumption which is several times greater than in a case where processing is effected by a radio system.

As a fourth problem, conventional digital filters involve complicated calculations, and require the four rules of arithmetic even when their configurations are simple, so that power consumption is not negligible.

In addition, if consideration is given to the A/D converters 25 and 26 for digitizing the signal, the voltage amplitude required of the input signal is generally large at one volt or two volts. Accordingly, in the conventional example shown in FIG. 39, the abilities to supply the amplitude are required of the mixers 18 and 19 in the preceding stage. It may be said that this is possible in frequencies of AM radio bands, i.e., medium-wave broadcasting bands, which are handled by the conventional example of FIG. 39; however, in higher frequency bands such as those for TV broadcasting and cellular phone systems, no mixers are available which are capable of obtaining such large outputs. For this reason, it is generally necessary to amplify a voltage by inserting amplifiers in a stage preceding the A/D converters. Therefore, as a fifth problem, if a method using the A/D converters is adopted, there is a negative factor for substantially increasing the power consumption in the radio system or the analog system.

In addition, in the conventional scheme shown in FIG. 39, the frequency generated by the local oscillator is equal to the carrier frequency of the received signal. For this reason, as a sixth problem, trouble occurs in many communication schemes. Namely, as shown in FIG. 40(a), since the oscillation frequency is identical to a harmonic frequency of the reception circuit system, the oscillation frequency leaks to the reception circuit system, so that the leaked oscillation frequency interferes adjacent stations (cellular phones) from the antenna or enters from the received-signal input sides of the mixers 18 and 19. In the mixers 18 and 19, the mixing, i.e., the multiplication, of local oscillation signals occurs, and a DC component occurs as shown in FIG. 40(b) (the center of the phase circle on the I-Q plane deviates), with a result that the DC component imparts errors to a demodulated signal in the form of a DC offset component (for instance, an increase in BER). Accordingly, the direct-conversion receiving scheme of the type which selects the carrier frequency as the local oscillation frequency has been mostly adopted in communications using frequency demodulation schemes which are relatively resistant against single-frequency interference.

Here, the above-described problems will be summed up below.

The first problem is that the radio receiving apparatus requires numerous parts for assuring favorable reception channel selectivity.

The second problem is that the numerous parts which present the aforementioned first problem incur large power consumption.

The third problem is that digitization of signal processing requires power consumption which is several times greater than analog processing.

The fourth problem is that the conventional digital filters involve complex calculations, so that their power consumption is large.

The fifth problem is that the A/D converters for signal digitization require large input signal amplitudes.

The sixth problem is that, in the direct-conversion receiving scheme whose local oscillation signal is equivalent to the carrier frequency of the received signal, the local oscillation signal interferes adjacent stations from the antenna, and a DC offset occurs, imparting errors to the demodulated signal.

Now, turning to the issue of a system generally called a multi-band system, to receive communication signals of different bandwidths, it is conventionally necessary to use channel filters in the same number as the number of the types of bandwidths. This increases the size of a radio receiving apparatus and the addition of a circuit for switching between the filter groups prevents further reductions in size and power consumption.

FIG. 54 shows the main part of a conventional radio receiving apparatus for receiving multi-band signals which is disclosed in Japanese Unexamined Utility Model Publication No. Sho. 62-171228. Signals received by an antenna 101 are supplied via a high-frequency amplifier 103 to four filters which, being switched by switches 104A and 104B, extracts a desired frequency-band component. The extracted signal is supplied to two demodulation circuits 115 and 116 via a frequency converter 113 which also receives a local oscillation signal 109 for frequency conversion. In this conventional apparatus, the demodulation circuits 115 and 116 are for FM and AM signals having different bandwidths. To accommodate such different band widths, the intermediate frequency amplification stages of the respective demodulation circuits 115 and 116 have different intermediate frequency filters. Therefore, six or more filters are needed in total.

FIGS. 55(a)–55(d) show examples of frequency utilization in mobile multi-band communications systems for which extensive studies have been made in recent years. In current cellular phone systems, narrow frequency bandwidth channels are arranged at regular frequency intervals as shown in FIG. 55(d). In the case of accommodating not only telephone (voice signals) but also data communication which involves a larger amount of information, a broad bandwidth is formed by combining a plurality of channels as shown in FIGS. 55(c) and 55(b). To transmit an even larger amount of information of moving pictures, for instance, there may occur a case where a broad bandwidth is formed by combining all the communication channels of a given communication band as shown in FIG. 55(a).

In a communication system that utilizes many kinds of bandwidths, if filters are so prepared as to correspond to the respective bandwidths as in the above conventional examples, serious problems will occur in application to portable equipment and the like, such as an increase in size, increased complexity in shape, need for adding switches to peripheral sections, and an increase in power consumption due to parasitic capacitances.

SUMMARY OF THE INVENTION

To overcome the above-described six problems encountered in the conventional radio receiving apparatuses, the present invention has as its object to provide a radio receiving apparatus which can reduce the number of high-frequency circuit parts, and hence can reduce factors of high power consumption and factors for causing unstable operation, which are present in high-frequency circuits, as well as reduce the manufacturing cost and the space occupied by the high-frequency circuit parts.

Another object of the invention is to provide a superior radio receiving apparatus for receiving multi-band signals which apparatus is small in size and consumes a smaller amount of power.

To attain the above object, according to a first aspect of the invention, there is provided a radio receiving apparatus for a radio system in which carrier frequencies are channel-positioned at equal frequency intervals or positioned in a manner similar thereto and which employs a quadrature demodulation scheme or a demodulation scheme similar thereto, said radio receiving apparatus comprising means supplied with a received signal including a signal of a reception-desired channel, for selectively converting, into an intermediate frequency band, a frequency band including up to approximately three channels on each of upper and lower sides of a center frequency that is an upper or lower end of the reception-desired channel or a boundary frequency with an adjacent channel thereof; means for sampling the frequency-converted signal at a frequency that is 16-fold a bandwidth of the reception-desired channel or 16-fold a ½ frequency of a channel interval frequency of the radio system; means for extracting orthogonal components in a phase domain from the sampled signal; and means for extracting the signal of the reception-desired channel from a real-axis signal component and an imaginary-axis signal component of the extracted orthogonal components. In this configuration, a pair of upper and lower adjacent channels, among the three pairs, can be rejected by a single operation.

According to a second aspect of the invention, there is provided a radio receiving apparatus for a radio system in which carrier frequencies are channel-positioned at equal frequency intervals or positioned in a manner similar thereto and which employs a quadrature demodulation scheme or a demodulation scheme similar thereto, said radio receiving apparatus comprising means supplied with a received signal including a signal of a reception-desired channel, for selectively converting, into a DC-inclusive band, a frequency band including up to approximately three channels on each of upper and lower sides of a center frequency that is an upper or lower end of the reception-desired channel or a boundary frequency with an adjacent channel thereof; means for sampling the frequency-converted signal at a frequency that is 16-fold a bandwidth of the reception-desired channel or 16-fold a ½ frequency of a channel interval frequency of the radio system; means for extracting orthogonal components in a phase domain from the sampled signal; and means for extracting the signal of the reception-desired channel from a real-axis signal component and an imaginary-axis signal component of the extracted orthogonal components. In this configuration, a pair of upper and lower adjacent channels, among the three pairs, can be rejected by a single operation.

According to a third aspect of the invention, which is subordinate to the first aspect of the invention, the radio receiving apparatus comprises a frequency converter supplied with the received signal including the signal of the reception-desired channel, for selectively converting, into an intermediate frequency, the upper or lower end of the reception-desired channel or the boundary frequency with the adjacent channel thereof; an intermediate-frequency band stage for passing part of a frequency-converted output of the frequency converter in a frequency band including up to approximately three channels on each of upper and lower sides of a center frequency that is the intermediate frequency; a sample-and-hold circuit for sampling an output of the intermediate-frequency band stage at a frequency that is 16-fold the bandwidth of the reception-desired channel or 8-fold the channel interval frequency of the radio system; a Hilbert transformer for extracting the orthogonal components on the phase plane from a sampled output of the sample-and-hold circuit, and for generating the real-axis signal component and the imaginary-axis signal component; a complex coefficient filter for rejecting a signal of the three adjacent channels on each of the upper and lower sides of the signal of the desired channel from the real-axis signal component and the imaginary-axis signal component; a phase equalizer for receiving respective outputs of the complex coefficient filter; and a lowpass filter for receiving respective outputs of the phase equalizers, whereby the signal of the reception-desired channel is extracted. In this configuration, a quadrature filtering function can be realized by the complex coefficient filter.

According to a fourth aspect of the invention, which is subordinate to the second aspect of the invention, the radio receiving apparatus comprises a frequency converter supplied with the received signal including the signal of the reception-desired channel, for selectively converting, into a zero frequency, the upper or lower end of the reception-desired channel or the boundary frequency with the adjacent channel thereof; a low-frequency stage for passing part of a frequency-converted output of the frequency converter in a frequency band including up to approximately three channels on each of upper and lower sides of a center frequency that is the zero frequency; a sample-and-hold circuit for sampling an output of the low-frequency stage at a frequency that is 16-fold the bandwidth of the reception-desired channel or 8-fold the channel interval frequency of the radio system; a Hilbert transformer for extracting the orthogonal components on the phase plane from a sampled output of the sample-and-hold circuit, and for generating the real-axis signal component and the imaginary-axis signal component; a complex coefficient filter for rejecting a signal of the three adjacent channels on each of the upper and lower sides of the signal of the desired channel from the real-axis signal component and the imaginary-axis signal component; a phase equalizer for receiving respective outputs of the complex coefficient filter; and a lowpass filter for receiving respective outputs of the phase equalizers, whereby the signal of the reception-desired channel is extracted. In this configuration, a pair of upper and lower adjacent channels, among the three pairs, can be rejected by a single operation. Further, a quadrature filtering function can be realized by the complex coefficient filter.

According to a fifth aspect of the invention, which is subordinate to the third or fourth aspect of the invention, the radio receiving apparatus further comprises a decimation circuit for performing frequency decimation on the real-axis signal component and the imaginary-axis signal component of the reception-desired channel which are outputted from the two lowpass filters; and an image-rejecting frequency conversion circuit for eliminating an offset frequency from two outputs of the decimation circuit. In this configuration, the reception-desired channel can be extracted accurately by the decimation and the offset frequency elimination.

According to a sixth aspect of the invention, which is subordinate to the third or fourth aspect of the invention, the radio receiving apparatus further comprises an averaging circuit for averaging the real-axis signal component and the imaginary-axis signal component of the reception-desired channel which are outputted from the two equalizers; and an image-rejecting frequency conversion circuit for eliminating an offset frequency from two outputs of the averaging circuit. In this configuration, the reception-desired channel can be extracted accurately by the averaging and the offset frequency elimination.

According to a seventh aspect of the invention, there is provided a radio receiving apparatus for a radio system in which carrier frequencies are channel-positioned at equal frequency intervals or positioned in a manner similar thereto and which employs a quadrature demodulation scheme or a demodulation scheme similar thereto, said radio receiving apparatus comprising means supplied with a received signal including a signal of a reception-desired channel, for selectively converting, into an intermediate frequency band or a DC-inclusive band, a frequency band including up to approximately 12 channels on each of upper and lower sides of a center frequency that is an upper or lower end of the reception-desired channel or a boundary frequency with an adjacent channel thereof; means for sampling the frequency-converted signal at a frequency that is 64-fold a bandwidth of the reception-desired channel or 64-fold a ½ frequency of a channel interval frequency of the radio system; means for extracting orthogonal components in a phase domain from the sampled signal; means for extracting a signal of four channels including the reception-desired channel from a real-axis signal component and an imaginary-axis signal component of the extracted orthogonal components while rejecting a signal of the other adjacent channels; and means for extracting only the signal of the reception-desired channel while rejecting a signal of the other adjacent channels with a sampling frequency set at a frequency that is 16-fold the bandwidth of the reception-desired channel or 16-fold the ½ frequency of the channel interval frequency of the radio system. In the configuration, the desired channel can be extracted even if the band covering the reception-desired channel and the. adjacent channels is made broad.

According to an eighth aspect of the invention, which is subordinate to the seventh aspect of the invention, the radio receiving apparatus comprises the means supplied with a received signal including the signal of the reception-desired channel, for selectively converting, into the intermediate frequency band or the DC inclusive band, the frequency range including up to the approximately 12 channels on each of the upper and lower sides of the center frequency that is the upper or lower end of the reception-desired channel or the boundary frequency with the adjacent channel thereof; a sample-and-hold circuit for sampling the frequency-converted signal at the frequency that is 64-fold the bandwidth of the reception-desired channel or 64-fold the ½ frequency of the channel interval frequency of the radio system; a Hilbert transformer for extracting orthogonal components on the phase plane from a sampled output of the sample-and-hold circuit, and for generating the real-axis signal component and the imaginary-axis signal component; a first complex coefficient filter for rejecting a signal of channels other than three adjacent channels on each of the upper and lower sides of the desired channel from the real-axis signal component and the orthogonal-phase-axis signal component; two first phase equalizers for receiving respective outputs of the first complex coefficient filter; two first lowpass filters for receiving respective outputs of the two second phase equalizers; a first decimation circuit for decimating outputs of the two second lowpass filters into ¼; a second complex coefficient filter for of rejecting a signal of the three adjacent channels on each of the upper and lower sides of the desired channel from the real-axis signal component and the imaginary-axis signal component that are outputted from the first decimation circuit, and for converting the signal of the desired channel into a baseband signal; two second phase equalizers for receiving respective outputs of the second complex coefficient filter; two second lowpass filters for receiving respective outputs of the two first phase equalizers; a second decimation circuit for decimating outputs of the two second lowpass filters into ¼; and an image-rejecting frequency conversion circuit for eliminating an offset frequency from two outputs of the second decimation circuit. In this configuration, by cascading basic signal processing blocks, three adjacent channels on the upper and lower sides of the desired channel can be rejected and conversion into the baseband can be effected.

According to a ninth aspect of the invention, which is subordinate to the seventh aspect of the invention, the radio receiving apparatus comprises the means supplied with a received signal including the signal of the reception-desired channel, for selectively converting, into the intermediate frequency band or the DC-inclusive band, the frequency band including up to the approximately 12 channels on each of the upper and lower sides of the center frequency that is the upper or lower end of the reception-desired channel or the boundary frequency with the adjacent channel thereof; a sample-and-hold circuit for sampling the frequency-converted signal at the frequency that is 64-fold the bandwidth of the reception-desired channel or 64-fold the ½ frequency of the channel interval frequency of the radio system; a Hilbert transformer for extracting orthogonal components on the phase plane from a sampled output of the sample-and-hold circuit, and for generating the real-phase-axis signal component and the imaginary-axis signal component; a first complex coefficient filter for rejecting a signal of channels other than three adjacent channels on each of the upper and lower sides of the desired channel from the real-axis signal component and the imaginary-axis signal component; two first phase equalizers for receiving respective outputs of the first complex coefficient filter; a first averaging circuit for averaging outputs of the two first phase equalizers over eight samples; a second complex coefficient filter for rejecting a signal of the three adjacent channels on each of the upper and lower sides of the desired channel from the real-axis signal component and the imaginary-axis signal component that are outputted from the first averaging circuit, and for converting the signal of the desired channel into a baseband signal; two second phase equalizers for receiving respective outputs of the second complex coefficient filter; a second averaging circuit for averaging outputs of the two second phase equalizers over eight samples; and an image-rejecting frequency conversion circuit for eliminating an offset frequency from two outputs of the second averaging circuit. In this configuration, by cascading basic signal processing blocks, three adjacent channels on the upper and lower sides of the desired channel can be rejected and conversion into the baseband can be effected.

According to a tenth aspect of the invention, which is subordinate to any one of the third, fourth, eighth, and ninth aspects of the invention, the Hilbert transformer includes a buffer amplifier and an inverted amplifier, each being a switched-capacitor circuit, and a switch. In this configuration, simple synchronization control and low power consumption can be realized.

According to an eleventh aspect of the invention, which is subordinate to any one of the third, fourth, eighth, and ninth aspects of the invention, the complex coefficient filters have only two kinds of values as absolute values of coefficients. In this configuration, the circuit can be constructed by using circuit elements having limited, fixed values, whereby the circuit designing can be facilitated, the production quality of circuit devices can be improved, and the operation can be made stable.

According to a twelfth aspect of the invention, which is subordinate to any one of the third, fourth, and eighth aspects of the invention, operational amplifiers of the two phase equalizers are respectively used in common with those of the two lowpass filters ensuing the two phase equalizers. In this configuration, the circuit can be constructed by using limited circuit elements, whereby the power consumption can be reduced, the production quality of circuit devices can be improved, and the operation can be made stable.

According to a thirteenth aspect of the invention, which is subordinate to the twelfth aspect of the invention, the two lowpass filter are constituted by using a CCD, to reduce the number of operational amplifiers. In this configuration, not only can the reduction in power consumption be promoted, but also the circuit designing can be facilitated and the production quality of circuit devices can be improved. Further, the operation can be made stable.

In the third to sixth aspects and the eighth and ninth aspects of the invention, as for the order of connection of the three stages of constituent complex coefficient filters and the order of connection of the complex coefficient filter and the equalizer, substantially the same results can be obtained even if the order is changed, because in terms of mathematics the characteristics of the respective elements can be multiplied together. This is a basic feature inherent in general linear circuits. The above-mentioned change in order of connection is included in the scope of the invention.

Similarly, in the eighth and ninth aspects of the invention, as for the order of connection of the decimation circuit and the frequency conversion circuit for elimination of an offset frequency or the averaging circuit and the frequency conversion circuit for elimination of an offset frequency, reversing in order of connection is included in the scope of the invention because in terms of mathematics the characteristics of the respective elements can be multiplied together.

In the first to ninth aspects of the invention, the basic sampling frequency is set at 16-fold the bandwidth of the desired wave. Setting the basic sampling frequency at 32-fold the bandwidth of the desired wave to approximately double the number of adjacent waves is a non-essential expansion of the concept of the invention, and is, needless to say, included in the scope of the invention.

In the seventh to ninth aspects of the invention in which the adjacent-wave rejecting circuit means using the complex coefficient filter is used doubly, the overall sampling frequency is set at 64-fold the bandwidth of the desired wave. This is intended to show that the above circuit means can be used doubly or in a multiple manner. The concept of the 64-fold oversampling should encompass a case of multiplication by 2 to the power of an integer.

In the invention, various measures are devised for the purpose of signal processing by hardware. For example, an arrangement may be provided such that the sampling frequency is set at 16-fold the bandwidth of the desired wave and complex coefficient filters are configured by digital signal processing so that the second and third adjacent waves are located at phase angle intervals of $\pi/4$ to allow their rejection. This also falls within the scope of the invention.

In the fifth and sixth aspects of the invention which are subordinate to the first to fourth aspect of the invention, a residual frequency offset is eliminated by a digital system. This is a very important feature of the invention.

The joint use of the decimation and the averaging according to the eighth and ninth aspects of the invention, respectively, is basically included in the seventh aspect of the invention.

Similarly, in the eighth and ninth aspects of the invention, the selection between conversion into the intermediate frequency range or conversion into the DC range in the frequency conversion by use of a local oscillation frequency and the selection between the decimation and the averaging produce several combinations. All of such combinations are basically included in the seventh aspect of the invention.

According to a fourteenth aspect of the invention, there is provided a radio receiving apparatus for receiving multi-band signals, comprising a plurality of channel filters connected in cascade, each of the channel filters comprising a complex coefficient filter, a sampling frequency of each of the channel filters being decimated properly when necessary to enable reception of multi-band signals having a bandwidth ratio M, the channel filters being provided in a number obtained by rounding up a decimal portion of a number N that satisfies $M=4^N$.

According to a fifteenth aspect of the invention, which is subordinate to the fourteenth aspect of the invention, the channel filters further comprise an equalizer that is commonly used by at least part of the channel filters. In this configuration, the configuration of the channel filters can be simplified.

According to a sixteenth aspect of the invention, which is subordinate to the fourteenth or fifteenth aspect of the invention, the radio receiving apparatus further comprises a root Nyquist filter provided downstream of the channel filters, for compensating for a deterioration component that is added to a Nyquist characteristic by a receiving characteristic for a desired channel.

BRIEF DESCRIPTION OF THE DRAWINGS

FIG. 1 shows a configuration of a first embodiment of the present invention;

FIG. 4 shows a configuration of a second embodiment of the invention;

FIG. 5 and 6(a)–6(e) illustrate the operation of the second embodiment of the invention;

FIG. 18 is an operation timing chart of the orthogonal-component separating circuit of FIG. 17;

FIG. 40 illustrates problems of the direct-conversion receiving scheme;

FIG. 42 shows the configuration of a quadrature detection/channel filter section in the sixth embodiment;

DESCRIPTION OF THE PREFERRED EMBODIMENTS

EMBODIMENT 1

Figure 2:
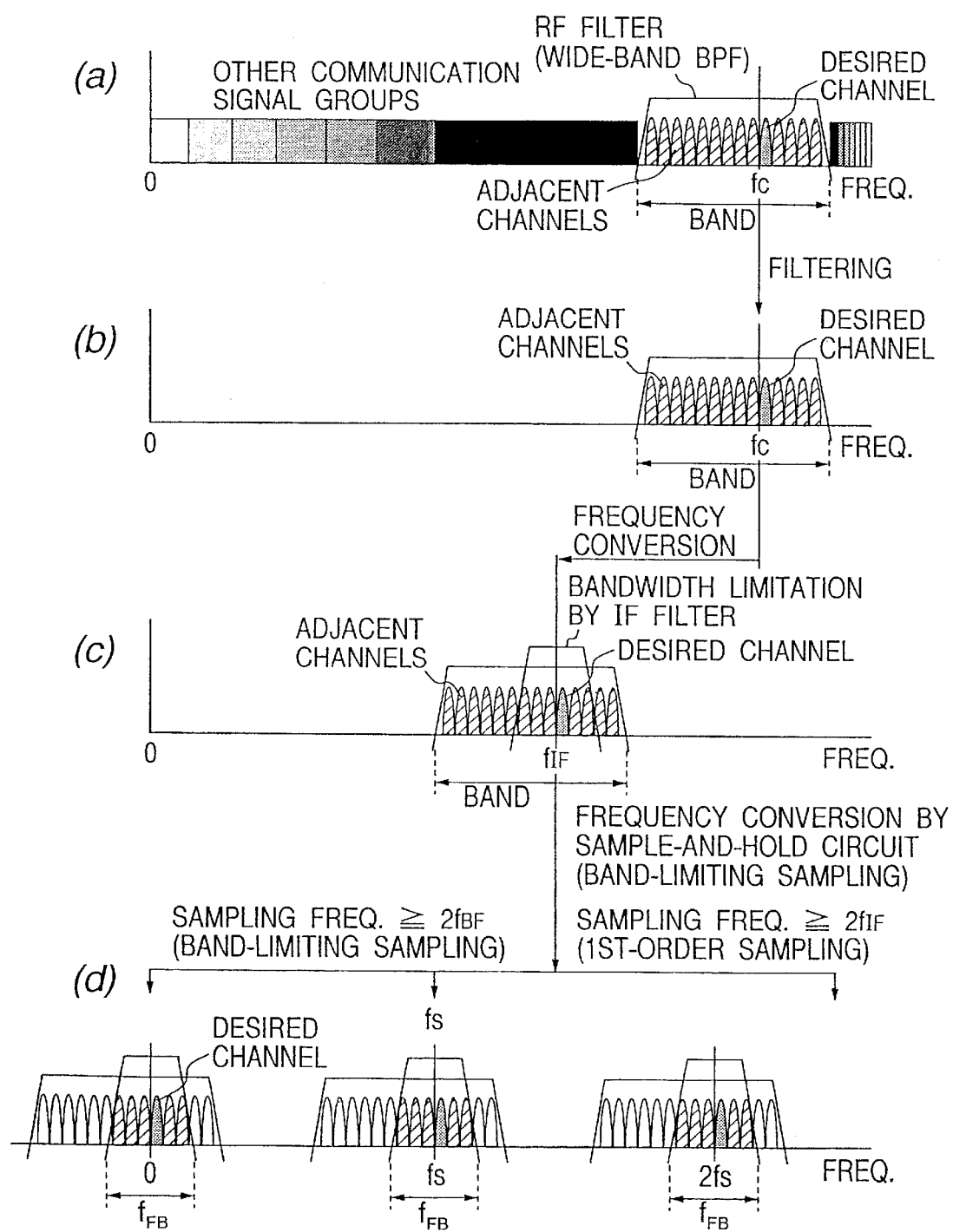
FIGS. 2 and 3(a)–3(e) illustrate the operation of the first embodiment of the invention.

FIG. 1 shows a configuration of a first embodiment of the present invention. A received signal 1 obtained from an antenna is supplied to and amplified by a high-frequency amplifier 2. An output from the high-frequency amplifier 2 is supplied to a first bandpass filter 3 to separate only signals of all the channels of a relevant communications system from other radio signals. An output from the first bandpass filter 3 is supplied to a frequency converter 4 where it is subjected to frequency conversion by use of a local oscillation frequency $f_{LO}$.

An output from the frequency converter 4 is supplied to a second bandpass filter 6 so as to obtain a channel filtering effect whereby image signals which occur in the frequency converter 4 are absorbed and only desired waves are allowed to pass therethrough. An output from the second bandpass filter 6 is supplied to an AGC amplifier 7 from which an amplified signal is outputted with a predetermined signal strength. This output is supplied to a sample-and-hold circuit 8 where it is sampled and held under control by a sampling clock signal 9. The sampling frequency in the sample-and-hold operation is set to a fraction of an integer of a frequency equal to a passband width which is defined by the second bandpass filter 6 and the like. Namely, the bandwidth-limiting sampling theorem is used in sampling by the sample-and-hold circuit. A digitized signal of the received signal thus obtained is supplied to an I-axis-component separating circuit 10 and a Q-axis-component separating circuit 11, respectively.

A sampling output is obtained for every other clock pulse in the I-axis-component separating circuit 10, while in the Q-axis-component separating circuit 11 a sampling output is obtained at time points when a sampling output is not obtained in the I-axis-component separating circuit 10. The polarity of the sampling output is inverted for every other clock pulse with respect to each of the I-axis and the Q-axis to effect Hilbert transform, thereby transforming the sampling outputs into the form of two orthogonal components on a phase plane. These two signals are supplied to a complex coefficient filter 12. The complex coefficient filter 12 eliminates undesired adjacent-channel signal groups, and its orthogonal outputs 13 and 14 are fed to an I-axis equalizer 15 and a Q-axis equalizer 16, respectively, where the phase delays are equalized. Outputs 17 and 18 of the I-axis equalizer 15 and the Q-axis equalizer 16 are fed to an I-axis lowpass filter 19 and a Q-axis lowpass filter 20, respectively, to eliminate undesired, high-frequency residual components.

Further, level conversion is effected, if necessary, and outputs 21 and 22 of a digital signal level are supplied to a digital system. Control of all the operation after the sample-and-hold operation is carried out by various clock signals which are supplied from a clock signal generation and control circuit 23.

Referring to FIG. 2, a description will be given of the processing involved, as seen in terms of a frequency axis, up to the frequency conversion circuit in the first embodiment shown in FIG. 1.

FIG. 2(a) shows by way of example the arrangement of a frequency band used by a subject communications system, communication channels in that communication band, and a desired wave channel among them. The diagram shows a state in which frequency bands above and below this communication band are occupied by other communication signal groups.

FIG. 2(b) shows a state in which the subject communication band has been extracted by the first bandpass filter 3 shown in FIG. 1 and the other communication signal groups have been filtered out.

FIG. 2(c) shows a state in which the subject communication band has been subjected to frequency conversion by the frequency converter 4 shown in FIG. 1, and has hence moved to a low frequency band, and the subject communication band has been band-limited to an intermediate frequency bandwidth $f_{FB}$ centered at the lower end of the band of the desired wave channel by the second bandpass filter 6.

FIG. 2(d) shows a state in which the signal which has been band-limited to the aforementioned intermediate frequency bandwidth $f_{FB}$ is subjected to frequency conversion by the sample-and-hold circuit 8 at the same time as sampling, thereby moving the signal to a vicinity of a baseband frequency. Here, fs shows a frequency of the sampling clock signal 9, and in the invention the intermediate frequency bandwidth $f_{FB}$ is set to be within six times the width of a channel interval. The sampling frequency at this time is set to a frequency which is 16 times ½ of or an even-numbered multiple of a baseband bandwidth fb or a channel interval frequency fw.

In conventional sampling, the sampling frequency is generally set to twice or more an intermediate frequency center frequency $f_{IF}$ according to the first-order sampling theorem. In the invention, by using the sampling theorem for a band-limited signal, the lowest sampling frequency fs can be set to twice the bandwidth $f_{FB}$ of the intermediate frequency band.

In FIG. 2(d), as a result of down conversion due to sampling, it is possible to obtain a spectrum in which the desired wave channel moves to a position where the lower end of the desired wave channel is located in the vicinity of the DC point of the baseband region, and in which channels in the same number are arranged symmetrically about the DC axis on the positive and negative sides of the frequency axis.

Referring to FIGS. 3(a)–3(e), a description will be given of the processing involved, as seen in terms of the frequency axis, from the frequency conversion circuit to sampling and thereafter in the first embodiment shown in FIG. 1.

Figure 3A:
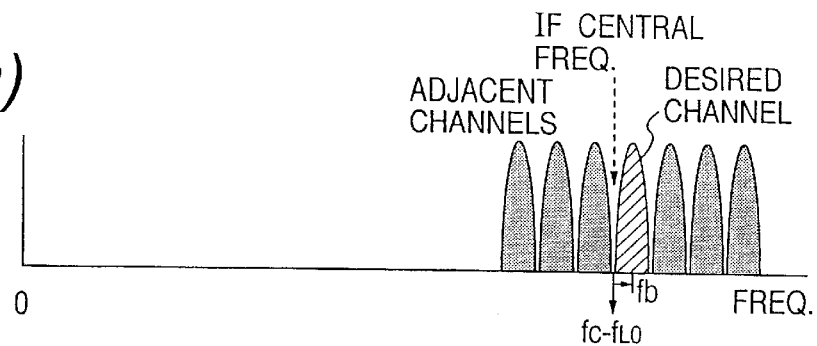

FIG. 3(a) is identical to the one shown in FIG. 2(c), and illustrates a state in which the subject communication band has been subjected to frequency conversion by the frequency converter 4 shown in FIG. 1, and has hence moved to a low frequency band, and the subject communication band has been band-limited to the intermediate frequency bandwidth $f_{FB}$ centering on the lower end of the band of the desired wave channel by the second bandpass filter 6.

Figure 3B:
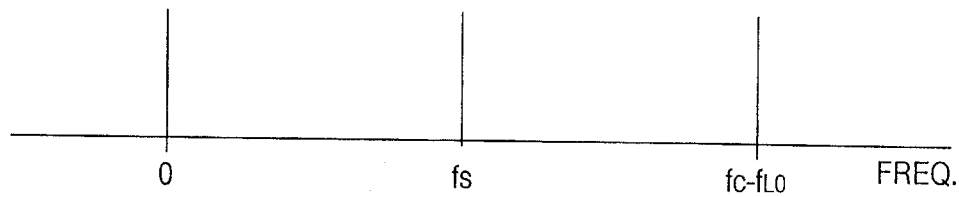

FIG. 3(b) shows the relationship between the sampling frequency fs of the sample-and-hold circuit 8 and the intermediate frequency center frequency (fc-$f_{LO}$). The sampling frequency fs is required to be a frequency obtained by dividing the intermediate frequency center frequency (fc-$f_{LO}$) by an integer of two or more.

Figure 3C:
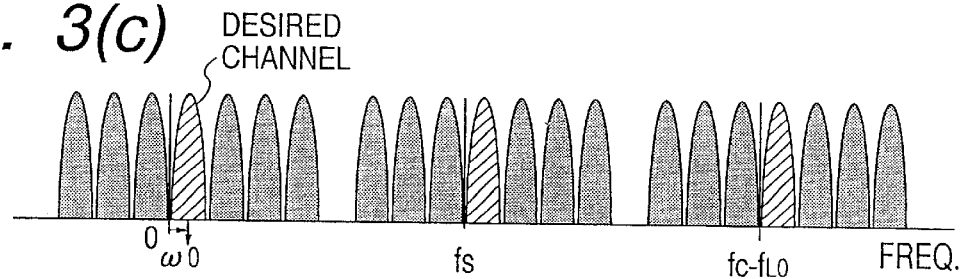

FIG. 3(c) shows that a spectrum is obtained in which channel groups of the intermediate frequency bandwidth $f_{FB}$ are superposed on multiple waves, shown in FIG. 3(b), of the sampling frequency including the zero frequency. As is apparent from FIG. 3(c), the intermediate frequency center frequency (fc-$f_{LO}$) is set to a frequency higher than the value of the intermediate frequency bandwidth $f_{FB}$ so as to prevent the occurrence of aliasing in sampling.

Figure 3D:
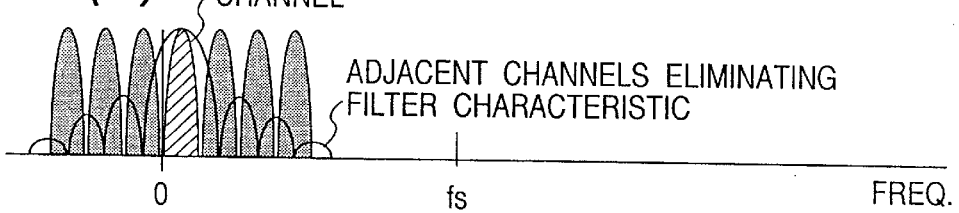

In FIG. 3(d), the. characteristic of the adjacent-channels eliminating filter comprised of the complex coefficient filter 12, the phase equalizers 15 and 16, and the delay-type lowpass filters 19 and 20 in the invention is shown in the channel arrangement. The diagram shows that the zero points of the filter are located at the center frequencies of the adjacent channels.

Figure 3E:

FIG. 3(e) schematically shows the adjacent-channels eliminating effect based of the filter characteristic shown in FIG. 3(d).

EMBODIMENT 2

FIG. 4 shows a configuration of a second embodiment of the invention. A received signal 1 obtained from an antenna is supplied to and amplified by a high-frequency amplifier 2. An output from the high-frequency amplifier 2 is supplied to a bandpass filter 3 to extract only signals of all the channels of the relevant communications system and filter out other radio signals. An output from the bandpass filter 3 is supplied to a frequency converter 4 where it is subjected to frequency conversion by use of a local oscillation frequency $f_{LO}$, i.e., a frequency at a boundary between a desired wave and a lower channel adjacent thereto.

An output from the frequency converter 4 is supplied to a first-stage lowpass filter 6' so as to obtain a channel filtering effect whereby image signals which occur in the frequency converter 4 are absorbed and only desired waves are allowed to pass therethrough. An output from the first-stage lowpass filter 6' is supplied to an AGC amplifier 7 from which an amplified signal is outputted with a predetermined signal strength. This output is supplied to a sample-and-hold circuit 8 where it is sampled and held under control by a sampling clock signal 9.

The sampling frequency in the sample-and-hold operation is set to a fraction of an integer of a frequency equal to twice the passband width which is defined by the first-stage lowpass filter 6' and the like. Namely, the first-order sampling theorem is used in sampling by the sample-and-hold circuit. A discrete signal of the received signal thus obtained is supplied to an I-axis-component separating circuit 10 and a Q-axis-component separating circuit 11, respectively.

A sampling output is obtained for every other clock pulse in the I-axis-component separating circuit 10, while in the Q-axis-component separating circuit 11 a sampling output is obtained at time points when a sampling output is not obtained in the I-axis-component separating circuit 10. The polarity of the sampling output is inverted for every other clock pulse with respect to each of the I-axis and the Q-axis to effect Hilbert transform, thereby transforming the sampling outputs into the form of two orthogonal components on a phase plane.

These two signals are supplied to a complex coefficient filter 12. The complex coefficient filter 12 eliminates undesired adjacent-channel signal groups, and its orthogonal outputs 13 and 14 are fed to an I-axis equalizer 15 and a Q-axis equalizer 16, respectively, where the phase delays are equalized. The outputs 17 and 18 of the I-axis equalizer 15 and the Q-axis equalizer 16 are fed to an I-axis lowpass filter 19 and a Q-axis lowpass filter 20, respectively, to eliminate undesired, high-frequency residual components.

Further, level conversion is effected, if necessary, and the outputs 21 and 22 of the digital signal level are supplied to the digital system. Control of all the operation after the sample-and-hold operation is carried out by various clock signals which are supplied from a clock signal generation and control circuit 23'.

Referring to FIGS. 5, a description will be given of the processing involved, as seen in terms of the frequency axis, up to the frequency conversion circuit in the second embodiment shown in FIG. 4.

FIG. 5(a) shows by way of example the arrangement of a frequency band used by the subject communications system, communication channels in that communication band, and a desired wave channel among them. The diagram shows a state in which frequency bands above and below this communication band are occupied by other communication signal groups.

FIG. 5(b) shows a state in which the subject communication band has been extracted by the bandpass filter 3 shown in FIG. 4 and the other communication signal groups have been filtered out.

FIG. 5(c) shows a state in which the subject communication band has been subjected to frequency conversion by the frequency converter 4 shown in FIG. 4, and has hence moved to a low frequency band, and the subject communication band has been band-limited to the intermediate frequency bandwidth fFB centered at the lower end of the band of the desired wave channel by the first-stage lowpass filter 6'.

FIG. 5(d) shows a state in which the signal which has been band-limited to the aforementioned intermediate frequency bandwidth $f_{FB}$ is subjected to frequency conversion by the sample-and-hold circuit 8 at the same time as sampling, thereby moving the signal to a vicinity of a baseband frequency. Here, fs shows the frequency of the sampling clock signal 9, and in the invention the intermediate frequency bandwidth $f_{FB}$ is set to be within six times the channel interval. The sampling frequency at this time is set to a frequency which is 16 times ½ of or an even-numbered multiple of the baseband bandwidth frequency fb or the channel width frequency fw.

In the invention, by using the sampling theorem for a band-limited signal, the lowest sampling frequency fs can be set to twice the bandwidth $f_{FB}$ of the intermediate frequency band.

In FIG. 5(d), as a result of down conversion due to sampling, a spectrum is obtained in which the desired wave channel moves to a position where the lower end of the desired wave channel is located in the vicinity of a DC point of the baseband region, and in which channels in the same number are arranged symmetrically about the DC axis on the positive and negative sides of the frequency axis.

Referring to FIGS. 6(a)–6(e), a description will be given of the processing involved, as seen in terms of the frequency axis, from the frequency conversion circuit to sampling and thereafter in the second embodiment shown in FIG. 4.

Figure 6A:
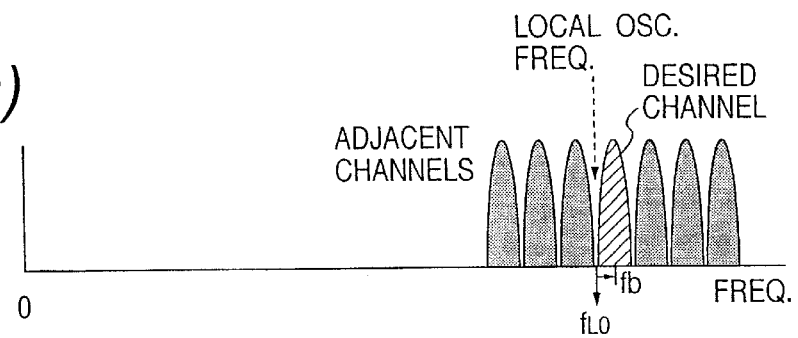
Figure 6B:
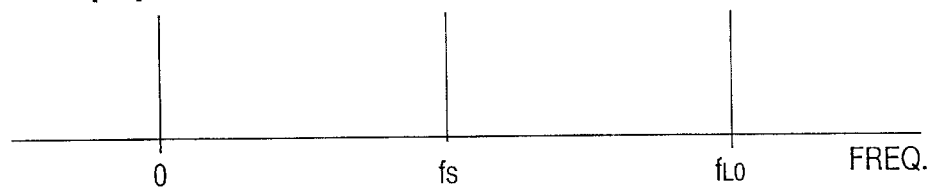
Figure 6C:
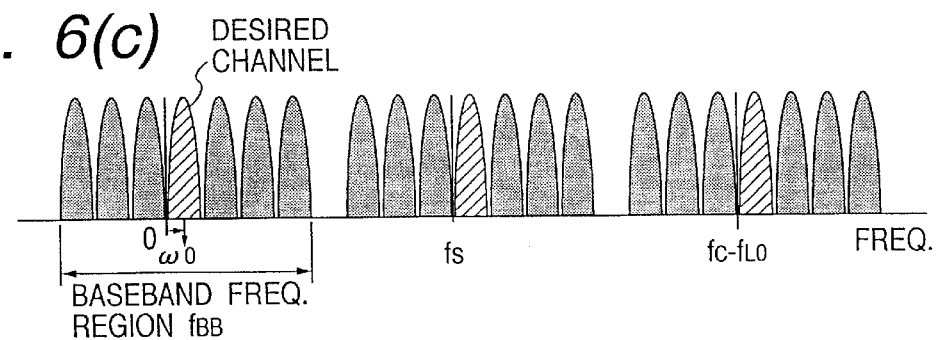

FIG. 6(a) is identical to the one shown in FIG. 5(b), and FIG. 6(c) is identical to the one shown in FIG. 5(c). The diagrams illustrate a state in which the subject communication band has been subjected to frequency conversion by the frequency converter 4 shown in FIG. 4, and has hence moved to a low frequency band, and the subject communication band has been band-limited by the first-stage lowpass filter 6' to a baseband frequency region $f_{BB}$ in which the lower end of the band of the desired wave channel is located in the vicinity of the DC point.

FIG. 6(b) shows the relationship between the local oscillation frequency $f_{LO}$, i.e., a value of ((desired channel frequency fc)−(channel width)/2), and the sampling frequency fs of the sample-and-hold circuit 8. The sampling frequency fs fs required to be not less than twice the baseband frequency region $f_{BB}$ so as to prevent the occurrence of aliasing in sampling.

FIG. 6(c) shows that a spectrum is obtained in which channel groups of the baseband frequency region $f_{BB}$ are superposed on multiple waves, shown in FIG. 6(b), of the sampling frequency including a zero frequency. It should be noted that no restrictions are generally imposed on the relationship between the local oscillation frequency $f_{LO}$ and the sampling frequency fs.

Figure 6D:
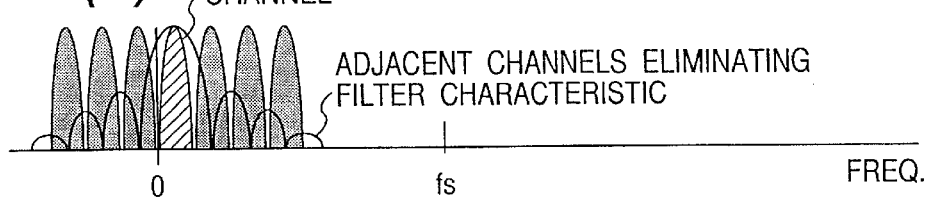

In FIG. 6(d), the characteristic of the adjacent-channels eliminating filter comprised of the complex coefficient filter 12, the phase equalizers 15 and 16, and the delay-type lowpass filters 19 and 20 in the invention are shown in the channel arrangement. The diagram shows that the zero points of the filter is located on the center frequencies of the adjacent channels.

Figure 6E:
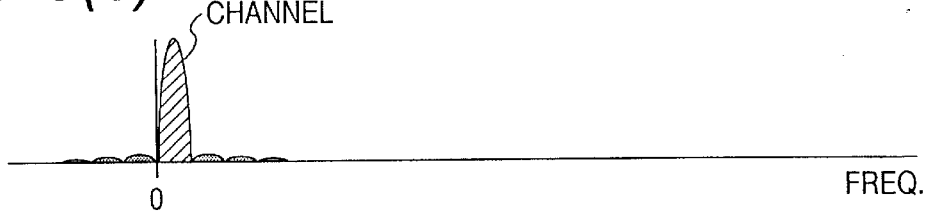

FIG. 6(e) schematically shows the adjacent-channels eliminating effect of the filter characteristic shown in FIG. 6(d).

EMBODIMENT 3

Figure 7:
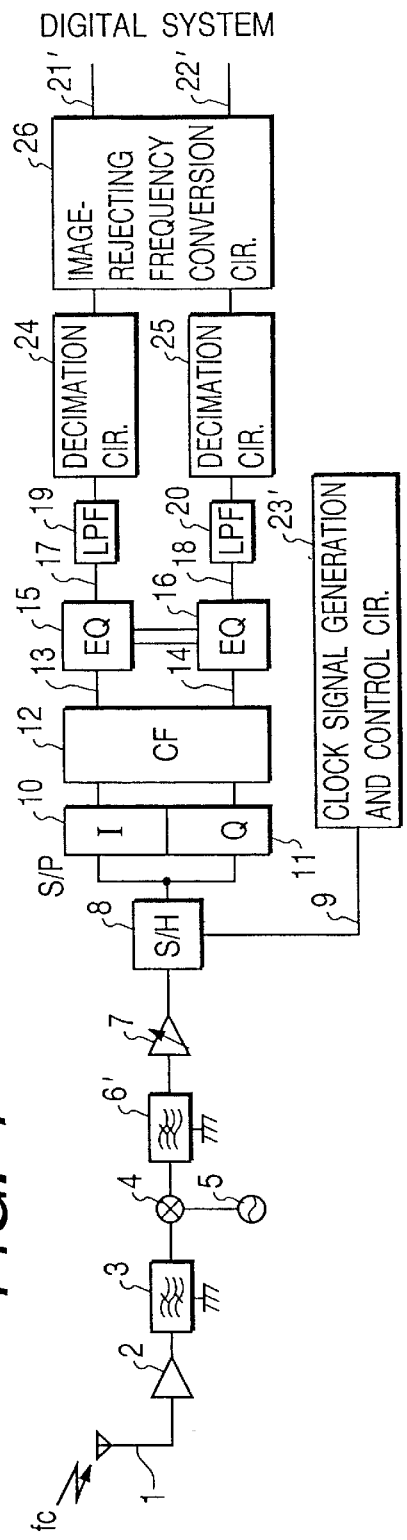
FIG. 7 showing a configuration of a third embodiment of the invention.

FIG. 7 shows a configuration of a third embodiment of the invention. In FIG. 7, an I-axis decimation circuit 24, a Q-axis decimation circuit 25, and an image-rejecting frequency conversion circuit 26 are interposed between the I-axis lowpass filter 19 and a digital system 21' or between the Q-axis lowpass filter 20 and a digital system 22' in the FIG. 4 configuration of the second embodiment of the invention. In this connection, the control system of the clock-signal-generation and control circuit 23' is augmented.

A received signal 1 obtained from an antenna is supplied to and amplified by a high-frequency amplifier 2. An output from the high-frequency amplifier 2 is supplied to a bandpass filter 3 to extract only signals of all the channels of the relevant communications system and filter out other radio signals. An output from the bandpass filter 3 is supplied to a frequency converter 4 where it is subjected to frequency conversion by use of a local oscillation frequency $f_{LO}$, i.e., a frequency at the boundary between a desired wave and its lower adjacent channel.

An output from the frequency converter 4 is supplied to a first-stage lowpass filter 6' so as to obtain a channel filtering effect whereby image signals which occur in the frequency converter 4 are absorbed and only desired waves are allowed to pass therethrough. An output from the first-stage lowpass filter 6' is supplied to an AGC amplifier 7 from which an amplified signal is outputted with a predetermined signal strength. This output is supplied to a sample-and-hold circuit 8 where it is sampled and held under control by a sampling clock signal 9.

The sampling frequency in the sample-and-hold operation is set to a fraction of an integer of a frequency equal to twice the passband width which is defined by the first-stage lowpass filter 6' and the like. Namely, the first-order sampling theorem is used in sampling by the sample-and-hold circuit. A digitized signal of the received signal thus obtained is supplied to an I-axis-component separating circuit and a Q-axis-component separating circuit 11, respectively.

A sampling output is obtained for every other clock pulse in the I-axis-component separating circuit 10, while in the A-axis-component separating circuit 11 a sampling output is obtained at time points when the sampling output was not obtained in the I-axis-component separating circuit 10. The polarity of the sampling output is inverted for every other clock pulse with respect to each of the I-axis and the Q-axis to effect Hilbert transform, thereby transforming the sampling outputs into the form of two orthogonal components on a phase plane.

These two signals are supplied to a complex coefficient filter 12. The complex coefficient filter 12 eliminates undesired adjacent-channel signal groups, and its orthogonal outputs 13 and 14 are fed to an I-axis equalizer 15 and a Q-axis equalizer 16, respectively, where the phase delays are equalized. The outputs 17 and 18 of the I-axis equalizer 15 and the Q-axis equalizer 16 are fed to an I-axis lowpass filter 19 and a Q-axis lowpass filter 20, respectively, to eliminate undesired, high-frequency residual components.

Outputs from the I-axis lowpass filter 19 and the Q-axis lowpass filter 20 are inputted to the I-axis decimation circuit 24 and the Q-axis decimation circuit 25. Then, outputs from the I-axis decimation circuit 24 and the Q-axis decimation circuit 25 are inputted to the image-rejecting frequency conversion circuit 26, and its output is supplied to the digital system in the form of digital outputs 21' and 22'.

Since the processing involved, as seen in terms of the frequency axis, up to the frequency conversion circuit and the processing involved, as seen in terms of the frequency axis, from the frequency conversion circuit to sampling and thereafter in the third embodiment shown in FIG. 7 are similar to those shown in FIG. 5 explaining the processing involved, as seen in terms of the frequency axis, up to the ferequency conversion circuit and FIGS. 6(a)–6(e) explaining the processing involved, as seen in terms of the frequency axis, from the frequency conversion circuit to sampling and thereafter in the second embodiment shown in FIG. 4, a description thereof will be omitted.

Figure 8A:
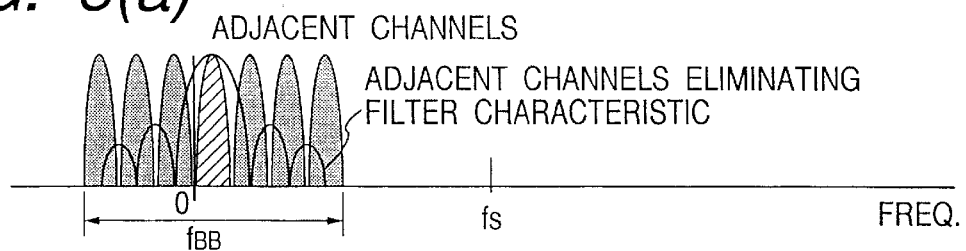
FIGS. 8(a)–8(e) illustrate the operation of the third embodiment of the invention.

Now, referring to FIGS. 8(a)–8(e), a description will be given of the operation of the decimation circuits 24 and 25. FIG. 8(a) is similar to FIG. 6(d), i.e., a diagram illustrating the filter characteristic. The operation of the I-axis decimation circuit 24 and the Q-axis decimation circuit 25 (see FIG. 7) will be described below.

Figure 8B:
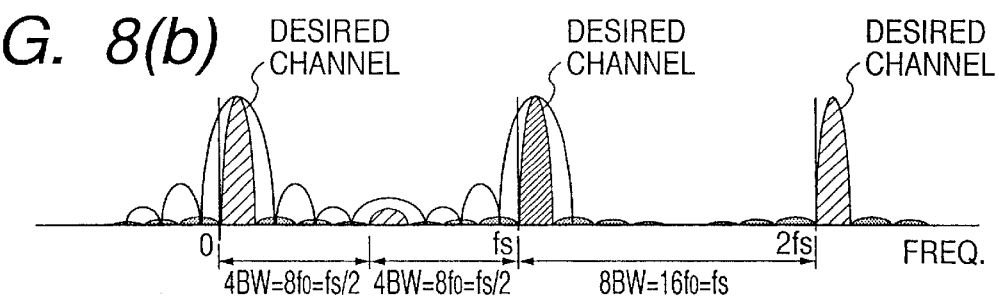

FIG. 8(b) shows a state in which a desired wave has been generally extracted by the adjacent-channels eliminating filter comprised of the complex coefficient filter 12, the I-axis equalizer 15, the Q-axis equalizer 16, the I-axis lowpass filter 19, and the Q-axis lowpass filter 20. However, the same spectrum as the remaining spectrum of the desired wave and its adjacent-channel signal groups which have moved to the DC region is repeated for each harmonic of the sampling frequency fs.

Figure 8C:
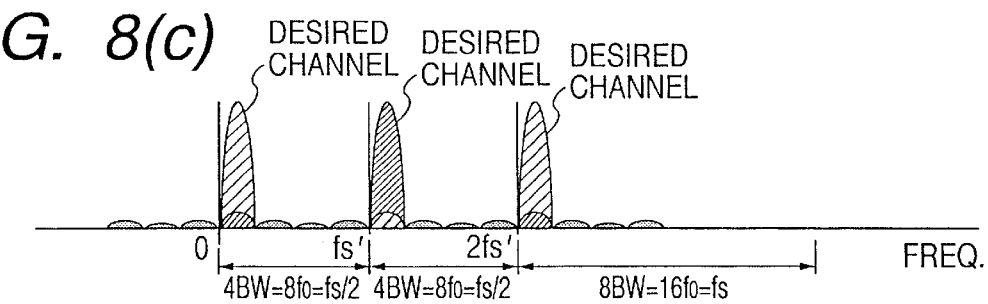

FIG. 8(c) shows a state in which the data has been decimated at a rate of ½. With a sampling frequency fs' that is one half of the original sampling frequency fs, the interval between harmonics is made one half and the spectrum repetition rate is doubled. That is, while in the 16-fold oversampling 8 channels were present between the harmonics of the sampling frequency, only 4 channels come to exist therebetween due to ½-decimation, and residual signals of different channels overlap at the position of each channel.

Figure 8D:
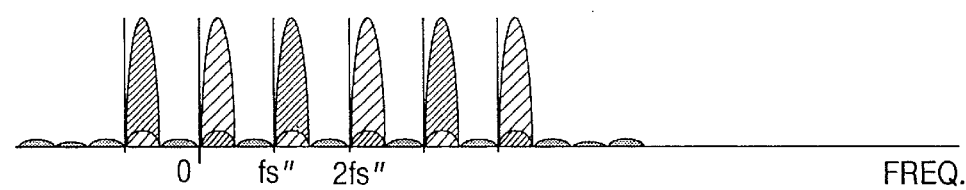
Figure 8E:
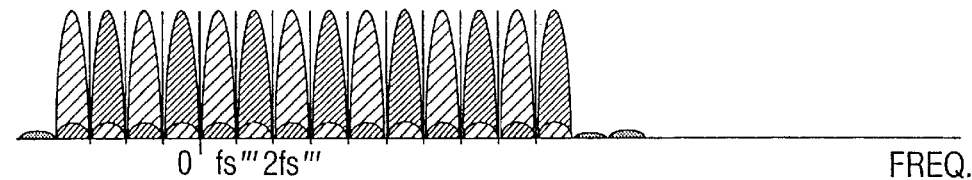

In FIG. 8(d), the data is further decimated at a rate of ½. In FIG. 8(e), the data is still further decimated at a rate of ½, that is, it is decimated at a rate of ⅛ from the state of FIG. 8(b). Consequently, the desired wave spectrum appears repeatedly in the channel intervals. A sampling frequency fs''' at this time corresponds to a frequency of two-fold oversampling with respect to the desired wave. This means that the sampling frequency has been reduced to a level that just satisfies the minimum criterion of the sampling theorem.

In FIG. 8(e), signals of the adjacent-channel groups are superimposed within the desired wave spectrum. Basically, however, the adjacent-channel signals are substantially attenuated by adjacent-channels eliminating filter comprised of the complex coefficient filter 12, the I-axis equalizer 15, the Q-axis equalizer 16, the I-axis lowpass filter 19, and the Q-axis lowpass filter 20.

Accordingly, the state of FIG. 8(e) can be regarded as a state that the desired wave has been sampled and extracted at a frequency two times that of the desired wave. However, the frequency offset from the DC frequency still exists. The outputs of the decimation circuits 24 and 25 are inputted to the image-rejecting frequency conversion circuit 26 to eliminate the offset frequency. Incidentally, each decimation circuit 24 or 25 is a sample-and-hold circuit or a transfer circuit which effects sampling once every eight clock pulses. Since its specific circuit is sufficiently known, a detailed description thereof will be omitted here.

As is apparent from the above description of the third embodiment, the desired wave can be extracted by adjacent-channels eliminating filter comprised of the complex coefficient filter 12, the I-axis equalizer 15, the Q-axis equalizer 16, the I-axis lowpass filter 19, and the Q-axis lowpass filter 20.

EMBODIMENT 4

Figure 9:
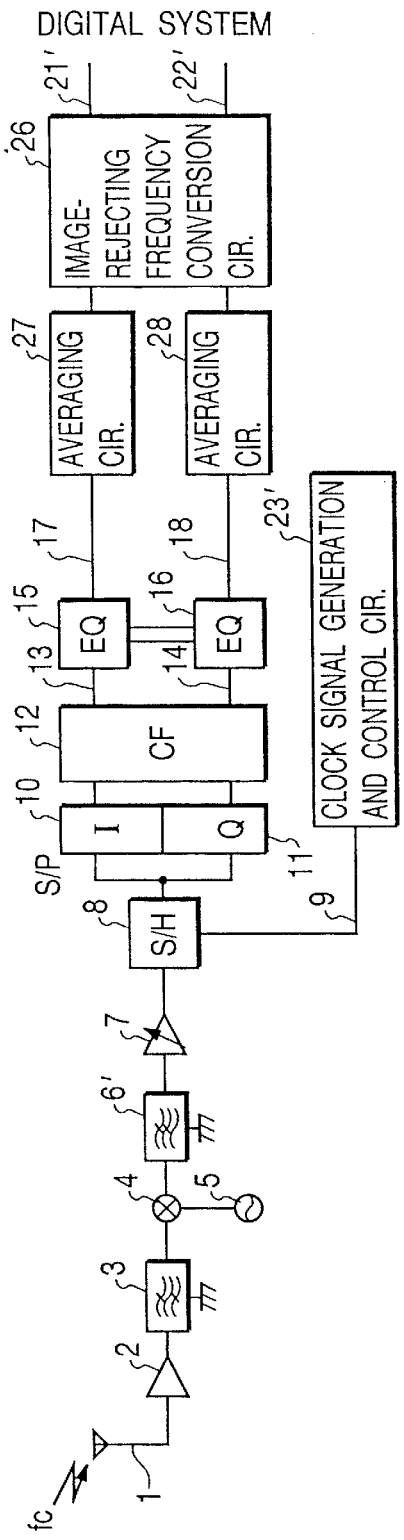
FIG. 9 shows a configuration of a fourth embodiment of the invention.

FIG. 9 shows a configuration of a fourth embodiment of the invention. In FIG. 9, an I-axis averaging circuit 27, a Q-axis averaging circuit 28, and the image-rejecting frequency conversion circuit 26 are interposed between the I-axis equalizer 15 and the digital system 21' or between the Q-axis equalizer 16 and the digital system 22' in the FIG. 4 configuration of the second embodiment of the invention. In this connection, the control system of the clock signal generation and control circuit 23' is augmented.

A received signal 1 obtained from the antenna is supplied to and amplified by a high-frequency amplifier 2. An output from the high-frequency amplifier 2 is supplied to a bandpass filter 3 to extract only signals of all the channels of the relevant communications system and filter out other radio signals. An output from the bandpass filter 3 is supplied to the frequency converter 4 where it is subjected to frequency conversion by use of a local oscillation frequency $f_{LO}$, i.e., a frequency at a boundary between a desired wave and a lower channel adjacent thereto.

An output from the frequency converter 4 is supplied to a first-stage lowpass filter 6' so as to obtain a channel filtering effect whereby image signals which occur in the frequency converter 4 are absorbed and only desired waves are allowed to pass therethrough. An output from the first-stage lowpass filter 6' is supplied to an AGC amplifier 7 from which an amplified signal is outputted with a predetermined signal strength. This output is supplied to a sample-and-hold circuit 8 where it is sampled and held under control by a sampling clock signal 9.

The sampling frequency in the sample-and-hold operation is set to a fraction of an integer of a frequency equal to twice the passband width which is defined by the first-stage lowpass filter 6' and the like. Namely, the first-order sampling theorem is used in sampling by the sample-and-hold circuit. A discrete signal of the received signal thus obtained is supplied to an I-axis-component separating circuit and a Q-axis-component separating circuit 11, respectively.

This sampling output is obtained for every other clock pulse in the I-axis-component separating circuit 10, while in the A-axis-component separating circuit 11 a sampling output is obtained at time points when the sampling output was not obtained in the I-axis-component separating circuit 10. The polarity of the sampling output is inverted for every other clock pulse with respect to each of the I-axis and the Q-axis to effect Hilbert transform, thereby transforming the sampling outputs into the form of two orthogonal components in a phase plane.

These two signals are supplied to a complex coefficient filter 12. The complex coefficient filter 12 eliminates undesired adjacent-channel signal groups, and its orthogonal outputs 13 and 14 are fed to an I-axis equalizer 15 and a Q-axis equalizer 16, respectively, where the phase delays are equalized. The outputs 17 and 18 of the I-axis equalizer 15 and the Q-axis equalizer 16 are inputted to the I-axis averaging circuit 27 and the Q-axis averaging circuit 28, respectively. Then, outputs from the I-axis averaging circuit 27 and the Q-axis averaging circuit 28 are inputted to the image-rejecting frequency conversion circuit 26, and its output is supplied to the digital system in the form of digital outputs 21' and 22'.

Since the processing involved, as seen in terms of the frequency axis, up to the frequency conversion circuit and the processing involved, as seen in terms of the frequency axis, from the frequency conversion circuit to sampling and thereafter in the fourth embodiment shown in FIG. 9 are similar to those shown in FIG. 5 explaining the processing involved, as seen in terms of the frequency axis, up to the frequency conversion circuit and FIGS. 6(a)–6(e) explaining the processing involved, as seen in terms of the frequency axis, from the frequency conversion circuit to sampling and thereafter in the second embodiment shown in FIG. 4, a description thereof will be omitted.

Figure 10A:
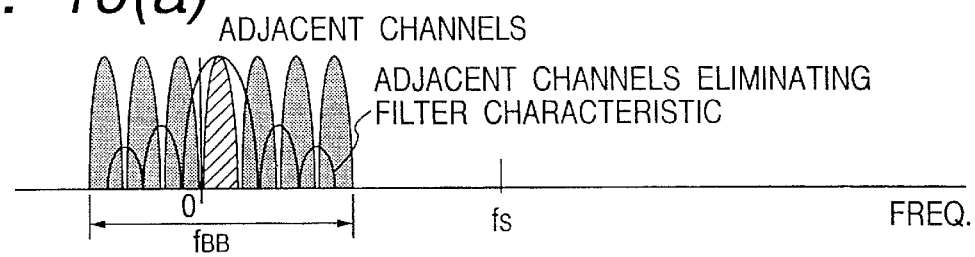
FIGS. 10(a)–10(e) illustrate the operation of the fourth embodiment of the invention.

Now, referring to FIG. 10, a description will be given of the operation of the averaging circuits 27 and 28. FIG. 10(a) is similar to FIG. 6(d), i.e., a diagram illustrating the filter characteristic. The operation of the I-axis averaging circuit 27 and the Q-axis averaging circuit 28 will be described below.

Figure 10B:
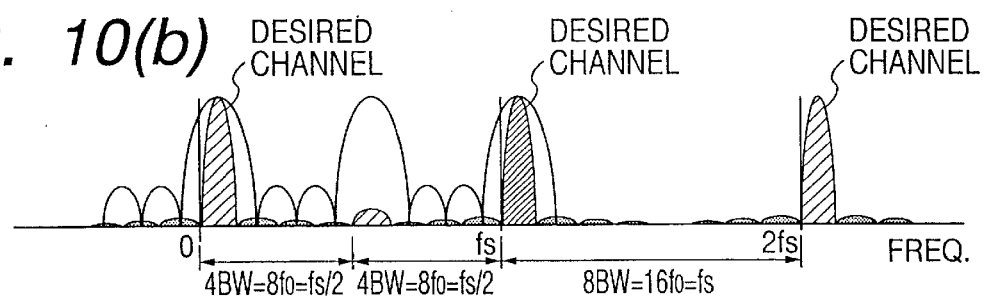

FIG. 10(b) shows a state in which a desired wave has been generally extracted by the adjacent-channels eliminating filter comprised of the complex coefficient filter 12, the I-axis equalizer 15, the Q-axis equalizer 16, the I-axis averaging circuit 27, and the Q-axis averaging circuit 28. However, the same spectrum as the remaining spectrum of the desired wave and its adjacent-channel signal groups which have moved to the DC region is repeated for each harmonic of the sampling frequency fs.

Figure 10C:
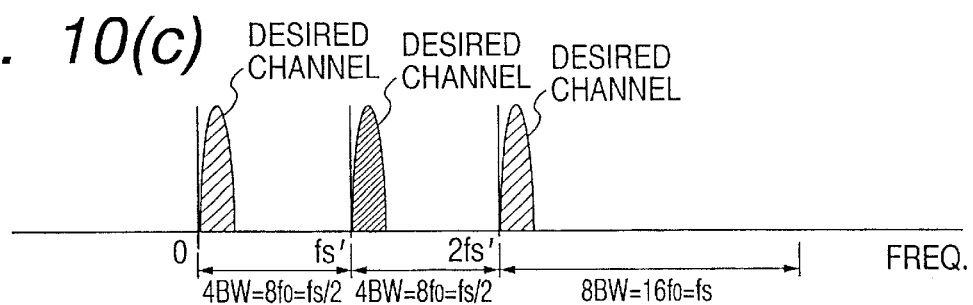

FIG. 10(c) shows a state in which the data has been averaged over two sampling periods. With a sampling frequency fs' that is one half of the original sampling frequency fs, the interval between harmonics is made one half and the repetition rate of the spectrum is doubled. That is, while in the 16-fold oversampling 8 channels were present between the harmonics of the sampling frequency, only 4 channels come to exist therebetween due to the averaging over two sections, and residual signals of different channels overlap at the position of each channel.

Figure 10D:
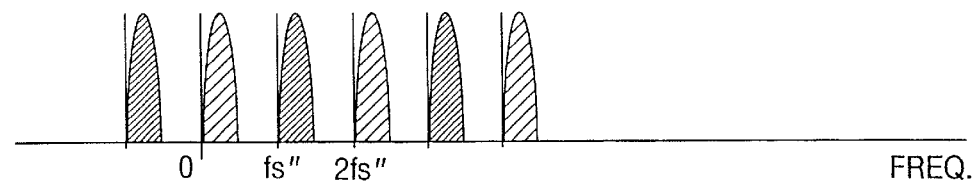
Figure 10E:
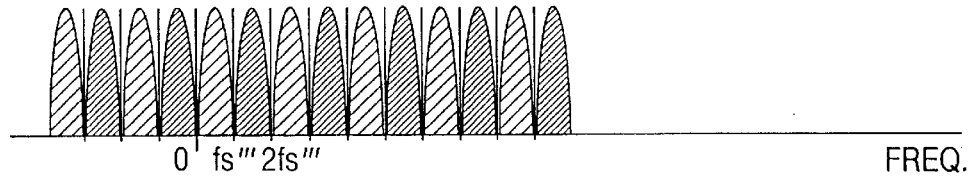

In FIG. 10(d), the data is further averaged such that the data is averaged over four periods as compared to FIG. 10(b). In FIG. 10(e), the data is still further averaged such that averaging is effected over eight periods as compared to FIG. 10(b). Consequently, the desired wave spectrum appears repeatedly in the channel intervals. The sampling frequency fs''' at this time corresponds to two-fold oversampling with respect to the desired wave. This means that the sampling frequency has been reduced to a level that just satisfies the minimum criterion of the sampling theorem.

In FIG. 10(e), although it may be expected that signals of the adjacent-channel groups are superimposed within the desired wave spectrum, actually the superimposed adjacent-channel components are attenuated due to the low pass filtering effect of the averaging.

Accordingly, the state of FIG. 10(e) can be regarded as a state that the desired wave has been sampled and extracted at a frequency two times that of the desired wave. However, the frequency offset from the DC frequency still exists. The outputs of the averaging circuits 27 and 28 are inputted to the image-rejecting frequency conversion circuit 26 to eliminate the offset frequency.

Figure 11:
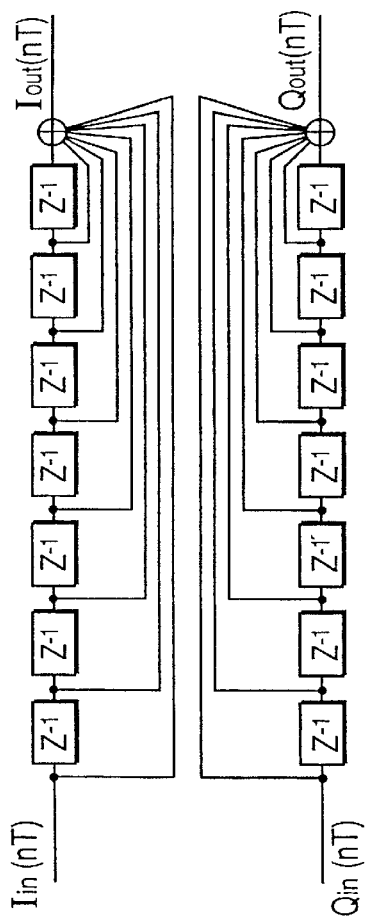
FIG. 11 shows a configuration of an averaging circuit used in the fourth embodiment of the invention.

FIG. 11 shows an example of a configuration of a circuit for averaging eight samples. Delay means of seven stages are connected in cascade for each of the I-axis and the Q-axis, and all of their inputs and outputs are combined to effect averaging. Strictly speaking, division into one-eighths should be effected. However, it would be unnecessary to perform the division here by distributing such a factor to the components of a necessary amplification factor of the overall system.

As is apparent from the above description of the fourth embodiment, the desired wave can be extracted by the characteristics of adjacent-channels eliminating filter comprised of the complex coefficient filter 12, the I-axis equalizer 15, the Q-axis equalizer 16, the I-axis averaging circuit 27, and the Q-axis averaging circuit 28.

EMBODIMENT 5

Figure 12:
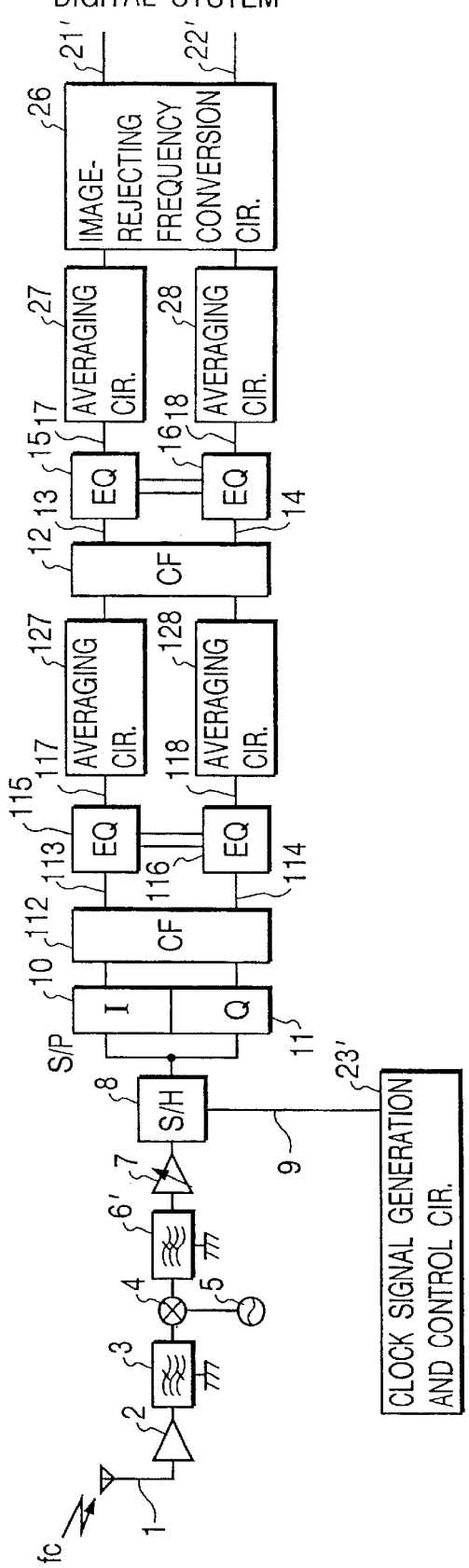
FIGS. 12 and 13 show configurations of a fifth embodiment of the invention.
Figure 13:
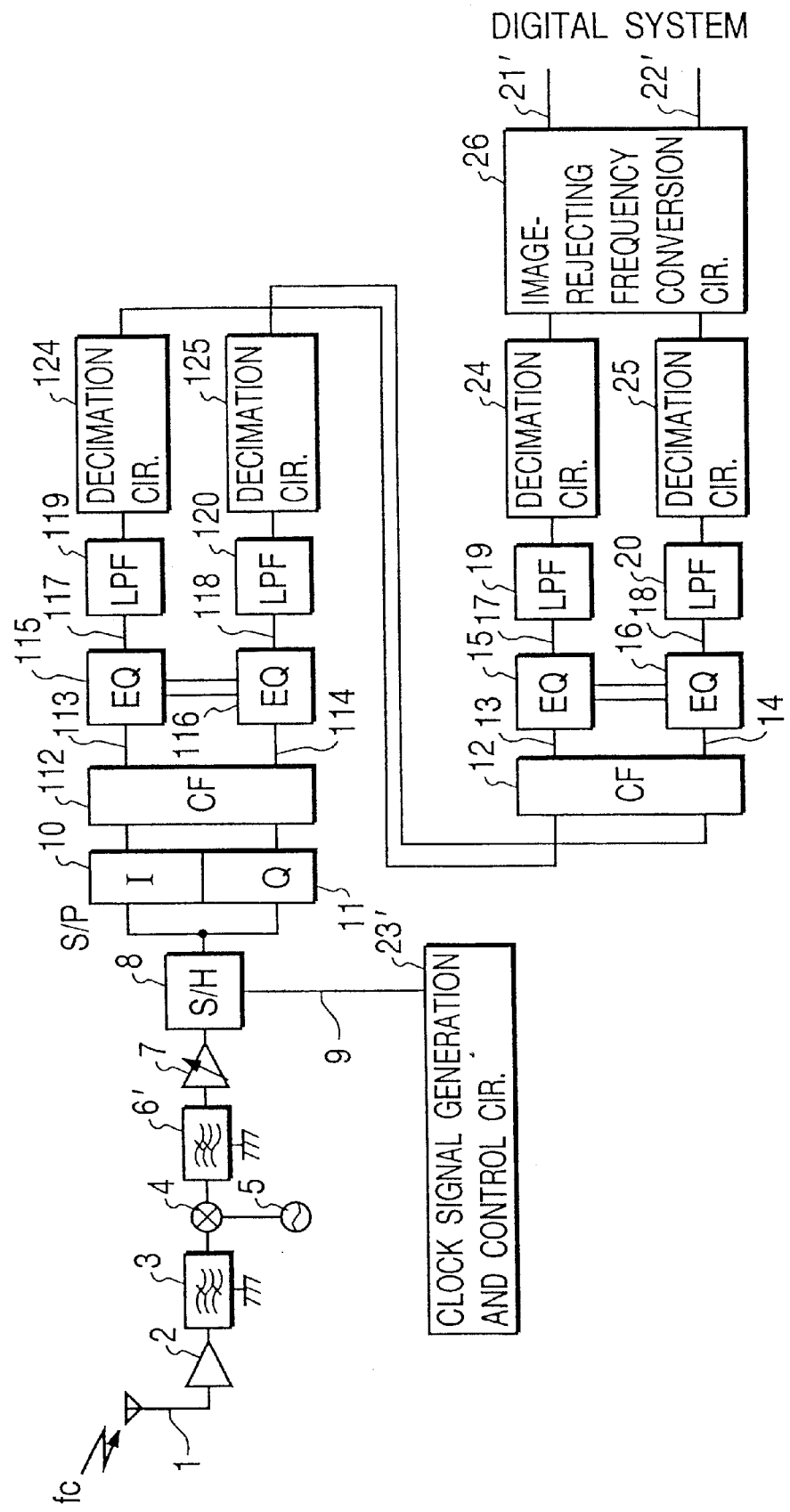

FIGS. 12 and 13 show configurations of a fifth embodiment of the invention. In FIG. 12, a 4-fold range complex coefficient filter 112 (i.e., a second complex coefficient filter), an I-axis 4-fold range equalizer 115 (i.e., a second I-axis equalizer), a Q-axis 4-fold range equalizer 116 (i.e., a second Q-axis equalizer), an I-axis 4-fold range averaging circuit 127 (i.e., a second I-axis averaging circuit), and a Q-axis 4-fold range averaging circuit 128 (i.e., a second Q-axis averaging circuit) are interposed between the I-axis-component separating circuit 10 and the first complex coefficient filter 12 and between the Q-axis-component separating circuit 11 and the first complex coefficient filter 12 in the configuration of the fourth embodiment of the invention. Meanwhile, in FIG. 13, a 4-fold range complex coefficient filter 112 (i.e., a second complex coefficient filter), an I-axis 4-fold range equalizer 115 (i.e., a second I-axis equalizer), a Q-axis 4-fold range equalizer 116 (i.e., a second Q-axis equalizer), an I-axis 4-old range lowpass filter 119 (i.e., a second I-axis lowpass filter), a Q-axis 4-fold lowpass filter 120 (i.e., a second Q-axis lowpass filter), an I-axis 4-fold range decimation circuit 124 (i.e., a second I-axis decimation circuit), and a Q-axis 4-fold decimation circuit 125 (i.e., a second Q-axis decimation circuit) are interposed between the I-axis-component separating circuit 10 and the first complex coefficient filter 12 and between the Q-axis-component separating circuit 11 and the first complex coefficient filter 12 in the configuration of the third embodiment of the invention.

By inserting, in the above manner, the circuit means that is comprised of the complex coefficient filter, the equalizers, and the averaging circuits or the decimation circuits, the operation of eliminating adjacent waves by 16-fold oversampling, as seen from the baseband frequency, is effected doubly. As a result, the elimination of 9 to 16 adjacent channel waves on each side is effected by the 16×4, i.e., 64, -fold oversampling.

In FIG. 12, since the configuration from the antenna to the sample-and-hold circuit 8 and connections thereof are the same as in the third and fourth embodiments, a description thereof will be omitted. The sample-and-hold circuit 8 receives a sampling clock signal 9 necessary for the 64-fold oversampling from the clock signal generation and control circuit 23', and samples and holds the received signal. The band-limited sampling theorem is used in the sampling.

The discrete signal of the received signal thus obtained is supplied to the I-axis-component separating circuit 10 and the Q-axis-component separating circuit 11, respectively. Their respective outputs are supplied to a 4-fold range complex coefficient filter 112, and eight adjacent channel signals are eliminated from each of the upper and lower sides of the desired wave. Its respective outputs 113 and 114 are supplied to the I-axis 4-fold range equalizer 115 and the Q-axis 4-fold range equalizer 116, respectively. Further, their outputs are respectively supplied to the I-axis 4-fold range averaging circuit 127 and the Q-axis 4-fold range averaging circuit 128, or the I-axis 4-fold lowpass filter 115/decimation circuit 119 and the Q-axis 4-fold lowpass filter 120/decimation circuit 120. Baseband outputs of the 4-fold band including the desired wave are restored there.

The two baseband outputs of the 4-fold band thus obtained are supplied to the circuit means for extracting the baseband signal which has been explained in the third and fourth embodiments. According to the fourth embodiment, the two outputs are supplied to the first complex coefficient filter 12, the first equalizers 15 and 16, the first averaging circuits 27 and 28, and the image-rejecting frequency conversion circuit 26 which correspond to 16-fold oversampling, and the original baseband signal is extracted there.

According to the third embodiment, the two outputs are supplied to the first complex coefficient filter 12, the first equalizers 15 and 16, the first lowpass filters 19 and 20, the first decimation circuits 24 and 25, and the image-rejecting frequency conversion circuit 26 which correspond to 16-fold oversampling, and the original baseband signal is extracted.

Figure 14:
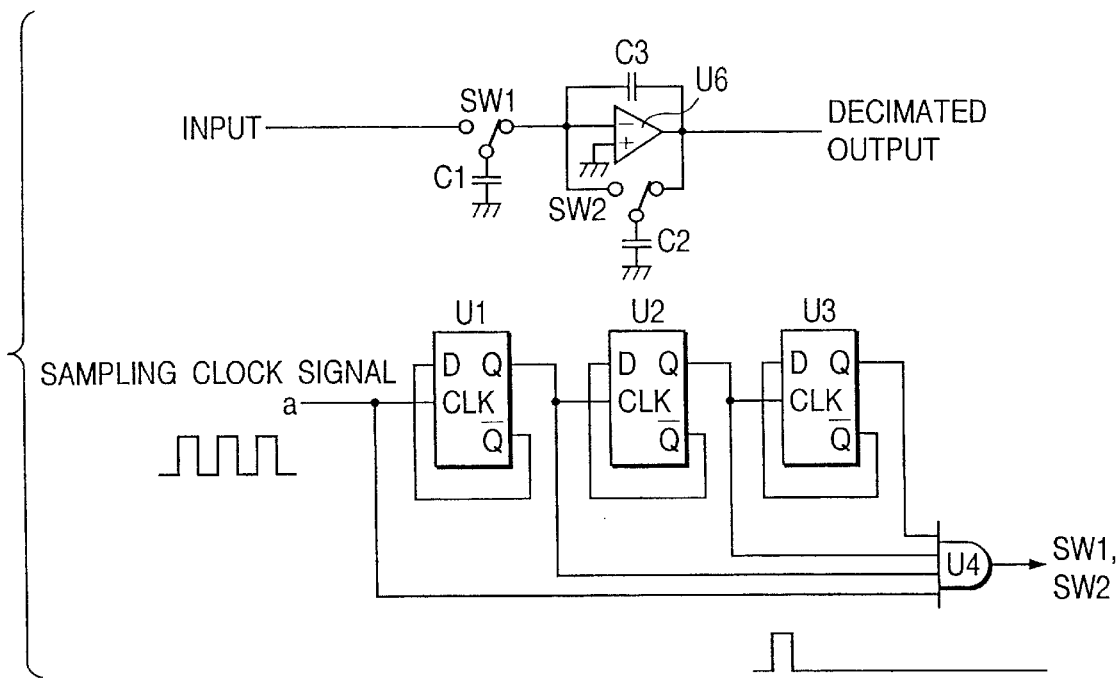
FIG. 14 shows a configuration of a decimation circuit used in the invention.

A specific example of a configuration of the decimation circuit is shown in FIG. 14. The decimation circuit of FIG. 14 is comprised of a switch SW1 for receiving an input; a capacitor C1 that is charged by an input voltage; an inverted amplifier U6; a feedback capacitor C3; a capacitor C2 connected to the ground; a switch SW2 for selectively connecting the capacitor C2 to the input or output of the inverted amplifier U6; a first D-type flip-flop U1 for receiving a sampling clock signal a at its clock input CLK; a second D-type flip-flop U2 for receiving a Q output therefrom at its clock input CLK; a third D-type flip-flop U3 for receiving a Q output therefrom at its clock input CLK; and an AND circuit U4 to which all of the Q outputs and the sampling clock signal a are inputted.

Referring to FIG. 14, a description will be given of the operation. This decimation circuit is a sample-and-hold circuit or a transfer circuit which effects sampling once every eight clock pulses when receiving the sampling clock signal a at its clock input. The sampling frequency is divided by eight by the first D-type flip-flop U1, the second D-type flip-flop U2, and the third D-type flip-flop U3, and an output of the AND circuit U4 becomes a high potential "H" once every eight clock pulses, that is, when all the outputs of the aforementioned flip-flops and the sampling clock signal a are at the high potential "H."

The switch SW1 is controlled by this output and allows its input to be supplied to the capacitor C2, and at the same time the switch SW2 connects the capacitor C2 to the input of the inverted amplifier U6. At this instant, the output of the inverted amplifier U6 maintains its output state by means of the capacitor C2 that stores the preceding output state. The output of the AND circuit U4 returns to a low potential "L" after a lapse of one-pulse duration of the sampling clock signal, so that the switches SW1 and SW2 are changed to the previous switching states. At this time, however, since the capacitor C1 is charged by the instantaneous voltage of the input, so the instantaneous voltage of this input signal continues as the voltage at the inverted amplifier U6 for the duration of the subsequent 15 sampling pulses. It is apparent from the above that the input signal can be decimated at a rate of ⅛ by the above-described circuit.

Figure 15A:
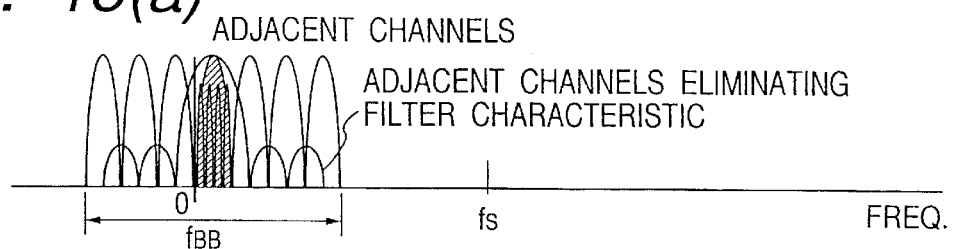
FIGS. 15(a)–15(e) illustrates the operation of the fifth embodiment of the invention.
Figure 15B:
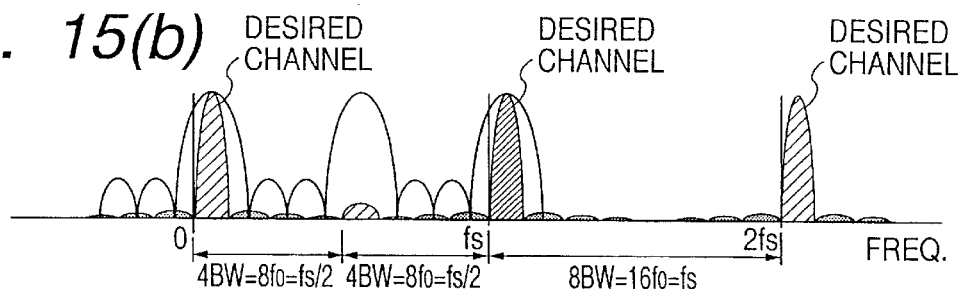
Figure 15C:
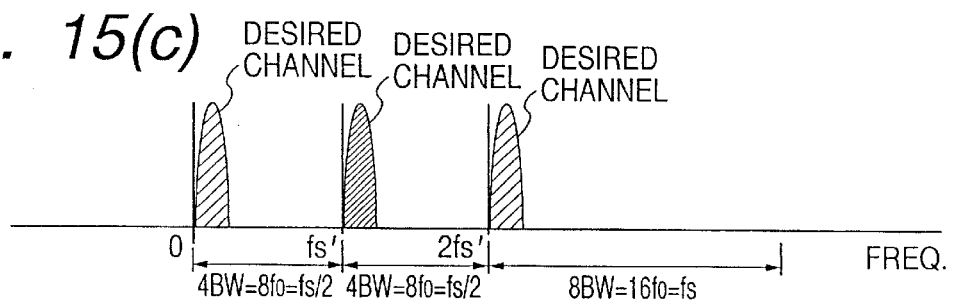
Figure 15D:
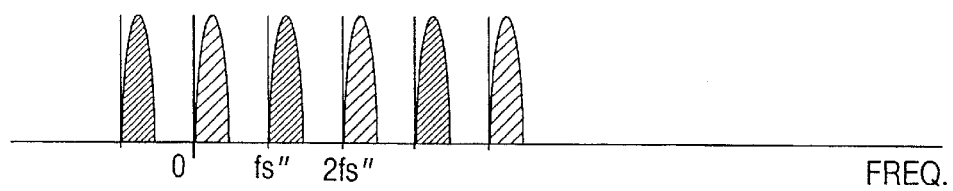
Figure 15E:
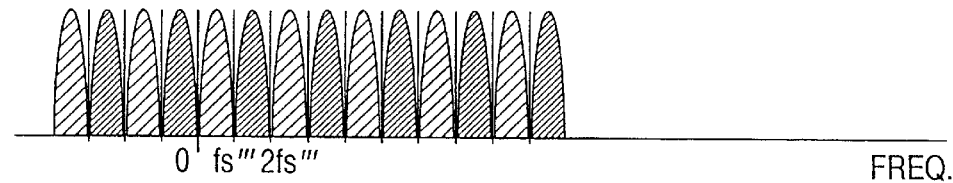

FIGS. 15(a)–15(e) show the processing involved, as seen in terms of the frequency axis, from the frequency conversion circuit to sampling and thereafter in the fifth embodiment. FIG. 15(a) shows a state in which a group of received signals which have been sampled and held by 64-fold oversampling are handled as an imaginary channel including four channels as one set. FIG. 15(b) shows a state similar to that of FIG. 3(d) or FIG. 6(d), and illustrates a step leading to the subsequent processing.

As is apparent from the description of the fifth embodiment, a desired wave can be extracted by performing, doubly, the operation of eliminating adjacent waves by 16-fold oversampling as seen from the baseband frequency.

Specific Example of Sample-and-Hold Circuit

As shown in FIG. 1, in the invention, in order to alleviate the burden on the high-frequency circuits, wide-band sampling is performed in a state that one-stage down conversion has been effected, and the subsequent signal processing is carried out by the digital means. Specific examples of components of the sample-and-hold circuit 8 are an input buffer, a sampling gate, and an output buffer. It can be said that a received signal which has been sampled and held is an analog signal which has been digitized and transformed into data.

As for the sampling frequency, the bandwidth of the intermediate frequency stage is made wider for the purpose of partially bearing the burden imposed on the function of the filter for eliminating adjacent channels, thereby making it possible to alleviate the performance required of the filter in the intermediate frequency stage as well. If the bandwidth of the intermediate frequency stage is provided to cover a total of five upper and lower adjacent channels, the bandwidth of the intermediate frequency stage corresponds to a total of six channels including the desired channel. Accordingly, the oversampling, as viewed from the bandwidth of the baseband signal, is 16-fold oversampling.

Figure 16:
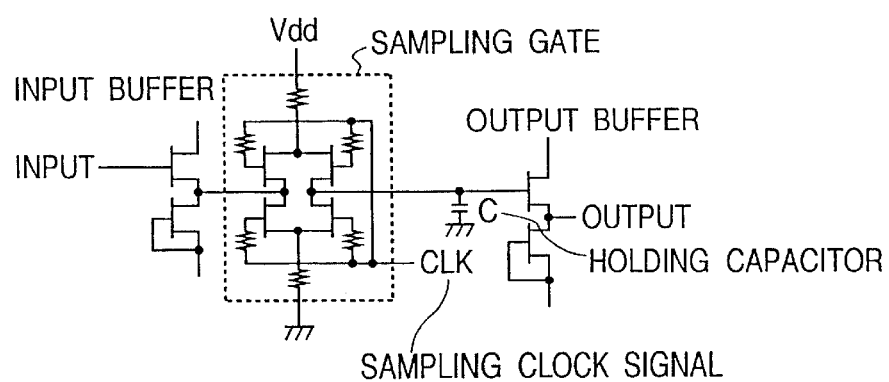
FIG. 16 shows a configuration of a high-speed sample-and-hold circuit used in the invention.

FIG. 16 shows an example of a sample-and-hold circuit which is preferably constituted of a sampling gate using, for instance, a compound semiconductor such as GaAs so as to be able to oversample a signal at the intermediate frequency stage at a rate of two-fold or more.

Further, if the sample-and-hold circuit is constituted of a low-noise device using, for example, a compound semiconductor such as GaAs, the power consumption can be fundamentally lowered because a sampling input and output need not be large-amplitude signals as required by a conventional A/D converter.

The duty cycle of a sampling clock signal CLK in FIG. 16 is set at 50% to effect a track-hold operation, so as to reduce the switching idling current of the sampling gate. This method calls for a slightly stricter requirement on the settling time, but imposes less strain as a whole.

Specific Example of Orthogonal-Component Separating Circuits

Figure 17:
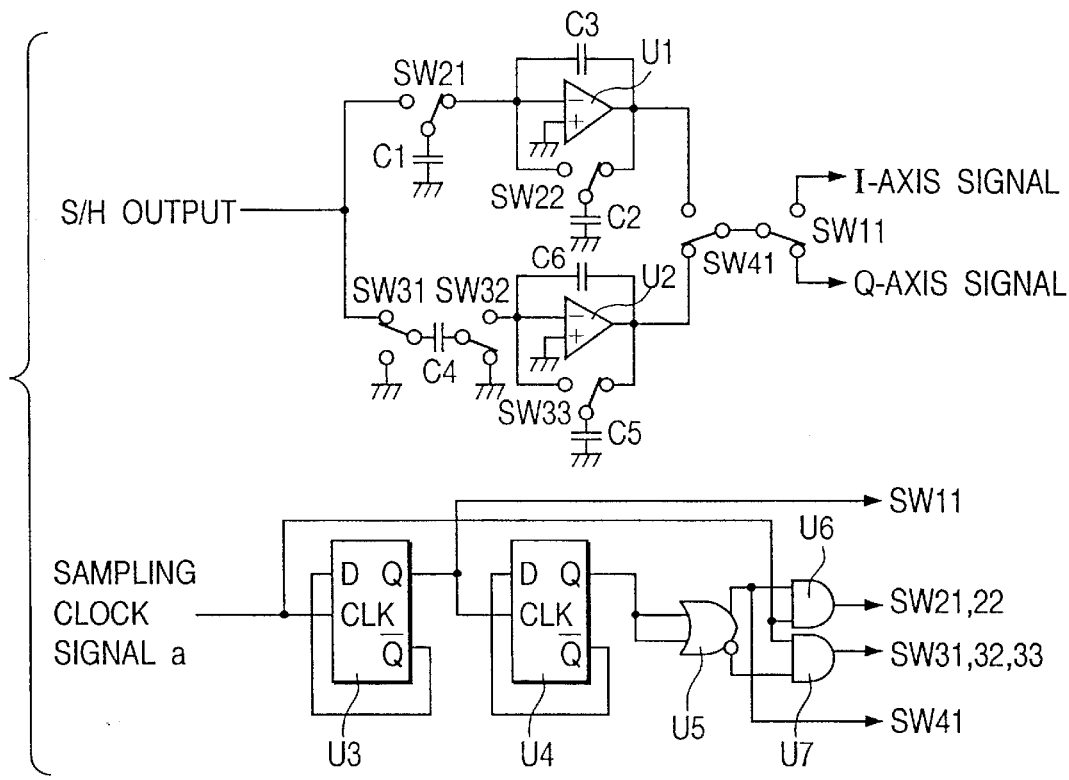
FIG. 17 shows a specific example of an orthogonal-component separating circuit.

FIG. 17 shows a specific example of the I-axis-component separating circuit 10 and the Q-axis-component separating circuit 11 shown in FIG. 1 or 4. FIG. 18 shows the operation thereof.

In FIG. 17, a sample-and-hold output of the sample-and-hold circuit 8 is supplied to a switch SW21 and a switch SW31. An inverted amplifier U1 is a shunt feedback-type amplifier based on negative feedback by means of the capacitor C3. When the switches SW21 and SW22 are in the state shown in FIG. 17, the output is defined by the terminal voltage due to the charge stored in the capacitor C1.

When the switches SW21 and SW22 are reversed at time t0, the capacitor C2, which was connected to the output end of the inverted amplifier U1 and was charged by the output voltage until then, is connected to the input of the inverted amplifier U1 by the switch SW22. Accordingly, where the capacitances of the C2 and C3 are equal to each other, the output potential of the inverted amplifier U1 is held at the same potential. During this period, the switch SW21 connects the output of the sample-and-hold circuit 8 to the capacitor C1, and the capacitor C1 is charged by the voltage of a new sample value.

When the switches SW21 and SW22 return to the state shown in FIG. 17 at time t1, the output voltage of the sample-and-hold circuit 8 which is stored in the capacitor C1 is supplied to the inverted amplifier U1, and if the capacitances of the C1 and C3 are equal to each other, a voltage equal to the new sample value is generated at the output of the inverted amplifier U1. That is, the inverted amplifier U1 functions as a buffer amplifier which maintains the polarity of the output of the sample-and-hold circuit 8.

An inverted amplifier U2 is a shunt feedback-type amplifier based on negative feedback by means of a capacitor C6. When the switches SW32 and SW33 are in the state shown in FIG. 17, the output is defined by the terminal voltage due to the charge stored in the capacitor C5.

When the switches SW31, SW32 and SW33 are inverted at time t0, a capacitor C5, which was connected to an input end of the inverted amplifier U2 and governed the output voltage until then, is connected to the output of the inverted amplifier U2 by the switch SW33. At the same time, the SW31 side of the capacitor C4 is connected to the ground, and the switch SW32 side is connected to the input of the inverted amplifier U2. Where the capacitances of the C4 and C6 are equal to each other, the voltage of a sample value of the sample-and-hold circuit 8 is generated at the output of the inverted amplifier U2. Still at the same time, the capacitor C5 is connected to the output of the inverted amplifier U2 by the switch SW33, and is charged by the voltage of a new sample value.

Accordingly, when the switches SW32 and SW33 return to the state shown in FIG. 17 at time t1, the voltage stored in the capacitor C5 is supplied to the input terminal of the inverted amplifier U2, and further continues to hold the output potential. That is, the inverted amplifier U2 functions as an amplifier which inverts the polarity of the output of the sample-and-hold circuit 8.

A D-type flip-flop U3 receives a sampling clock signal at its input, and its output is fed back to its D input. Thus, the D-type flip-flop U3 constitutes a frequency divider. Similarly, a flip-flop U5 also constitutes a frequency divider. The cascade-connected two-stage flip-flops divide the frequency is into four.

The operation of this circuit will be described by using an example of signals shown in an operation timing chart of FIG. 18. Sampling clock pulses arrive at equal intervals at time points t1, t2, t3, t4, t5, t6, t7, t8, . . . The sampling clock signal is a square wave having a duty ratio of about 50%, as described before. Receiving this signal, the output Q of the flip-flop U3 becomes "1" at odd-numbered time points t1, t3, t5, t7, . . . Receiving this output, the output of the flip-flop U4 becomes "1" at time points t1, t5, t9, . . .

On the other hand, to separate a quadrature-modulated signal into two parts in a phase space, it suffices to effect phase discrimination at the same frequency. Quadrature detection for this purpose is equivalent to sampling with a phase deviation of $\pi/2$. To perform this sampling on a string of sample values which have been sampled consecutively in a uniform manner, it suffices to discriminate the phase by multiplying the sample values by a cosine function (I-axis component side) and a sine function (Q-axis component side).

If the above operation is performed at the sampling limit, each sampling clock pulse shown in FIG. 18(a) corresponds to an interval of $\pi/2$. That is, the highest frequency component is sampled by four sampling clock pulses shown in FIG. 18(a).

It also suffices that the cosine function for the I-axis component extraction and the sine function for the Q-axis component extraction for extracting orthogonal components be given the frequency corresponding to the highest frequency, and be sampled at the same time. If the sinusoidal waves whose frequency is ¼ of the repetition frequency of the sampling clock signal are sampled by the sampling clock signal, in the cosine function +1 and +1 are sampled at positions shown in FIG. 8(d), whereas in the sine function +1 and −1 are sampled at positions lagging from those of the cosine function by a phase of $\pi/2$ that corresponds to one sample, as shown in FIG. 8(e). Accordingly, I-axis-side samples are obtained at the positions shown in FIG. 18(d) without polarity inversion thereof, while Q-axis-side samples are obtained at the positions shown in FIG. 18(e) with alternate polarity inversion thereof.

If the sampling is effected in the above manner, sampling outputs that are equivalent to those of sampling which is effected with respect to orthogonal signals can be obtained from sample values obtained by sampling of one series. To implement the above by a circuit, if the I-axis multiplication coefficients in FIG. 18(d) and the Q-axis multiplication coefficients in FIG. 18(e) are classified into groups by using sections each having the same polarity, a pair of three samples and one sample are obtained, as shown in FIGS. 18(h) and 18(i).

An OR gate U5, which receives a Q output of the flip-flop U4, assumes the "H" state at time points t1, t2, t5, and t6 in FIG. 18. Accordingly, an output of an AND gate U6, to which the output of the OR gate U5 and the sampling clock signal a are inputted, generates the waveform shown in FIG. 18(h). On the other hand, an output of an AND gate U7, to which a negative logic output of the OR gate U5 and the sampling clock signal a, generates the waveform shown in FIG. 18(i).

On the other hand, the I-axis samples and the Q-axis samples are outputted alternately, as is shown in FIG. 18(j). From the foregoing, it is understood that the circuit of FIG. 17 can transform the output of the sample-and-hold circuit 8 into orthogonal signals. To manage, on the circuit, the above state variation, the three types of gate circuits U5, U6, and U7 shown in FIG. 17 which use the outputs of the aforementioned flip-flops are provided.

Specific Example of Complex Coefficient Filter

Figure 19:
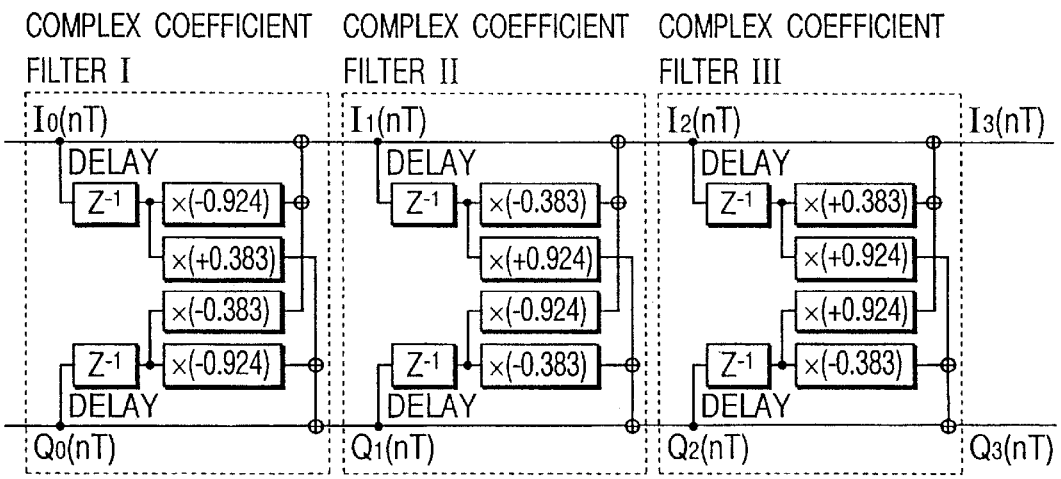
FIG. 19 shows a configuration of a complex coefficient filter used in the invention.

FIG. 19 shows a specific example of the complex coefficient filter 12 shown in FIG. 1. The complex coefficient filter 12 is formed by cascading three filters having the same construction, i.e., a complex coefficient filter I, a complex coefficient filter II, and a complex coefficient filter III. The zero points of these three filters are respectively set to the center frequencies of the three adjacent channels which have been moved to the baseband region and positioned in the negative frequency region in FIG. 2(d).

An explanation will be given of the above configuration by referring to FIG. 19, which shows the setting of the characteristics of the complex coefficient filters. FIG. 20(A) shows a channel group which is the same as the channel group shown in FIG. 2(b). FIG. 20(B) shows channels which have been moved to the vicinity of the baseband, and is equivalent to FIG. 2(d). (The local oscillation frequency is offset by $\omega_0$.)

Figure 20:
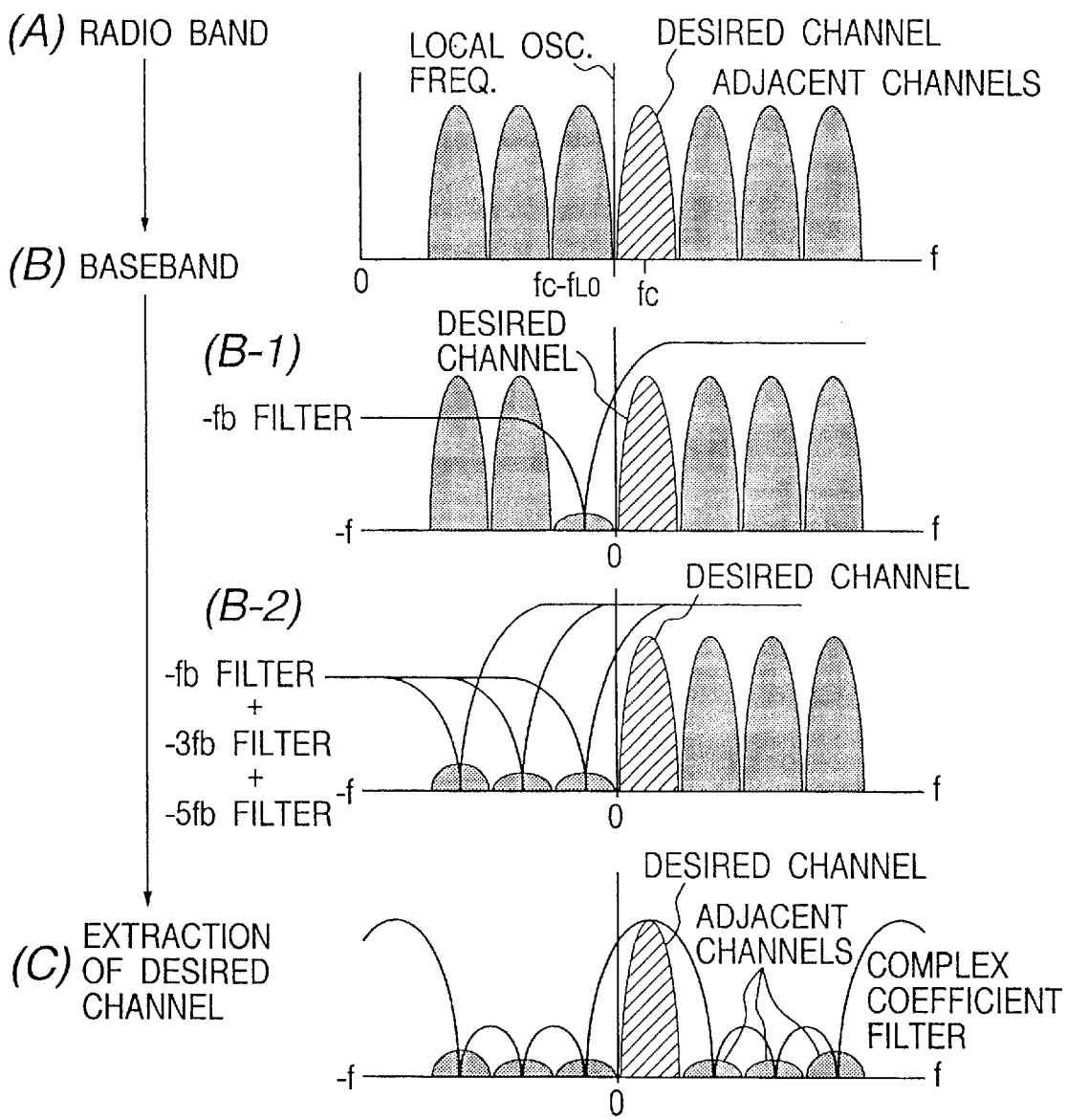
FIG. 20 shows the characteristics of the complex coefficient filter of FIG. 19.

The zero points of the complex coefficient filters I, II, and III are respectively set to center frequencies $-fb$, $-3fb$, and $-5b$ of the adjacent channels. FIG. 20(B-1) schematically shows the case of using only the complex coefficient filter I for eliminating the channel having the center frequency $-fb$. Similarly, FIG. 20(B-2) schematically shows, in supper imposition, characteristics of the complex coefficient filters I, II, and III for eliminating the three channels having the center frequencies $-fb$, $-3fb$, and $-5fb$. FIG. 20(C) shows a characteristic as a combination of the above three characteristics, and shows that actually the adjacent channel signals in the positive region are also attenuated (the characteristic is symmetrical with respect to the desired channel).

Figure 21A:
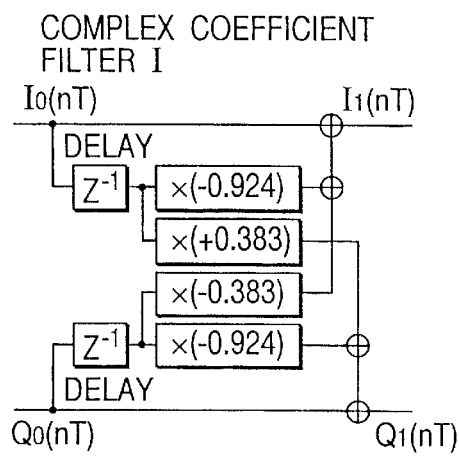
FIGS. 21(a)–21(c) illustrate the operation of the complex coefficient filter.
Figure 21B:
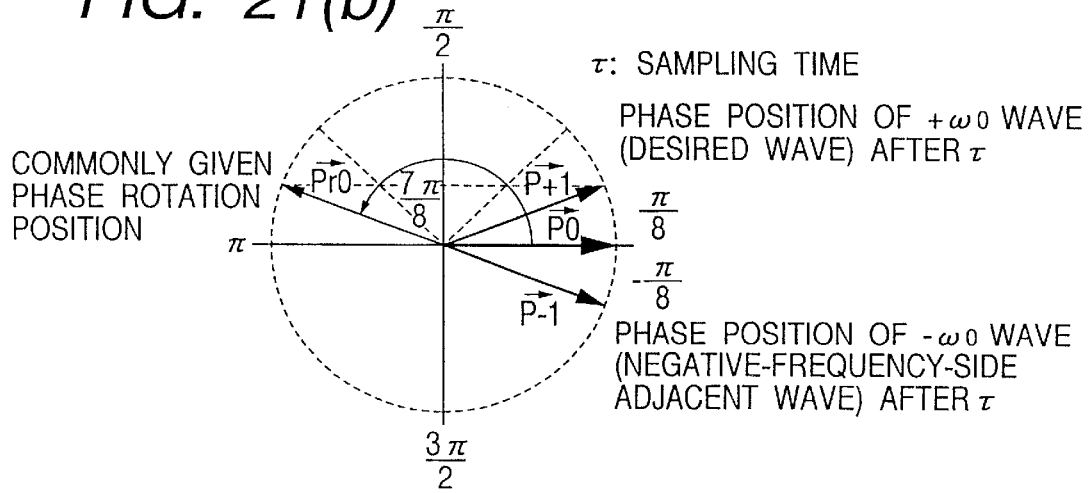
Figure 21C:
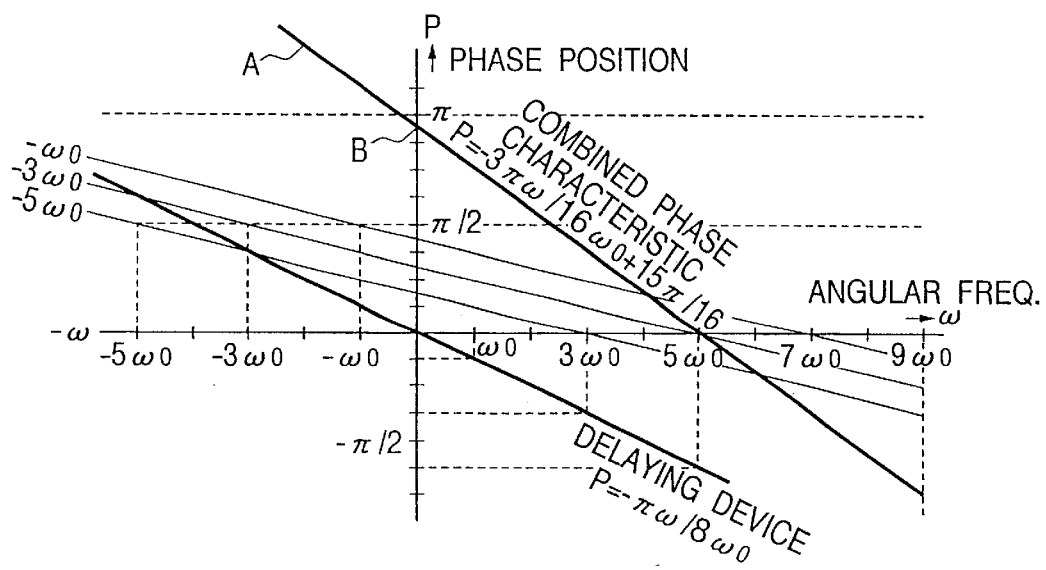

FIGS. 21(a)–21(c) show the operation of the complex coefficient filter 12. FIG. 21(a) shows a configuration of the basic block of the complex coefficient filter 12, i.e., the complex coefficient filter I. FIG. 21(b) shows the operation in the phase plane,. and FIG. 21(c) shows the operation in the phase-frequency plane.

FIG. 21(b) shows the operation of the complex coefficient filter I with respect to the center frequency $-fb$, and the operation is directed to the adjacent channel wave whose phase rotates in the opposite direction to that of the desired channel wave. The sampling is 16-fold oversampling as seen from the desired wave channel, and there is a phase difference of $\pi/8$ in one-sample period.

As for the adjacent wave having the center frequency $-fb$, there is a phase difference of $\pi/8$ in one-sample period. Therefore, in the invention, a method has been devised in which a signal obtained by rotating a signal vector of one sample before by a phase of $7\pi/8$ is added to a signal of one sample later, to thereby cancel out the adjacent wave having the center frequency $-fb$.

As is apparent from FIG. 21(b), the above two samples disappear because they have a phase difference of $\pi$, i.e., have opposite directions. At this time, the desired wave exhibits a phase difference of $6\pi/8$ and survives as a vector of $2\sin(\pi/8)$.

Figure 22A:
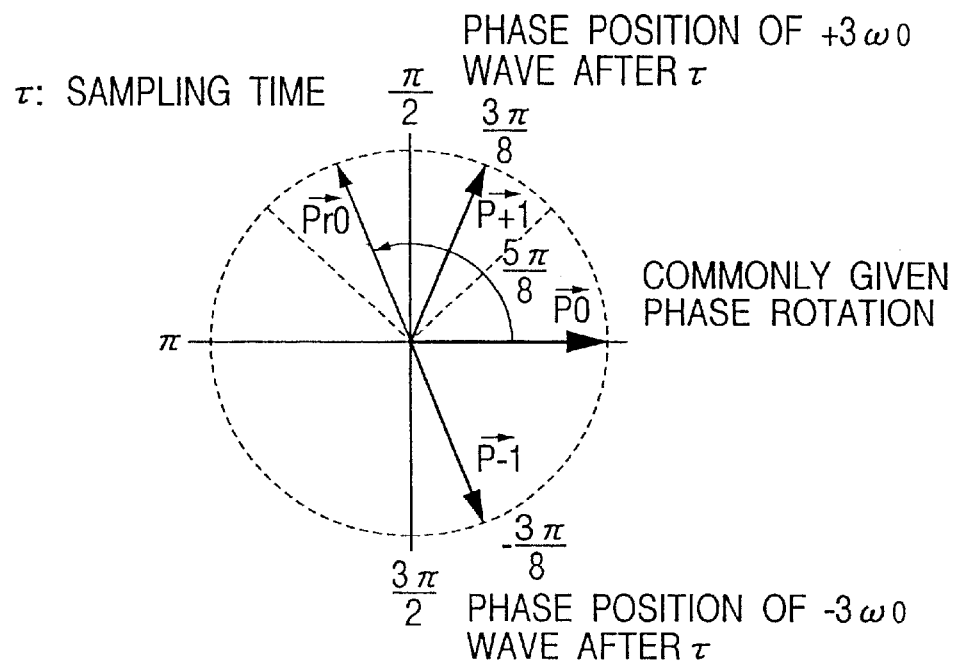
FIGS. 22(a) and 22(b) show phase rotation angles for eliminating second and third adjacent channels.
Figure 22B:
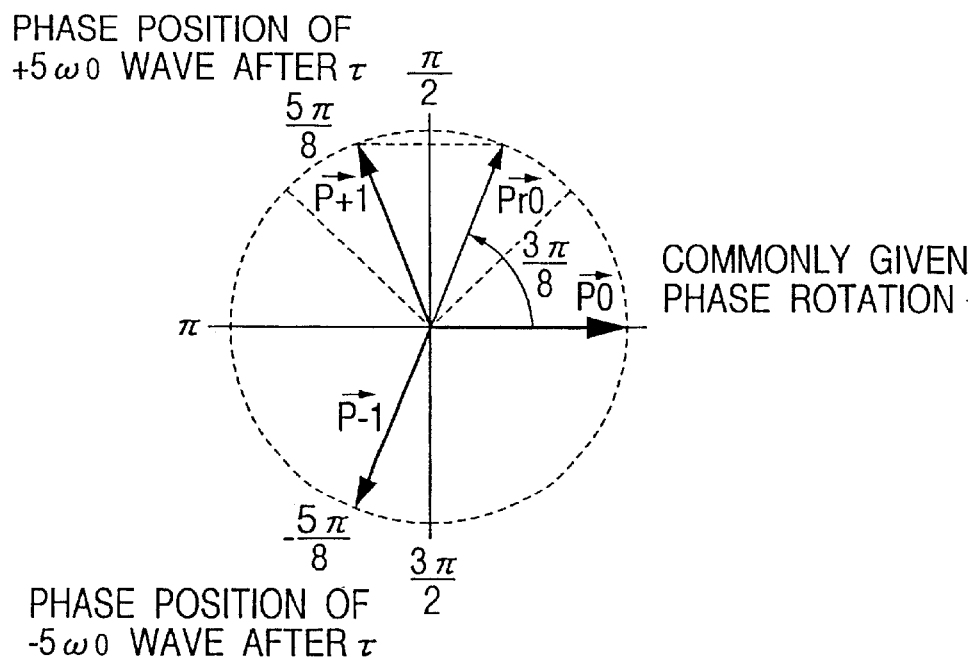

FIGS. 22(a) and 22(b) show phase rotation angles for eliminating second and third adjacent channels, which are similar to the phase rotation angle for eliminating the adjacent channel shown in FIG. 21(b). It is seen that the phase rotation angle is $5\pi/8$ for the elimination of the second adjacent channel and is $3\pi/8$ for the elimination of the third adjacent channel.

If it is assumed that I-axis and Q-axis sample values at time t0 are $I_0$ and $Q_0$, rotation vectors at time t1 are calculated as $$I\text{-axis rotation vector} = I_0\cos(\text{rotation angle}) - Q_0\sin(\text{rotation angle})$$
$$= I_0\cos7\pi/8 - Q_0\sin7\pi/8$$
$$= -I_0\cos\pi/8 - Q_0\sin\pi/8$$

$$Q\text{-axis rotation vector} = I_0\sin(\text{rotation angle}) + Q_0\cos(\text{rotation angle})$$
$$= I_0\sin7\pi/8 + Q_0\cos7\pi/8$$
$$= I_0\sin\pi/8 - Q_0\cos\pi/8.$$

Although the I-axis corresponds to a cosine component and the Q-axis corresponds to a sine component in terms of the phase, each rotation vector is formed by multiplying the two components by sine and cosine values of the rotation angle. In this manner, a filter called the complex coefficient filter is constructed.

In each of the complex coefficient filters I, II, and III shown in FIG. 19, there are elements bridging the I and Q axes. From the foregoing, a composite value at time t1 is obtained through combination with a vector obtained by delaying and then rotating a sample value of one sample before. Hence, I-axis and Q-axis outputs $I_1$ and $Q_1$ of the complex coefficient filter I are calculated as $$I_1 = I_0(t = to + ts) - I_0(t = to)\cos\pi/8 - Q_0(t = to)\sin\pi/8 \quad (1)$$

$$Q_1 = Q_0(t = to + ts) + I_0(t = to)\sin\pi/8 - Q_0(t = to)\cos\pi/8. \quad (2)$$

where t and t0 represent time and ts denotes one sample period.

Similarly, in the complex coefficient filter II for eliminating the second adjacent channel, the rotation angle of a vector is set to $5\pi/8$, while in the complex coefficient filter III for eliminating the third adjacent channel the rotation angle of a vector is set to $3\pi/8$. Hence, I-axis and Q-axis outputs of the complex coefficient filter II are calculated as $$I_2 = I_1(t = to + ts) + I_1(t = to)\cos 5\pi/8 - Q_1(t = to)\sin 5\pi/8 \quad (3)$$

$$Q_2 = Q_1(t = to + ts) + I_1(t = to)\sin 5\pi/8 + Q_1(t = to)\cos 5\pi/8. \quad (4)$$

I-axis and Q-axis outputs of the complex coefficient filter III are calculated as $$I_3 = I_2(t = to + ts) + I_2(t = to)\cos 3\pi/8 - Q_2(t = to)\sin 3\pi/8 \quad (5)$$

$$Q_3 = Q_2(t = to + ts) + I_2(t = to)\sin 3\pi/8 + Q_2(t = to)\cos 3\pi/8. \quad (6)$$

A relationship of delay is present between samples at time points t0 and t0+ts. In FIG. 19, delay means are provided on the t0 side. Incidentally, as for the order of cascading of the complex coefficient filters, there is theoretically no difference even if any one of them is placed at the beginning. In practice, however, there is a desirable order in view of the frequency characteristic of the means realizing the circuit.

In FIG. 21(*c*), the center angular frequency of the desired wave is denoted by $+\omega_0$, and the center angular frequencies of the three lower adjacent channel waves are respectively represented by $-_0, -3\omega_0, -5\omega_0$, phase characteristics P of the complex coefficient filters I, II, and III for eliminating the adjacent channel waves assume three rightwardly descending parallel lines corresponding to the following:

Complex coefficient filter I ($-\omega_0$ elimination):

$$P=-\pi\omega/16\omega_0+3\pi/16$$

Complex coefficient filter II ($-3\omega_0$ elimination):

$$P=-\pi\omega/16\omega_0+5\pi/16$$

Complex coefficient filter III ($-5\omega_0$ elimination):

$$P=-\pi\omega/16\omega_0+7\pi/16$$

If these three filter phase characteristics are combined, we obtain line A in FIG. 21(*c*), which is expressed by $$P=-3\pi\omega/16\omega_0+15\pi/16$$

An intercept B at $\omega=0$ is equal to $15\pi/16$.

Figure 23A:
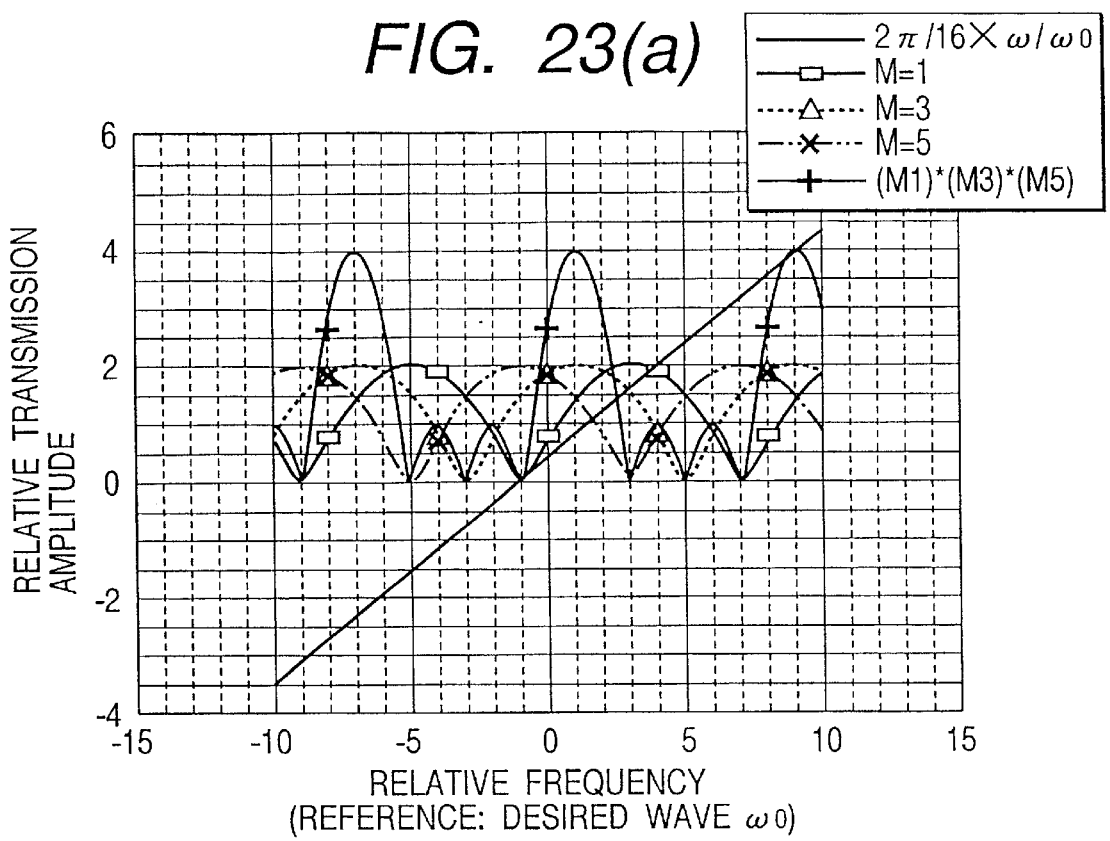
FIGS. 23(a) and 23(b) show theoretical characteristics of the complex coefficient filter.
Figure 23B:
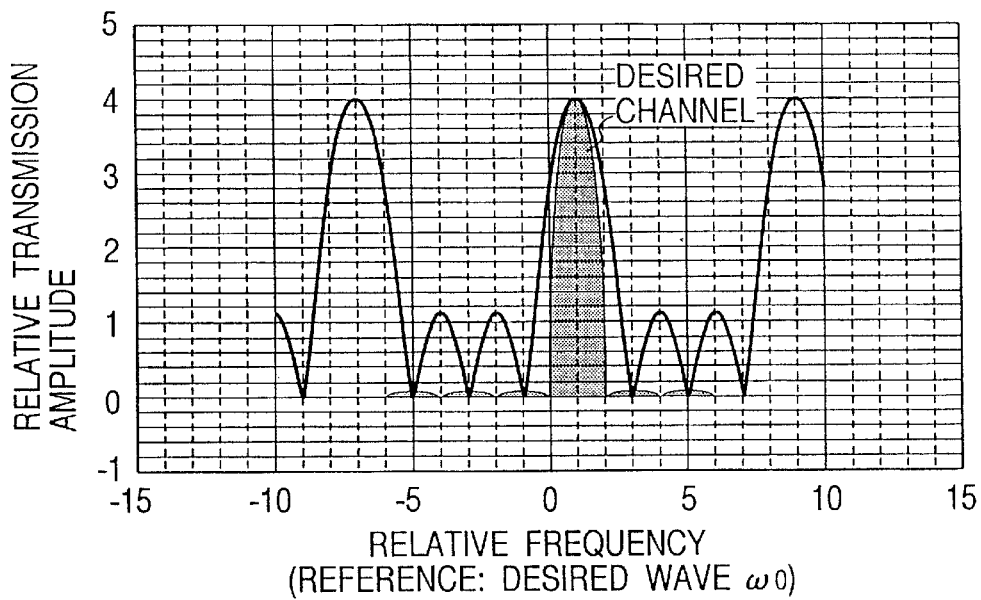

The above effects are shown by theoretical calculation results of FIGS. 23(*a*) and 23(*b*). FIG. 23(*a*) shows individual characteristics of the three types of filters, i.e., the complex coefficient filters I, II, and III, and FIG. 23(*b*) shows an overall characteristic. From FIG. 23(*a*), it is understood that with one stage of complex coefficient filter zero points appear at a rate of four-fold the channel interval rate, but in the combined characteristic zero points appear at the channel interval rate. In addition, it is apparent from FIG. 23(*b*) that, as a result of the above upper and lower adjacent wave groups are substantially attenuated while the desired wave indicated in gray is protected.

The above effects are obtained from the fact that the frequency offset of ½ of the channel interval frequency is provided between the center frequency of the desired wave after the frequency conversion and the sampling frequency, as shown in FIGS. 2(*a*) and 2(*b*).

In addition, the frequency offset provides another effect of obviating influences of a DC offset and a drift that occur after demodulation.

As shown in FIG. 21(*c*), the complex coefficient filters are provided with a fixed phase advance or delay which is independent of the frequency. However, if a plurality of complex coefficient filters are used being connected in cascade, a frequency-dependent phase distortion occurs, as shown by B in FIG. 21(*c*).

Figure 24:
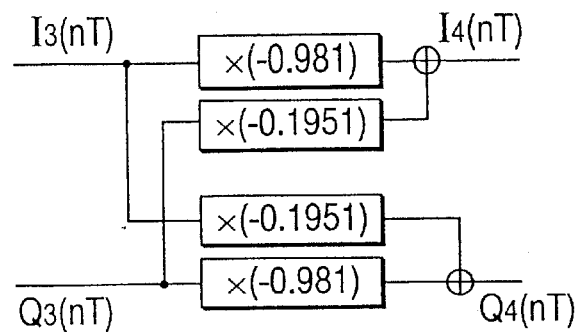
FIG. 24 shows a configuration of an equalizer.
Figure 25:
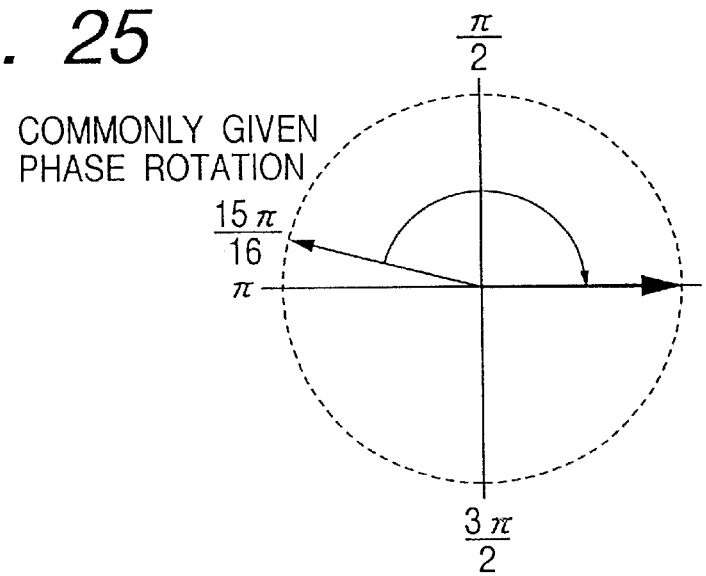
FIG. 25 illustrates the operation of the equalizer of FIG. 24.

To eliminate the phase distortion, the complex coefficient filters are connected to an equalizer shown in FIG. 24. In this case, since the elimination of signals is not carried out, no delay means is necessary and it is possible to merely return the phase. As for the phase equalization by the equalizer, as shown in FIG. 25, I-axis and Q-axis outputs $I_4$ and $Q_4$ of the equalizer with a rotation phase of $-15\pi/16$, are expressed as $$I_4=I_3 \cos(-15\pi/16)-Q_3 \sin(-15\pi/16) \quad (7)$$

$$Q_4=I_3 \sin(-15\pi/16)+Q_3 \cos(-15\pi/16) \quad (8)$$

By virtue of the configuration shown in FIG. 24, the phase correction is effected on the I-axis and the Q-axis signal information by subjecting the orthogonal axes to phase rotation.

Here, if Equations (1) through (6) are reviewed, it can be seen that there are only two kinds of calculation coefficients that are necessary for producing rotation. That is, if sine and cosine values of $\pi/8$ are respectively written as $\alpha$ and $\beta$, we have $$\sin \pi/8=\cos 3\pi/8=-\cos 5\pi/8=\sin 7\pi/8=0.38268=\alpha$$

$$\sin \pi/8=\cos 3\pi/8=-\cos 5\pi/8=\sin 7\pi/8=0.92388=\beta.$$

Accordingly, the absolute values of the coefficients in Equations (1) through (6) can be expressed by only the above two values. That is, the fact that all the coefficients of the filters can be expressed by the above two values is based on the fact that the differences in angular velocity of the respective channels are multiples of $\pi/8$. This advantage is also derived from the fact that the frequency offset of ½ of the channel interval frequency is provided between the center frequency of the desired wave after the frequency conversion and the sampling frequency.

In the above manner, it is possible to attenuate the two adjacent channels on each side of the desired wave. However,. pass bands are formed in frequency regions remote from the desired wave, which are folded frequency regions peculiar to image-rejecting filters.

Specific Example of Lowpass Filter

Figure 26:
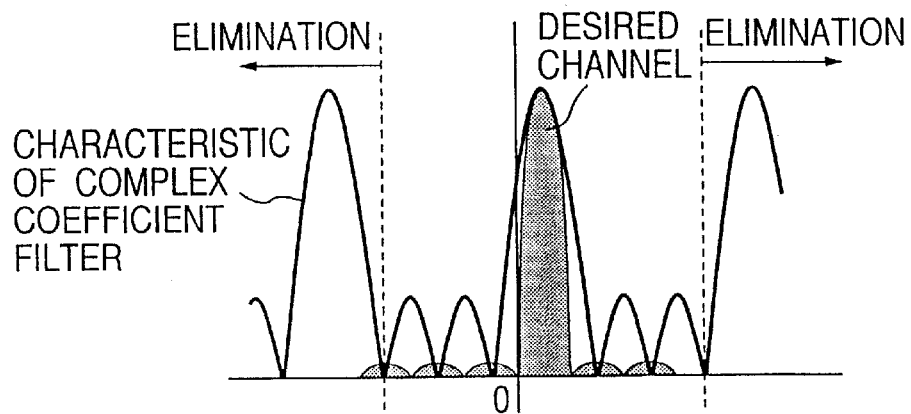
FIG. 26 illustrates how the filtering function declines in high-frequency bands in the output of the group of complex coefficient filters, and also illustrates portions of the filter characteristic to be eliminated by a lowpass filter.

In the invention, a lowpass filter is formed at the last stage by using delay means, to eliminate the above-mentioned undesired high-frequency signals with a simple configuration. FIG. 26 shows positions on the frequency axis of the undesired signals to be eliminated, and FIG. 27 shows a configuration of a lowpass filter.

Figure 27:
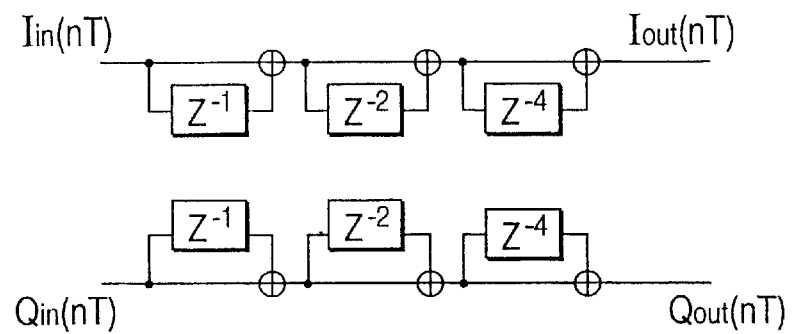
FIG. 27 shows a configuration of a delay element-type lowpass filter.
Figure 28:
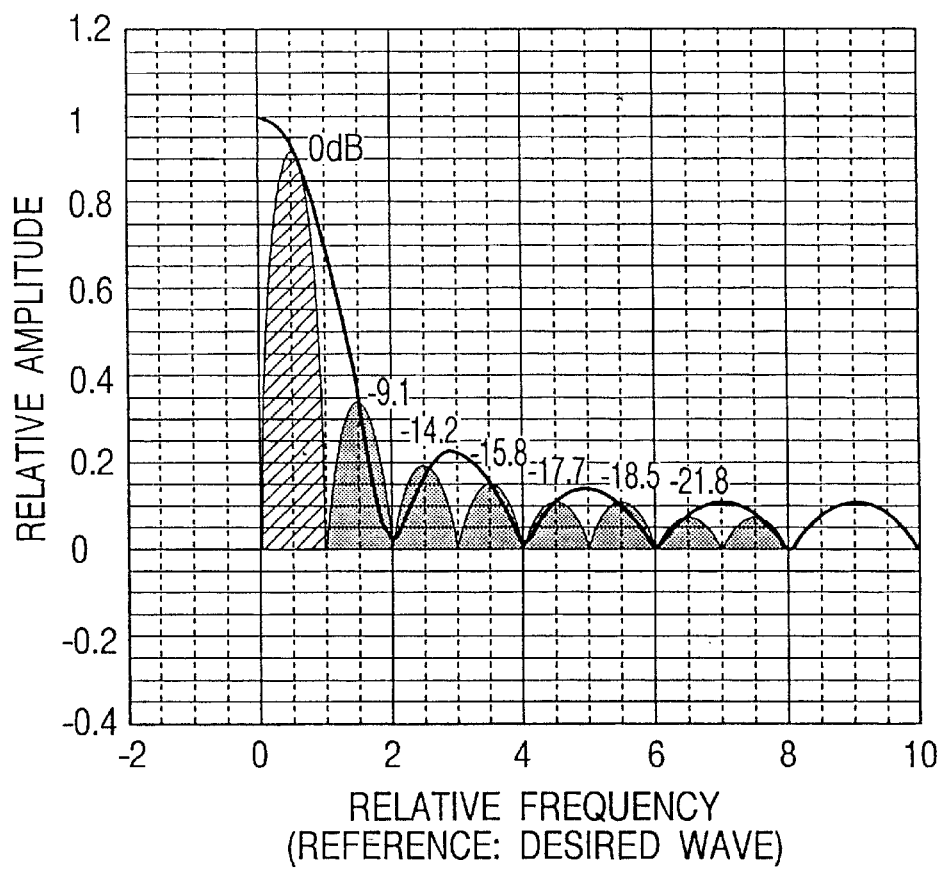
FIG. 28 shows a characteristic of the delay element-type lowpass filter of FIG. 27 and a positional relationship between respective channel waves.

According to the configuration of FIG. 27, since each delay element has an integration function which is determined by the delay time, the filter exhibits an impeding function with respect to the basic frequency corresponding to the delay time as the basic period, as well as its two-fold wave and four-fold wave. This theoretical characteristic is shown in FIG. 28. The negative-frequency-side characteristic is symmetrical to the positive-frequency-side one.

Specific Example of Image-Rejecting Frequency Conversion Circuit

Figure 31:
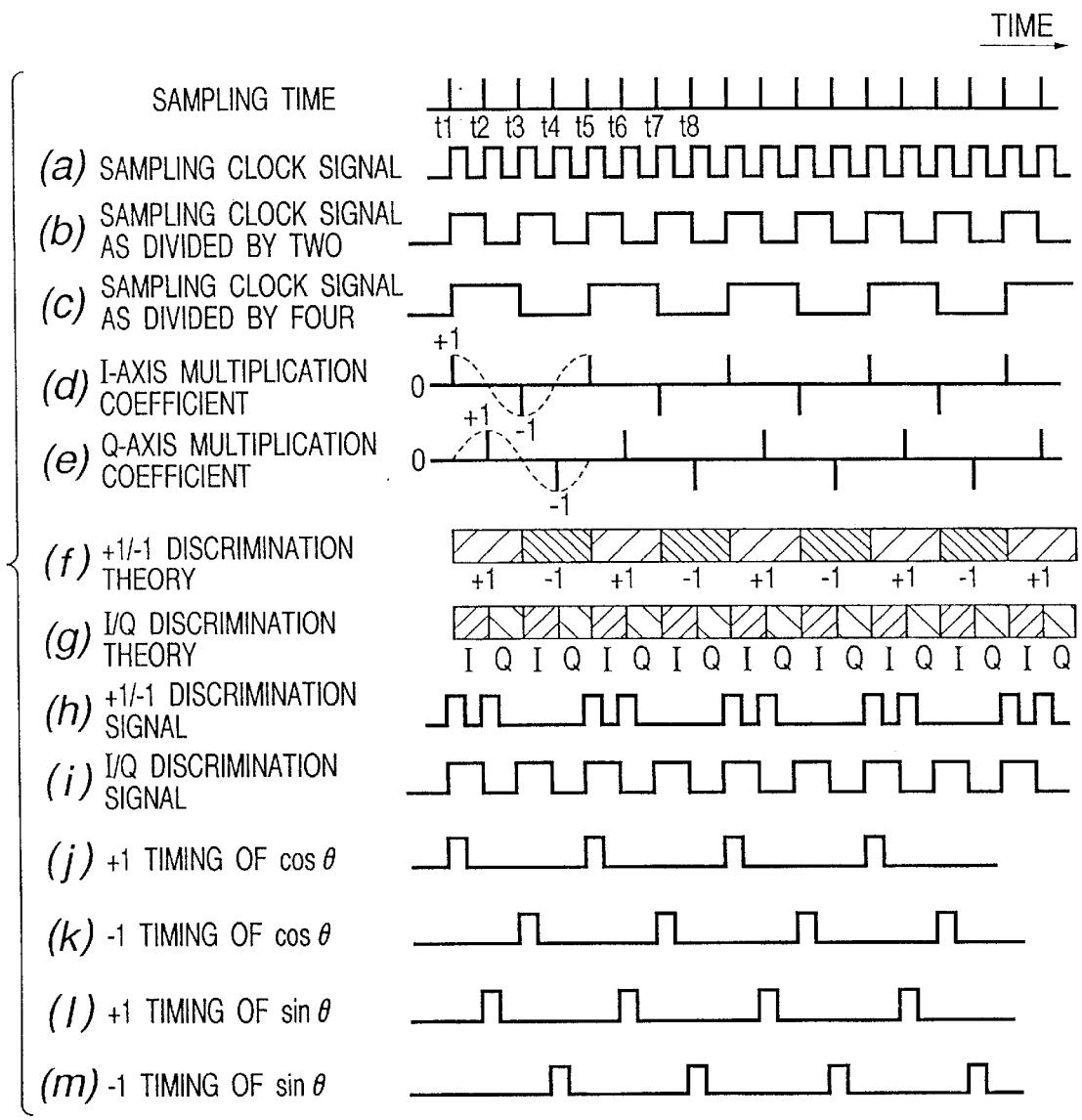
FIG. 31 is an operation timing chart of the image-rejecting frequency conversion circuit.

FIGS. 29(*a*) and 29(*b*) show a specific example of an image-rejecting frequency conversion circuit which is used in FIGS. 7, 9, 12, and 13. FIG. 31 shows its operating timing.

The frequency conversion can be expressed by using complex numbers, as shown below. In a case of combining angular modulation $\phi \cos \omega_0$ having a center angular frequency $\omega_c$ and an angular frequency $\omega_0$ to be added thereto, we have $$\cos((\omega_c + \omega_0)t + \phi\cos\omega_0 t) + j\sin((\omega_c + \omega_0)t + \phi\cos\omega t) = \quad (9)$$
$$\cos(\omega_c t + \phi\cos\omega_0 t)\cos\omega_0 t - \sin(\omega_c t + \phi\cos\omega_0 t)\sin\omega_0 t +$$
$$j\{\sin(\omega_c t + \phi\cos\omega_0 t)\cos\omega_0 t + \cos(\omega_c t + \phi\cos\omega_0 t)\sin\omega_0 t\}.$$

Since it is necessary to lower the center frequency to the DC region in the case of the desired wave, $-\omega_0$ is substituted into $\omega_c$ in Equation (9) to obtain $$\cos((\omega_0 t + \phi\cos\omega_0 t) - \omega_0 t) + j\sin((\omega_0 t + \phi\cos\omega_0 t) - \omega_0 t) =$$
$$\cos(\omega_0 t + \phi\cos\omega_0 t)\cos\omega_0 t + \sin(\omega_0 t + \phi\cos\omega_0 t)\sin\omega_0 t +$$
$$j\{\sin(\omega_0 t + \phi\cos\omega_0 t)\cos\omega_0 t - \cos(\omega_0 t + \phi\cos\omega_0 t)\sin\omega_0 t\}.$$

Assuming $\phi \cos \omega_0 t < \pi/2$, $$\cos((\omega_0 t + \phi\cos\omega_0 t) - \omega_0 t) + j\sin((\omega_0 t + \phi\cos\omega_0 t) - \omega_0 t) =$$
$$\cos(\omega_0 t + \phi)\cos\omega_0 t + \sin(\omega_0 t + \phi)\sin\omega_0 t +$$
$$j\{\sin(\omega_0 t + \phi)\cos\omega_0 t - \cos(\omega_0 t + \phi)\sin\omega_0 t\}.$$

The respective cosine and sine terms satisfy the sampling theorem if the sampling frequency is $2\omega_0$. Therefore, sampling may be performed at four sampling points per one period where the phase value of a signal of the angular frequency $\omega_0$ is an integer multiple of $\pi/2$.

FIGS. 31(d) and 31(e) show a case where $\cos \omega_0 t$ and $\sin \omega_0 t$ are sampled at a rate of four samples per one period as mentioned above. The term $\sin \omega_0 t$ becomes 0 at time points $n\pi$, while the term $\cos \omega_0 t$ becomes 0 at time points when the phase is delayed by $\pi/2$ therefrom. Accordingly, non-zero sampled values occur at only two positions in one period, as shown in FIGS. 31(d) and 31(e).

Since the frequency conversion is determined by multiplication as described above, $\cos \omega_0 t$ and $\sin \omega_0 t$ can be ignored at phases that make them zero. Consequently, the multiplication by $\cos \omega_0 t$ or $\sin \omega_0 t$ can be regarded as multiplication by +1 or −1. Therefore, multiplication can be effected only by managing the polarity. Signals of FIGS. 31(j) to 31(m) show time points when $\cos \omega_0 t$ or $\sin \omega_0 t$ becomes +1 or −1, as well as serve as gate signals for selecting In(nT) and Qi(nT) of the positive polarity and −In(nT) or −Qi(nT) of the negative polarity, which are signals obtained by multiplying sampled signals In(nT) or Qi(nT) by +1 or −1.

All of the control signals shown in FIG. 31 are controlled by a clock signal. These control signals can apparently be generated by a circuit very similar to the control circuit shown in FIG. 17. Since such a circuit can be constructed by standard logical circuits, a specific example of such a circuit will not be presented.

Figure 29A:
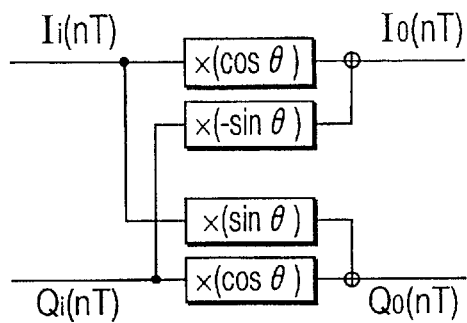
FIG. 29 shows a configuration of an image-rejecting frequency conversion circuit.
Figure 29B:
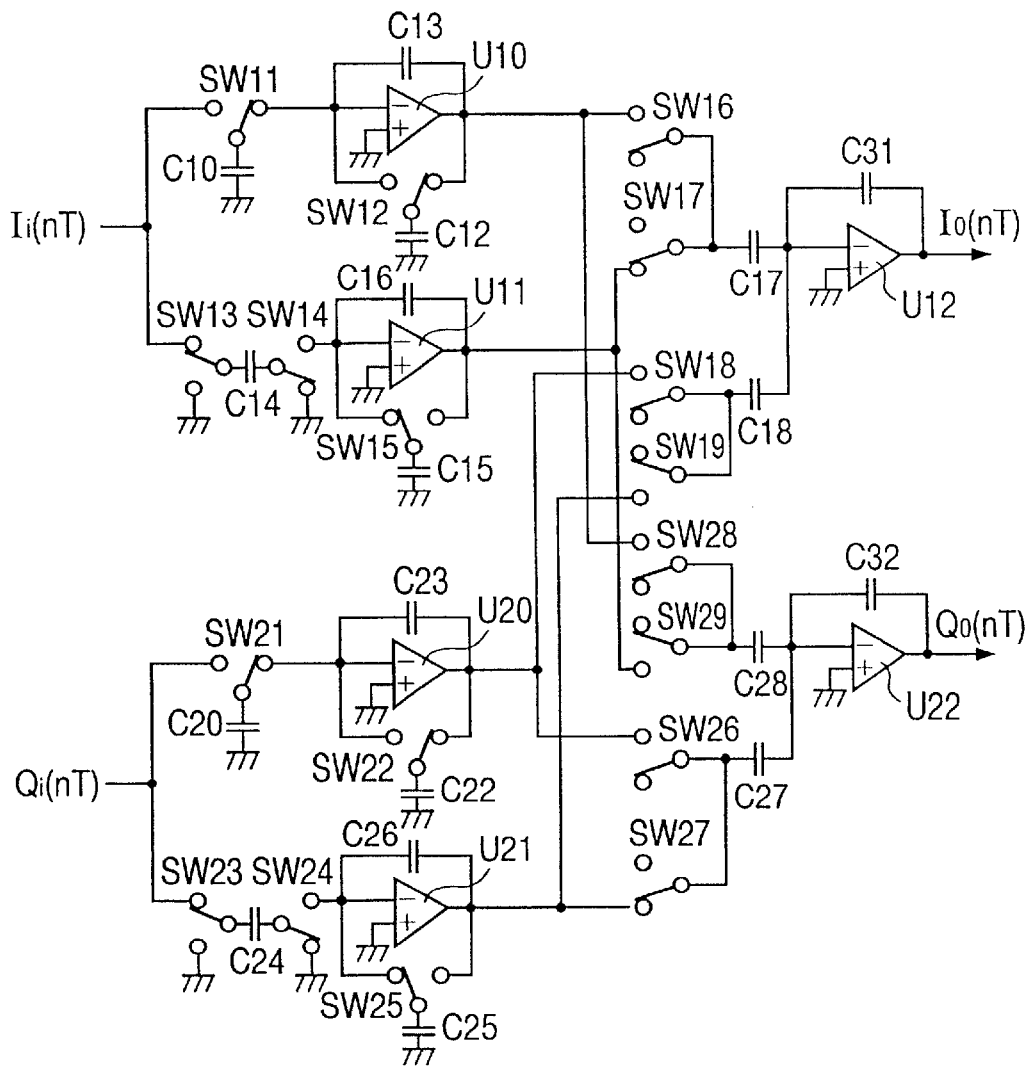

In the circuit diagram shown in FIG. 29(b), an amplifier U10 performs, with a switch SW11 and a capacitor C10, the same function as the inverted amplifier U1 shown in FIG. 17, and constitutes a buffer amplifier maintaining the polarity of the input signal. In exactly the same manner, an amplifier U20 constitutes a buffer amplifier maintaining the polarity of the input signal. An amplifier U11 performs the same function as the inverted amplifier U2 shown in FIG. 17, and constitutes an inverted amplifier for generating an output signal whose polarity is inverted from that of the input signal. The same thing applies to an amplifier U21.

Each of amplifiers U12 and U22 constitutes a polarity-inverting multiplier/adder circuit which receives signals from a plurality of capacitors C17 and C28 or C18 and C27. Its multiplication gain is determined by a ratio of an input-side capacitance C17, C28, C18, or C27 to a feedback capacitance C31 or C32. Switches SW11 to SW15 and switches SW21 to SW25 operate being controlled by signals shown in FIGS. 31(a), 31(b), and 31(c) or their inverted signals which are generated in synchronism with the clock signal a so that the amplifiers U11, U12, U21, and U22 generate In(nT) or Qi(nT) of the positive polarity and −In(nT) or −Qi(nT) of the negative polarity upon receiving the input signal Ii(nT) or Qi(nT). Switches SW16 to SW19 select from In(nT) and Qi(nT) of the positive polarity and −In(nT) and −Qi(nT) of the negative polarity, transmit it to the adder circuit including the amplifier U12, and controls its output Io(nT). Signals for controlling the switches SW16 to SW19 are the signals shown in FIGS. 31(j)–31(m) or their inverted signals.

Now, at time t1, only the cosine is made +1 by timing control j shown in FIG. 31(j), and the switch SW17 passes −Ii(nT) and supplies it to the polarity-inverting multiplier/adder circuit U12, so that Ii(nT) appears at its output Io(nT).

At time t2, only the sine is made +1 by timing control shown in FIG. 31(l), and the switch SW18 passes −Qi(nT) and supplies it to the polarity-inverting multiplier/adder circuit U12, so that Qi(nT) appears at its output Io(nT).

At time t3, only the cosine is made −1 by timing control shown in FIG. 31(k), and the switch SW16 passes +Ii(nT) and supplies it to the polarity-inverting multiplier/adder circuit U12, so that −Ii(nT) appears at its output Io(nT).

At time t4, only the sine is made −1 by timing control shown in FIG. 31(m), and the switch SW19 passes +Qi(nT) and supplies it to the polarity-inverting multiplier/adder circuit U12, so that −Qi(nT) appears at its output Io(nT).

Similarly, on the Qo((nT) terminal side, at time t1, only the cosine is +1 by the timing control shown in FIG. 31(j), and the switch SW27 passes −Qi(nT) and supplies it to the polarity-inverting multiplier/adder circuit U22, so that Qi(nT) appears at its output Qo(nT).

At time t2, only the sine is made +1 by timing control shown in FIG. 31(l), and the switch SW28 passes −Ii(nT) and supplies it to the polarity-inverting multiplier/adder circuit 22, so that Ii(nT) appears at its output Qo(nT).

At time t3, only the cosine is made −1 by the timing control shown in FIG. 31(k), and the switch SW26 passes +Ii(nT) and supplies it to the polarity-inverting multiplier/adder circuit U22, so that −Qi(nT) appears at its output Qo(nT).

At time t4, only the sine is made −1 by the timing control shown in FIG. 31(m), and the switch SW29 passes +Ii(nT) and supplies it to the polarity-inverting multiplier/adder circuit U22, so that −Ii(nT) appears at its output Qo(nT).

Thereafter, the same circuit changeover control as in the period from t1 to t4 is performed every four-clock period, and the calculations of the above-described Equations (7) and (8) are executed in accordance with the basic principle shown in FIG. 29(a).

As described above, the image-rejecting frequency conversion circuit can be implemented by using switched-capacitor circuits.

Figure 30:
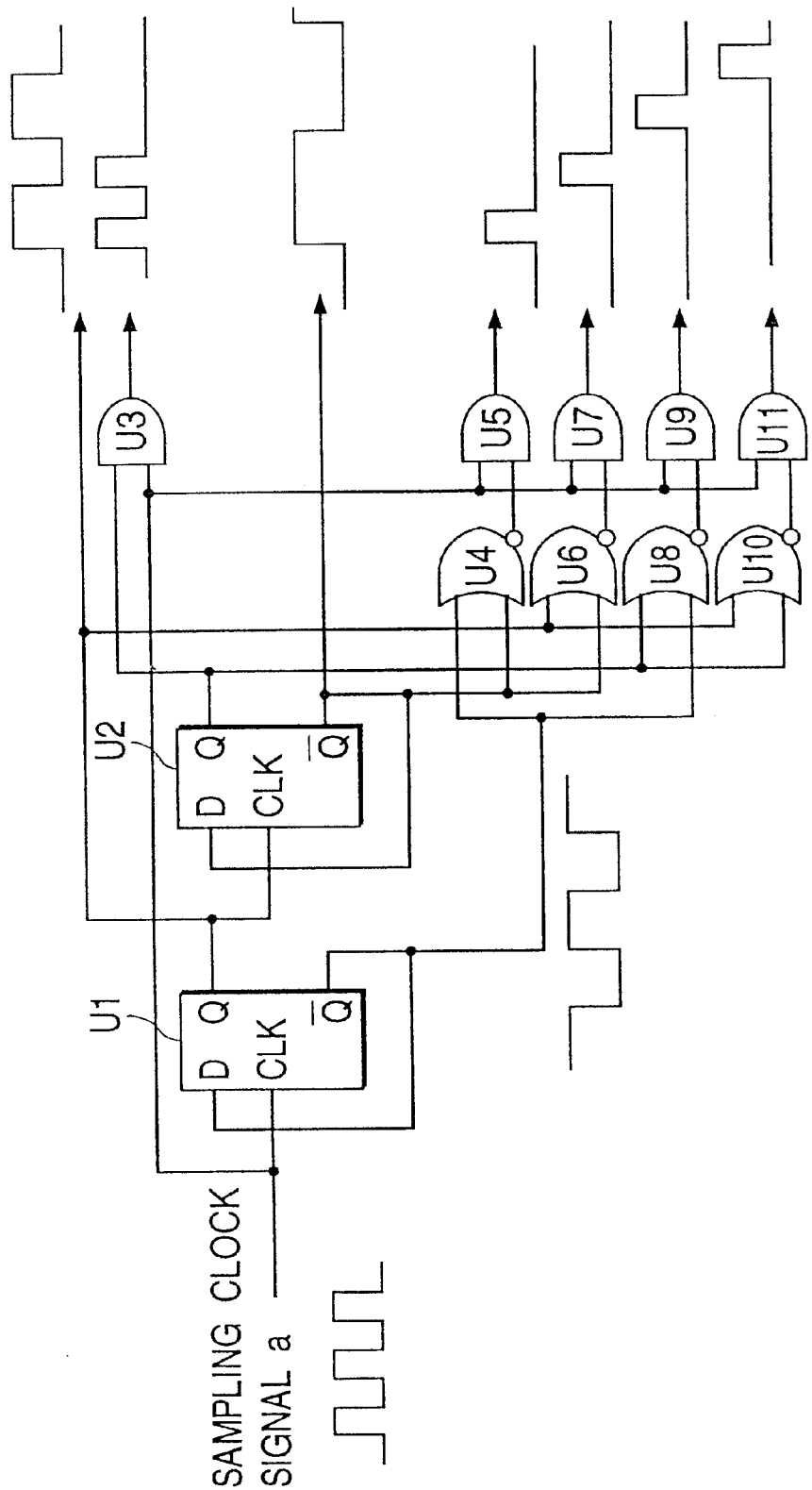
FIG. 30 shows an example of a circuit for controlling the image-rejecting frequency conversion circuit of FIGS. 29(a) and 29(b)

FIG. 30 shows an example of a circuit for controlling the image-rejecting frequency conversion circuit 26 shown in FIGS. 29(a) and 29(b). This circuit is comprised of the following: a first D-type flip-flop U1 for receiving a sampling clock signal a at its clock input terminal CLK; a second D-type flip-flop U2 for receiving a Q output therefrom at its clock input terminal CLK; a first AND circuit U3 for receiving as its inputs the Q output of the first D-type flip-flop U1 and the sampling clock signal a; a first OR circuit U4 for receiving as its inputs a $\overline{Q}$ output of the first D-type flip-flop U1 and a $\overline{Q}$ output of the second D-type flip-flop U2; a second OR circuit U6 for receiving as its inputs the Q output of the first D-type flip-flop U1 and the $\overline{Q}$ output of the second D-type flip-flop U2; a third OR circuit U8 for receiving as its inputs the $\overline{Q}$ output of the first D-type flip-flop U1 and the Q output of the second D-type flip-flop U2; a fourth OR circuit U10 for receiving as its inputs the Q output of the first D-type flip-flop U1 and the Q output of the second D-type flip-flop U2; a second AND circuit U5 for receiving as its inputs a negative logic output of the first OR circuit U4 and the sampling clock signal a; a third AND circuit U7 for receiving as its inputs a negative logic output of the second OR circuit U6 and the sampling clock signal a; a fourth AND circuit U9 for receiving as its inputs a negative logic output of the third OR circuit U8 and the sampling clock signal a; and a fifth AND circuit U11 for receiving as its inputs a negative logic output of the fourth OR circuit U10 and the sampling clock signal a.

Referring to FIG. 30, a description will be given of the operation. The sampling clock signal a is supplied to the clock input CLK of the first D-type flip-flop U1, from which a frequency-divided output Q and a negative logic output $\overline{Q}$ are obtained. Its Q output is supplied to the clock input CLK of the second D-type flip-flop U2, from which a frequency-divided Q and a negative logic output $\overline{Q}$ are obtained. Consequently, a divided-by-four signal of the sampling clock signal a is obtained at the output Q and the negative logic output $\overline{Q}$ of the second D-type flip-flop U2. Hence, the sampling clock signal a and the Q output of the first D-type flip-flop U2 are supplied to the first AND circuit U3, and its output is set to the high potential "H" only during the period of two clock pulses when the Q output is at the high potential "H." Supplied to the second AND circuit U5 are the sampling clock signal a and the negative logic output of the first OR circuit U4 which received as its inputs the divided-by-two frequency signal of the sampling clock signal a from the $\overline{Q}$ output of the first D-type flip-flop U1 and a divided-by-four frequency signal of the sampling clock signal a from the $\overline{Q}$ output of the second D-type flip-flop U2, with the result that the output of the second AND circuit U5 is set to the high potential "H" during the first clock period of the four sampling clock period. Similarly, supplied to the third AND circuit U7 are the sampling clock signal a and the negative logic output of the second OR circuit U6 which received as its inputs the divided-by-two frequency signal of the sampling clock signal a from the Q output of the first D-type flip-flop U1 and a divided-by-four frequency signal of the sampling clock signal a from the $\overline{Q}$ output of the second D-type flip-flop U2, with the result that the output of the second AND circuit U5 is set to the high potential "H" during the second clock period of the four sampling clock period. Supplied to the fourth AND circuit U9 are the sampling clock signal a and the negative logic output of the third OR circuit U8 which received as its inputs the divided-by-two frequency signal of the sampling clock signal a from the $\overline{Q}$ output of the first D-type flip-flop U1 and a divided-by-four frequency signal of the sampling clock signal a from the Q output of the second D-type flip-flop U2, with the result that the output of the second AND circuit US is set to the high potential "H" during the third clock period of the four sampling clock period. Supplied to the fifth AND circuit U1 are the sampling clock signal a and the negative logic output of the fourth OR circuit U10 which received as its inputs the divided-by-two frequency signal of the sampling clock signal a from the Q output of the first D-type flip-flop U1 and a divided-by-four frequency signal of the sampling clock signal a from the Q output of the second D-type flip-flop U2, with the result that the output of the second AND circuit US is set to the high potential "H" during the fourth clock period of the four sampling clock period.

It is apparent from the foregoing that, by virtue of the above-described control circuit, as for the respective timing waveforms in the operation timing chart of the specific example of the image-rejecting frequency conversion circuit shown in FIG. 31, the output signal of the first AND circuit U3 of the above-described control circuit corresponds to the +1/−1 discrimination signal shown in FIG. 31(h). Similarly, the Q output signal of the first D-type flip-flop U1 of the above-described control circuit corresponds to the I/Q discrimination signal shown in FIG. 31(i). The output signal of the second AND circuit U5 of the above-described circuit corresponds to the +1 timing waveform of cos θ shown in FIG. 31(j). The output signal of the third AND circuit U7 of the above-described circuit corresponds to the −1 timing waveform of cos θ shown in FIG. 31(k). The output signal of the fourth AND circuit U9 of the above-described circuit corresponds to the +1 timing waveform of sin θ shown in FIG. 31(l). The output signal of the fifth AND circuit U11 of the above-described circuit corresponds to the −1 timing waveform of cos θ shown in FIG. 31(m). Accordingly, it is apparent that the image-rejecting frequency conversion can be attained by the configuration of the image-rejecting frequency conversion circuit 26 shown in FIGS. 29(a) and 29(b) and the control circuit shown in FIG. 30.

Specific Examples of Some Functional Elements Using Switched-Capacitor Circuits

FIGS. 32(a)–32(d) show a specific example of a complex coefficient filter. In FIGS. 32(a)–32(d), a delaying device, an inverter, and a multiplying adder, which are basic elements constituting the complex coefficient filter, are realized by switched-capacitor circuits.

Figure 32A:
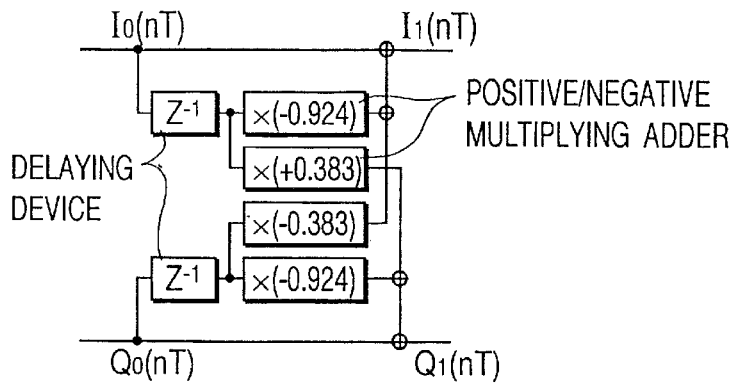
FIGS. 32(a)–32(d) shows how a filter is implemented by using switched-capacitor circuits.
Figure 32B:
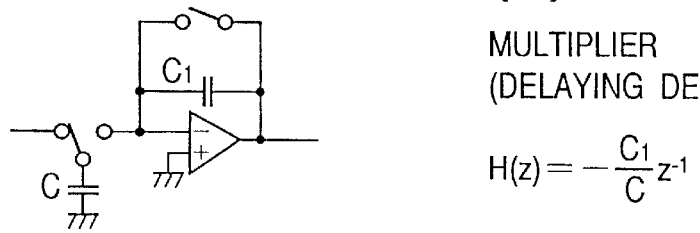
Figure 32C:
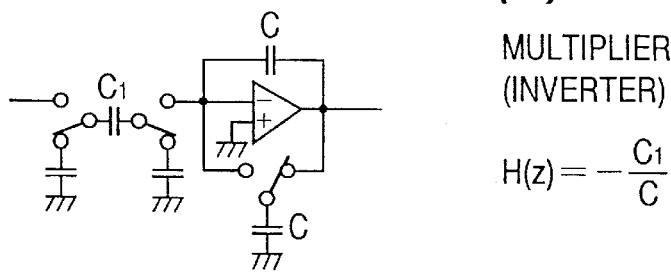
Figure 32D:
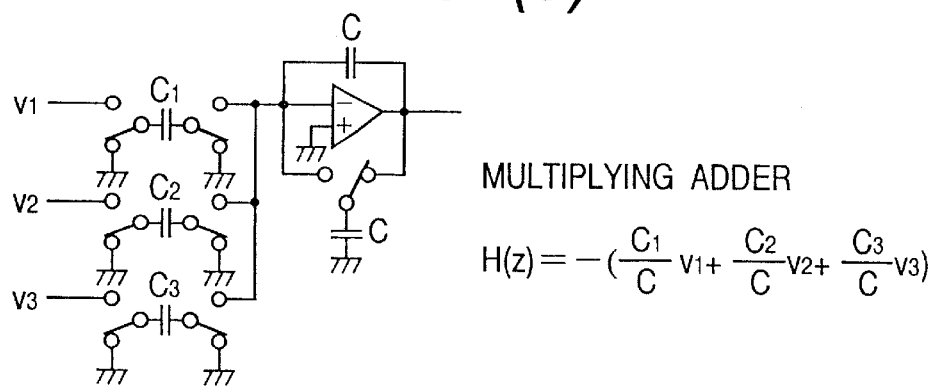

As for the operation principle of the switched-capacitor circuit, the description of the operation which was given in describing the orthogonal-component separating circuits of FIG. 17 can be used without substantial alteration, and hence a description thereof will be omitted. Circuit elements of the switched-capacitor circuits for forming the complex coefficient filter are shown in FIGS. 32(b), 32(c), and 32(d). Delaying devices, positive-number multipliers, negative-number multipliers, and adders are required to realize the complex coefficient filter, as shown in FIG. 32(a).

FIG. 32(b) shows a delaying device using a switched-capacitor circuit. A multiplying function can be provided by capacitors. A multiplication formula is shown in the drawing.

A negative-number multiplier is shown in FIG. 32(c). A multiplying adder is shown in FIG. 32(d). When effecting a multiplication of a positive number, two negative-number multipliers are cascaded.

Figure 33:
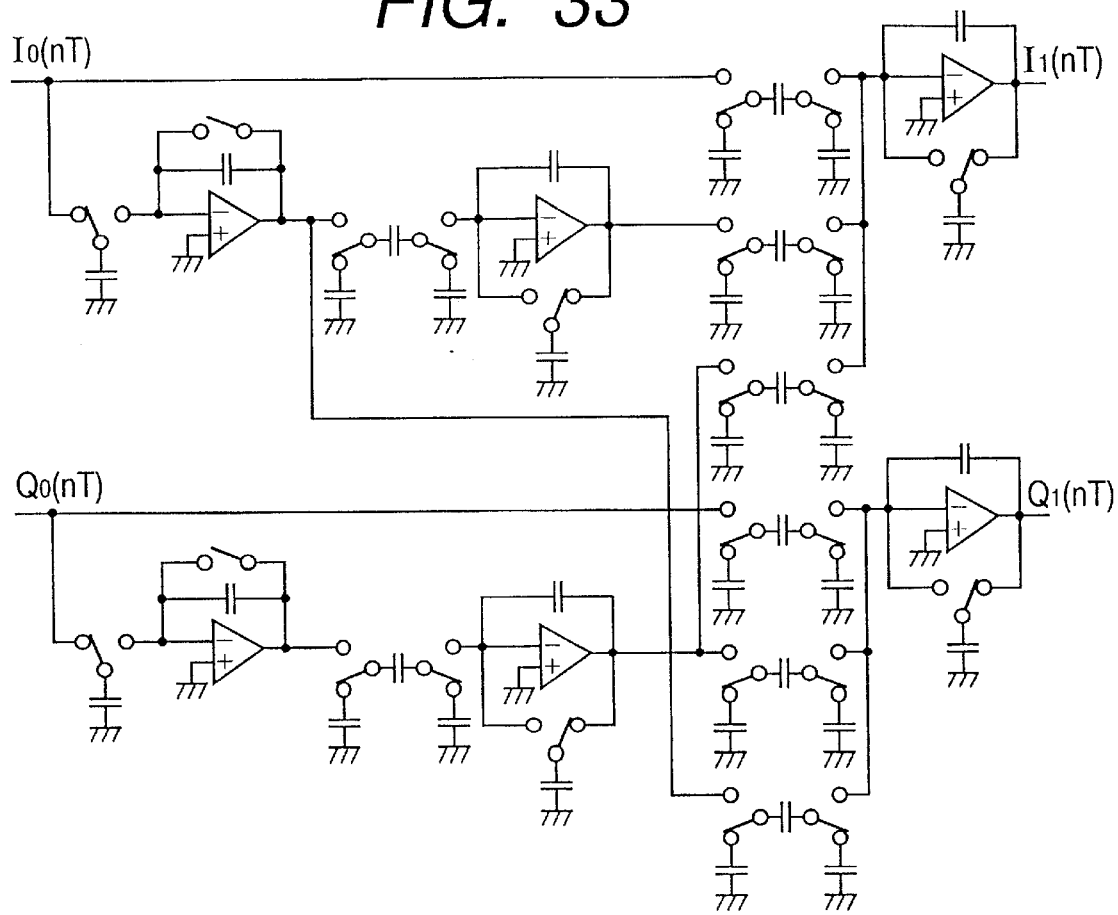
FIG. 33 shows an implementation of one stage of a complex coefficient filter by use of switched-capacitor circuits.
Figure 34:
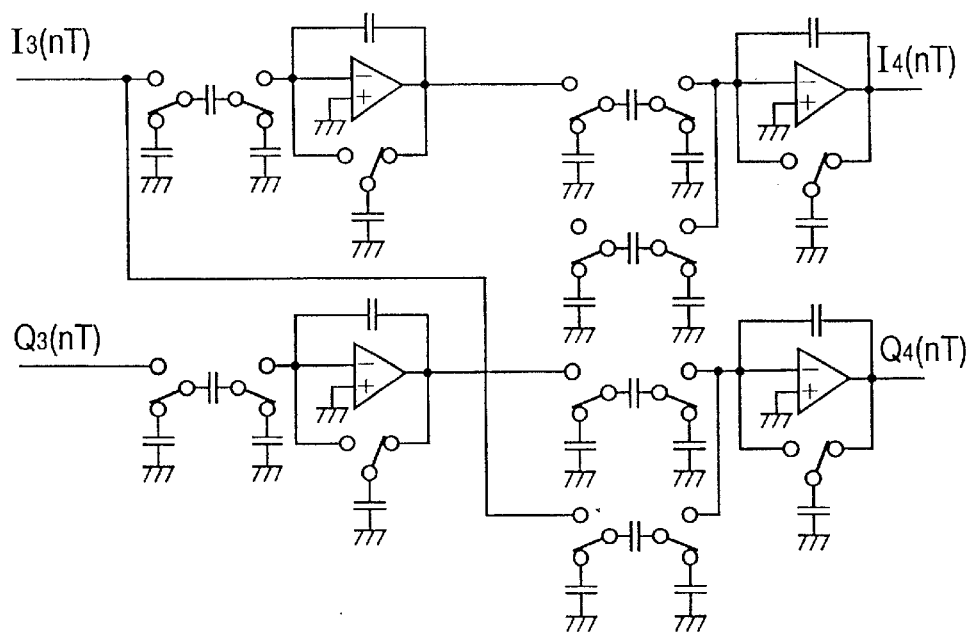
FIG. 34 shows an implementation of a phase equalizer by use of switched-capacitor circuits.

A specific example of one stage of the complex coefficient filter using the switched-capacitor circuits of the aforementioned elements is shown in FIG. 33. Similarly, a specific example of a phase equalizer using switched-capacitor circuits is shown in FIG. 34.

Figure 35:
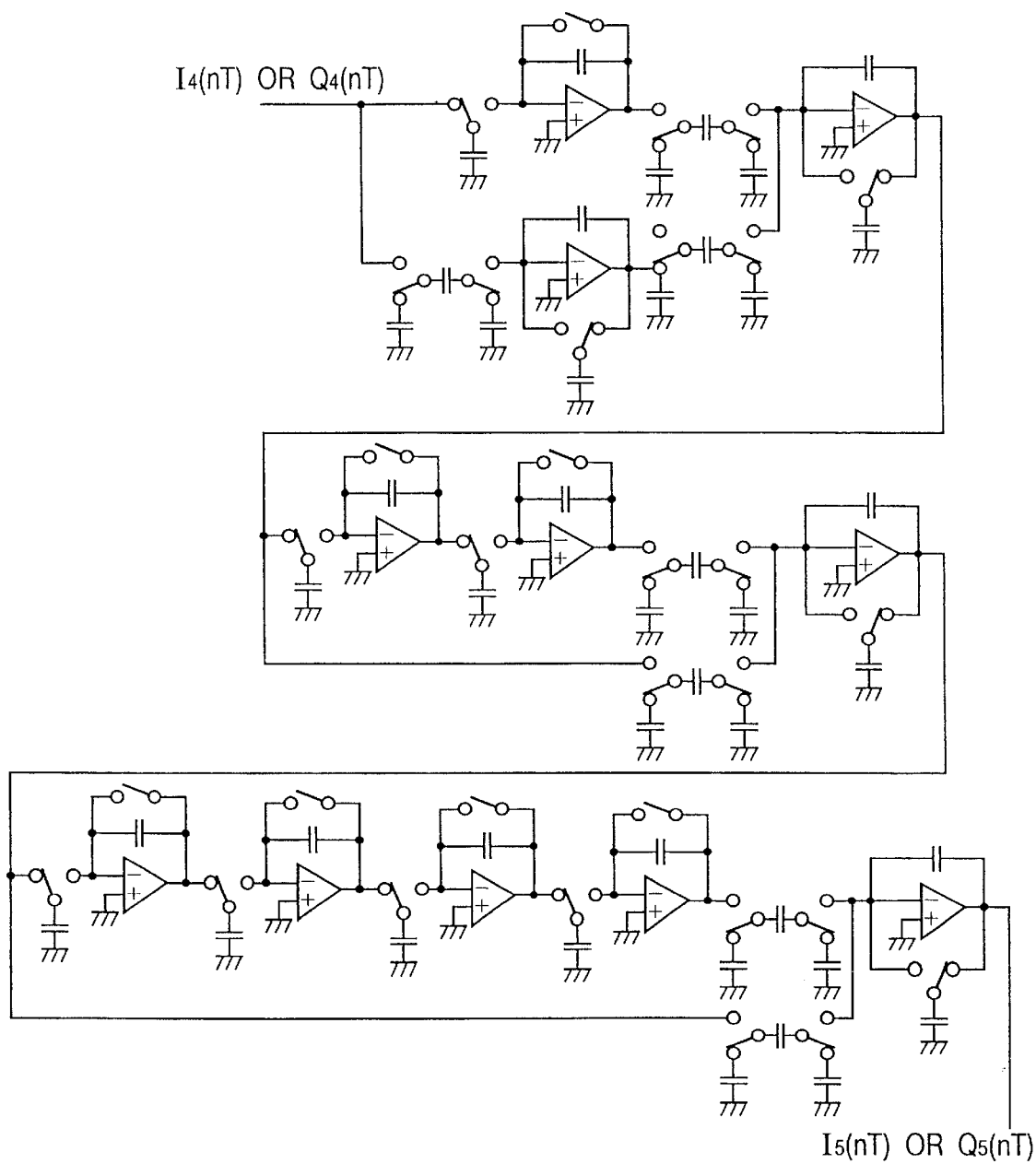
FIG. 35 shows an implementation of a lowpass filter by use of switched-capacitor circuits.

FIG. 35 shows a specific example of a lowpass filter using switched-capacitor circuits. In FIG. 35, lowpass filters having the same configuration are used for the I-axis and the Q-axis. All the operation is controlled by a clock signal.

The power consumption in a switched-capacitor circuit is proportional to the transfer clock rate and the electrostatic capacitance involved, and is proportional to the square of the amplitude of a signal to be handled. If a switched-capacitor circuit is configured by low-noise devices formed of, for example, a compound semiconductor such as GaAs, a sufficiently large S/N ratio can be obtained even with a small signal amplitude and hence it becomes unnecessary to secure large amplitudes. Hence, even if an intermediate frequency signal has a high frequency, the power consumption drops to a level far lower than in processing by a conventional digital circuit.

Figure 36:
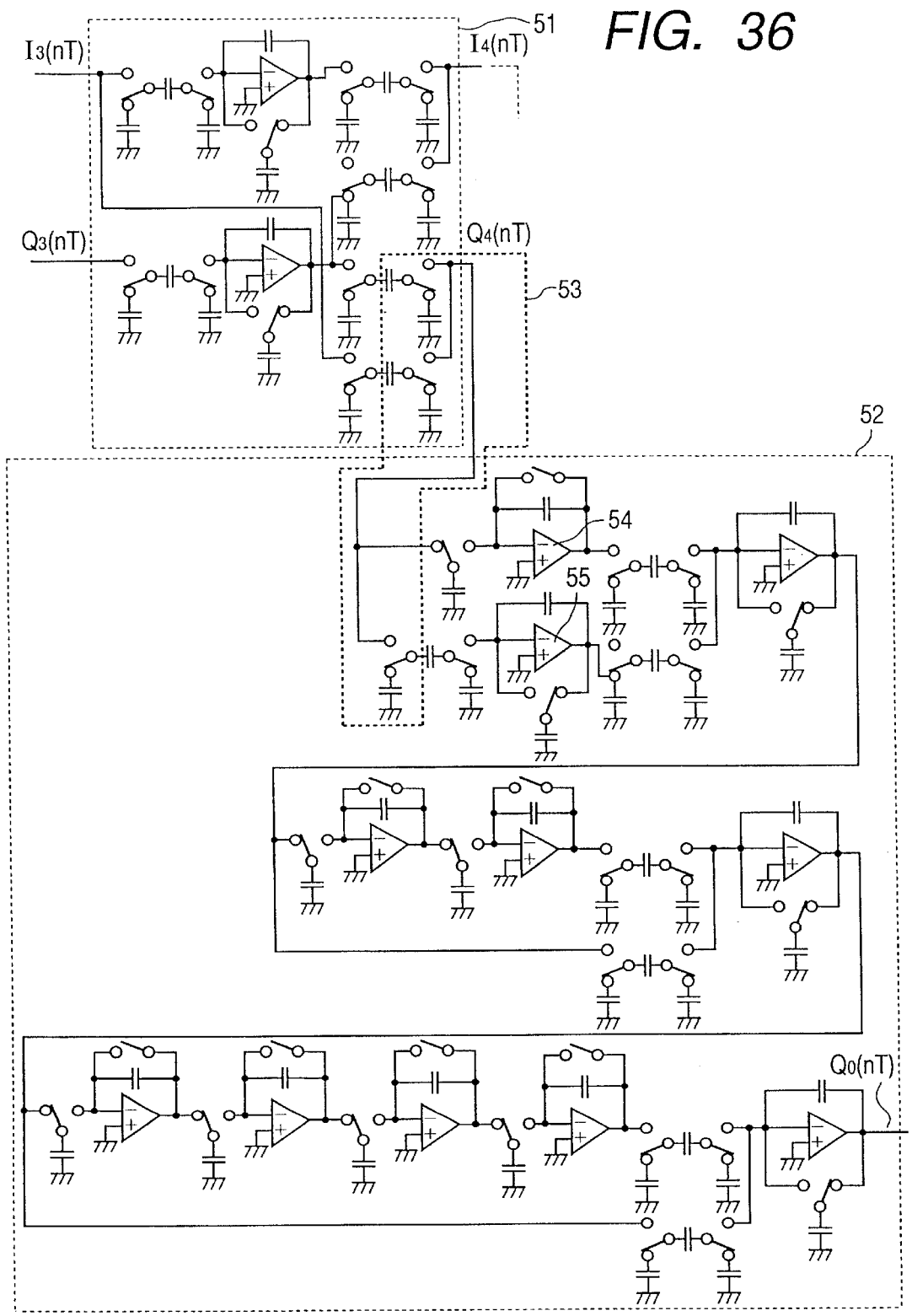
FIG. 36 shows an example of a circuit of an equalizer and a lowpass filter in which an attempt is made to reduce power consumption by using operational amplifiers in common.

FIG. 36 shows a specific example in which an equalizer and a lowpass filter both using switched-capacitor circuits are formed integrally. In principle, a switched-capacitor circuit has an operational amplifier in each stage, and the operational amplifier constitutes a large cause for increasing the power consumption in the switched-capacitor circuit. In FIG. 36, the number of operational amplifiers is reduced by using in common operational amplifiers on the equalizer side and those on the lowpass filter side. Basically, orthogonal components from the equalizer 51 may be connected independently to a lowpass filter 52. However, in FIG. 36, to omit operational amplifiers in the vicinity of the output of the equalizer 51 which would otherwise be placed within the thick-line frame in FIG. 36, connections are made in such a manner as to supply both orthogonal components to an operational amplifier 54 and an operational amplifier 55 in the vicinity of the input of the lowpass filter 52. Incidentally, FIG. 36 shows only the Q-axis side, but it is also possible to commonly use operational amplifiers on the I-axis side in exactly the same manner.

To further reduce the power consumption of a radio receiving apparatus, there may occur a case where the filter design using the switched capacitor circuits shown in FIGS. 33–36 is insufficient. This is because, as is apparent from FIGS. 33–36, there are too many power-consuming active elements, amplifiers in particular.

Specific Example of Functional Elements Using CCD Circuits

Figure 37A:
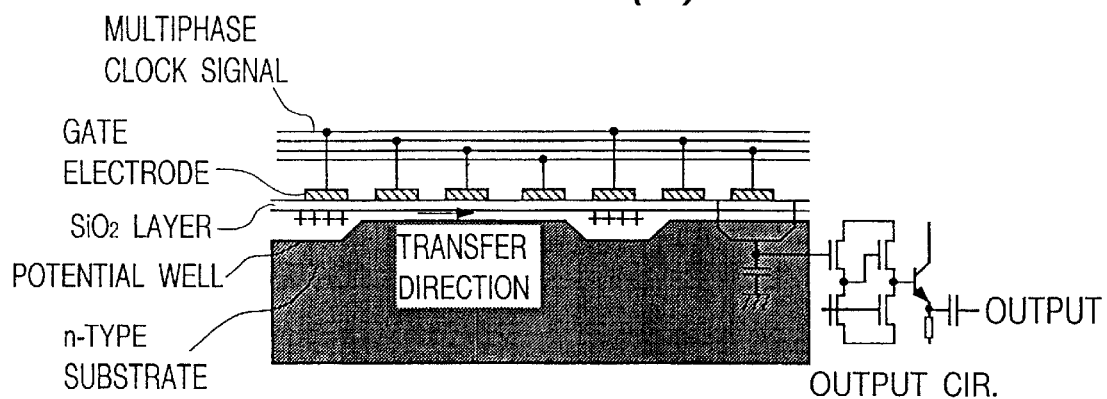
FIGS. 37(a) and 37(b) show an equalizer and a lowpass filter by use of CCDs.
Figure 37B:
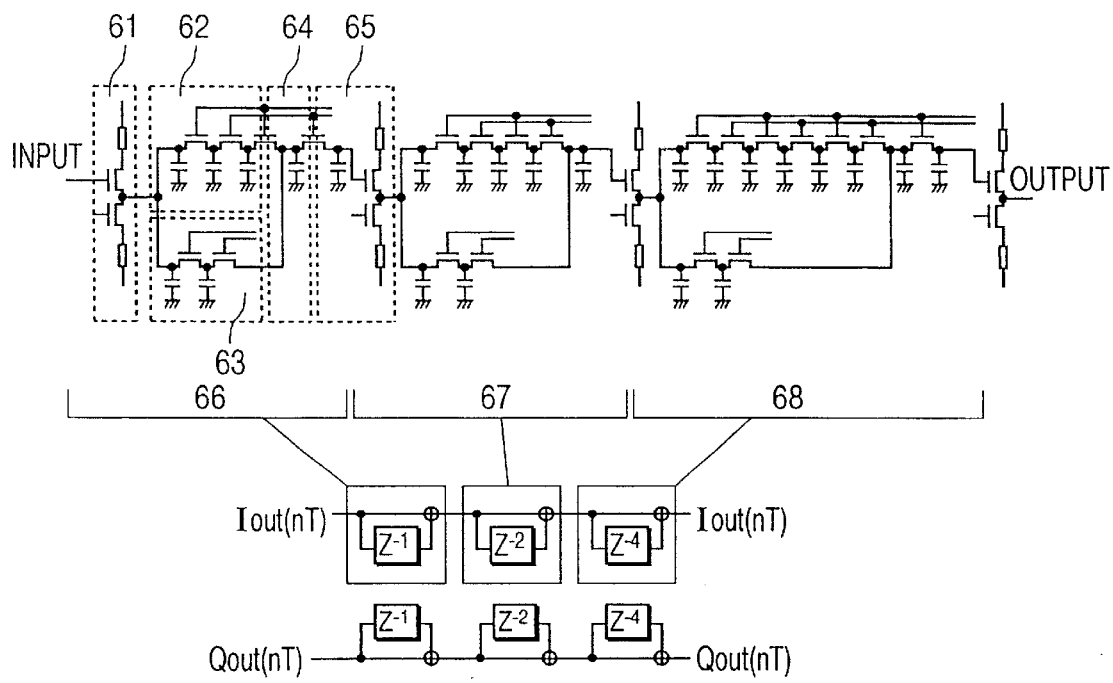
Figure 38:
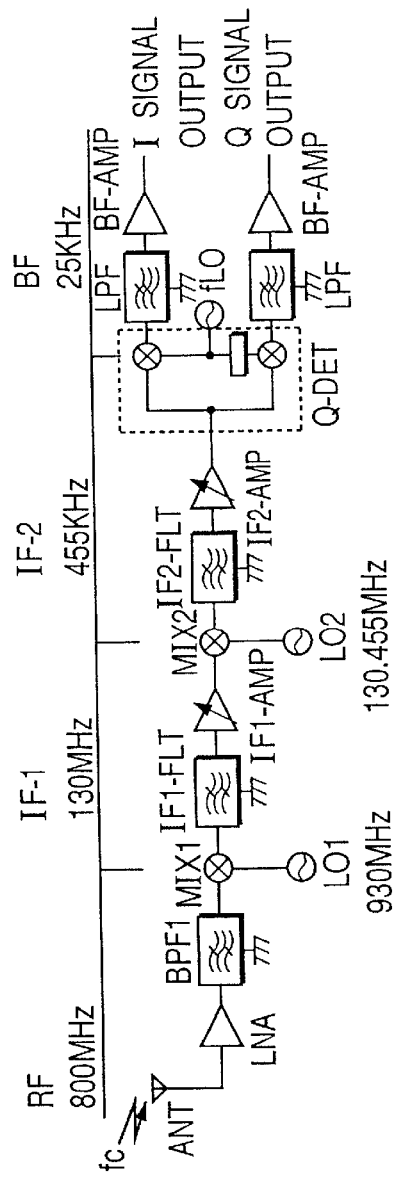
FIG. 38 shows the configuration of a conventional radio receiving apparatus.
Figure 39:
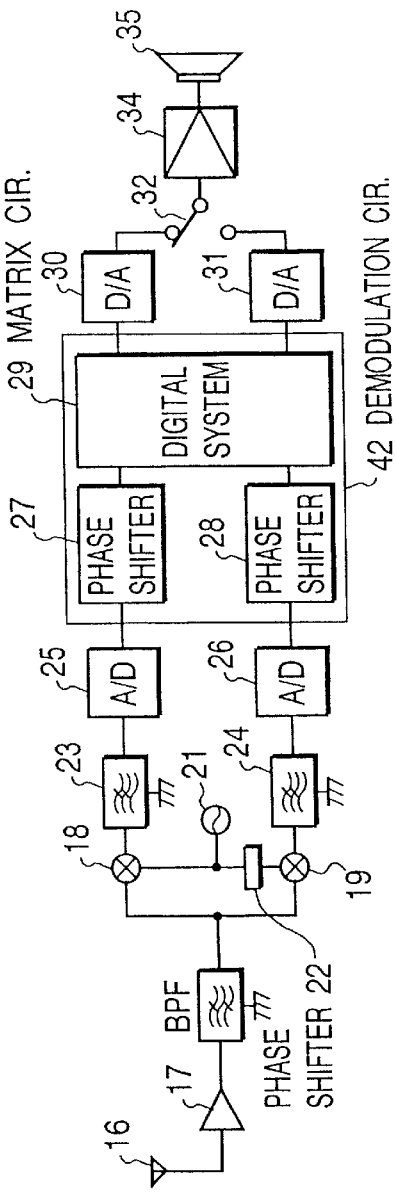
FIG. 39 shows an example of a conventional direct-conversion receiving apparatus.

FIGS. 37(a) and 37(b) show a specific implementation of the invention in which a sampling output is fed to a filter configured by CCD circuits. FIG. 37(a) shows the structure of a CCD. The CCD is configured such that potential wells for charge can be formed between an n-type substrate and an $SiO_2$ layer, to allow charge stored in a potential well to be transferred by means of the potential of a gate electrode provided outside the $SiO_2$ layer.

As is apparent from FIG. 37(a), in principle, no active elements exist in the charge-transfer direction. Since processing is effected by charge transfer, it is unnecessary to supply new charge for identical information. Accordingly, the power consumption is basically low in the CCD. Further, all the operation is controlled by clock signals applied to the gate electrodes. However, since it is unnecessary to have the clock signals pass through switching elements, so that switching noise and the like is small.

If a circuit is configured by low-noise devices, a sufficiently large S/N ratio can be obtained even if the signal amplitude is small, so that it becomes unnecessary to secure a large amplitude. Hence, the power consumption drops to a level far lower than in the case of a switched-capacitor circuit. The CCD is generally used for transfer of an image signal. For this reason, a signal is delivered to the final output only by use of inputted charge, as shown in FIG. 37(a).

To attain the object of the invention, there are needed functions of distribution of signals to the delay circuit sections, generation of a difference in delay, and combining of a non-delayed signal and a delayed signal. In view of noise resistance, it is not preferable to process signals to the end of processing only by use of inputted charge.

As shown in FIG. 37(b), a circuit for the aforementioned functions has been devised for this purpose. A description will be given of its details with respect to one stage of a lowpass filter. In FIG. 37(b), the gray thick-line frame indicates a basic configuration of one stage of a delay-type lowpass filter which is comprised of an input buffer stage 61, a delay-side CCD series 62, a non-delay-side CCD series 63, an addition CCD 64, and an input buffer stage 65 also serving as an output buffer. FIG. 37(b) shows a specific example of the first stage of the delay element-type lowpass filters shown in FIG. 27. In FIG. 37(b), this first stage is indicated by reference numeral 66 to provide correspondence. Similarly, reference numeral 67 denotes a lowpass filter stage provided with a delay difference of two stages, and reference numeral 68 denotes a lowpass filter stage provided with a delay difference of four stages.

In the first stage, the input buffer stage 61 is a buffer which is provided to supply charge equivalent to inputted charge to the ensuing delay-side CCD series 62 and the non-delay-side CCD series 63 by equal amounts, and charge whose amount is about two times the amount of the inputted charge is supplied from a power supply to the CCD series 62 and 63. As for the delay-side CCD series 62 and the nondelay-side CCD series 63, in a case where transmission loss can be ignored, the unit cell can have exactly the same configuration.

In the first stage, the length of the CCD series of the delay-side CCD series 62 is made one-cell longer than that of the non-delay-side CCD series 63. Since the addition CCD 64 receives charge from two systems, the potential wells are made wide so that the cells do not saturate. The same thing also applies to the input buffer stage 65 also serving as the output buffer. The function of an FET buffer of the buffer stage 65 is basically similar to that of the input buffer stage 61. From the above description, it is understood that the lowpass filter can be realized by advancing the CCD device technology.

With the above-described configurations, in the invention, there is only one intermediate frequency stage, and its output is sampled and held, i.e., digitized so that the subsequent signal processing can be performed by a digital circuit which can be readily implemented by an integrated circuit. Thus, the invention provides a solution to the first problem that the radio receiving apparatus requires numerous parts for assuring good reception channel selectivity.

In the invention, digitized signal processing is performed by using switched-capacitor circuits rather than digital logic circuits, whereby the signal amplitude is lowered and formation of integrated circuits is facilitated with the use of a smaller number of circuit elements. Hence, a solution is provided for the second problem that the existence of numerous parts, which is the aforementioned first problem, incurs a large power consumption.

In the invention, sampling for digitization is performed according to the band-limiting sampling scheme rather than the usual first-order sampling scheme, to thereby greatly lower the sampling clock frequency. Hence, a solution is provided for the third problem that digitized signal processing entails power consumption several times greater than analog processing.

In the invention, (1) by using a complex coefficient filter that adopts switched-capacitor circuits, the four rules of arithmetic can be performed at a low power consumption that is substantially the same as in the conventional case, and (2) the number of calculations can be reduced by providing a frequency offset corresponding to a channel interval frequency in down conversion to an intermediate frequency and by using the aforementioned complex coefficient filter. Hence, a solution is provided for the fourth problem that conventional digital filters involve complex calculations and their power consumption is therefore large.

In the invention, although a received signal is rendered into a discrete form by a sample-and-hold circuit, conversion into logical levels is not effected and digital signal processing is performed by using switched-capacitor circuits, to eliminate the need for enlarging the amplitude of an input signal. Hence, a solution is provided for the fifth problem that A/D converters require an input signal to have a large amplitude.

In the invention, the local oscillation signal is not made equal to the carrier frequency of a received signal, and a frequency offset corresponding to the channel interval frequency is provided as described above. Hence, a solution is provided for the sixth problem that, in the direct-conversion receiving scheme, the local oscillation signal is radiated from the antenna to interfere with adjacent stations, and a DC offset occurs to impart errors to a demodulated signal.

As described above, the invention is capable of providing a radio receiving apparatus which overcomes all of the above-mentioned problems of the prior art.

Now, embodiments according to the other aspect of the invention will be described with reference to FIGS. 41–53.

EMBODIMENT 6

Figure 41:
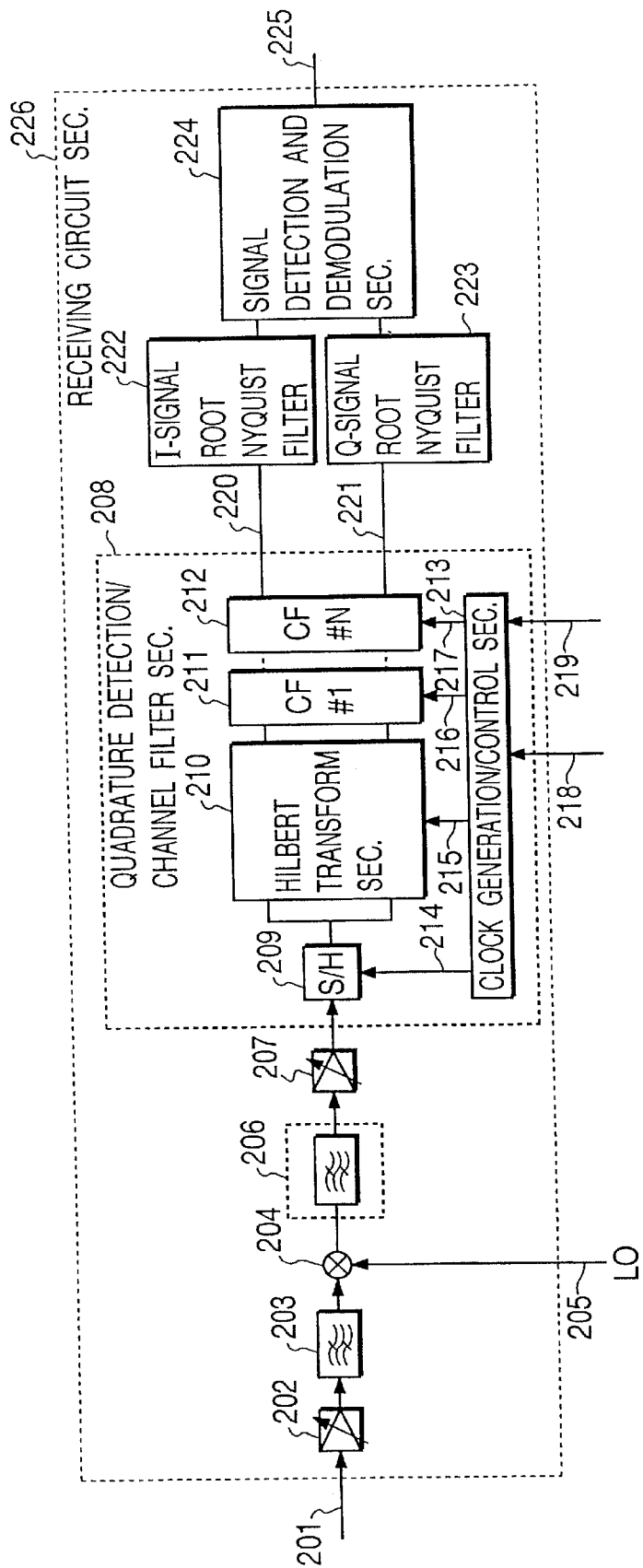
FIG. 41 is a block diagram showing the configuration of a radio receiving apparatus for receiving multi-band signals according to a sixth embodiment of the invention.

FIG. 41 is a block diagram showing the configuration of a radio receiving apparatus for receiving multi-band signals according to a sixth embodiment of the invention. Referring to FIG. 41, a receiving circuit section 226 is constituted of a low-noise high-frequency amplifier 202, a first filter 203 for eliminating signals of frequency bands other than the band allocated to the communications system concerned, a frequency converter 204, an intermediate frequency band filter 206, an automatic gain control amplifier 207, a quadrature detection/channel filter section 208, an I-signal root Nyquist filter 222, a Q-signal root Nyquist filter 223, and a signal detection and demodulation section 224.

The quadrature detection/channel filter section 208 consists of a sample-and-hold circuit 209, a Hilbert transform section 210, a first channel filter 211 to an Nth channel filter 212, and a clock generation/control section 213. Receiving a reference clock signal 218 and a clock control signal 219, the clock generation/control section 213 generates a clock signal 214 for the sample-and-hold circuit, a clock signal 215 for the Hilbert transform section, and a clock signal 216 for the first channel filter to a clock signal 217 for the Nth channel filter.

Next, the operation of the radio receiving apparatus of FIG. 41 will be described. Reception signals 201 from an antenna are amplified by the low-noise high-frequency amplifier 202, and supplied to the first filter 203, where signals other than the signal of the frequency band allocated to the communications system concerned are eliminated. The extracted signal is subjected to frequency conversion in the frequency converter 204. with the use of a local oscillation frequency signal 205. An output of the frequency converter 204 is supplied to an intermediate frequency band filter 206 which is set at the broadest one of frequency bandwidths of the communications system concerned. An output of the frequency converter 206 is amplified by the automatic gain control amplifier 207 to a predetermined signal intensity, and then supplied to the quadrature detection/channel filter section 208. Quadrature detection outputs, i.e., an I-signal output 220 and a Q-signal output 221, of the quadrature detection/channel filter section 208 are respectively supplied to the I-signal root Nyquist filter 222 and the Q-signal root Nyquist filter 223, where the respective signals are so shaped as to have Nyquist characteristics. Resulting signals are demodulated into a baseband signal 225 by the signal detection and demodulation section 224.

As shown in FIG. 42, the quadrature detection/channel filter section 208 includes N stages of channel filters 211, 211a, 211b, . . . , 212, to which clock signals 216, 216a, 216b, . . . ,217 are supplied from the clock generation/control section 213, respectively.

The operation of the N-stage channel filters will be described below with an assumption that N is equal to 2.

The basic configuration of the channel filter including complex coefficient filters has already been described above. Therefore, the N-stage channel filters will be described only with respect to items that are necessary to describe the current aspect of the invention, with an exception that the basic configuration of the channel filter will be described again with reference to FIG. 43, which corresponds to FIGS. 1, 11, 19, 29(a)–29(b), and 32(a) and the related descriptions. The Hilbert transform section 210 and a decimation section are similar to those described above in connection with FIGS. 17 and 14, respectively. The description of the basic configuration of the channel filter is intended to theoretically explain its frequency characteristic, to thereby show that the invention can accommodate a multi-band signals.

Figure 43:
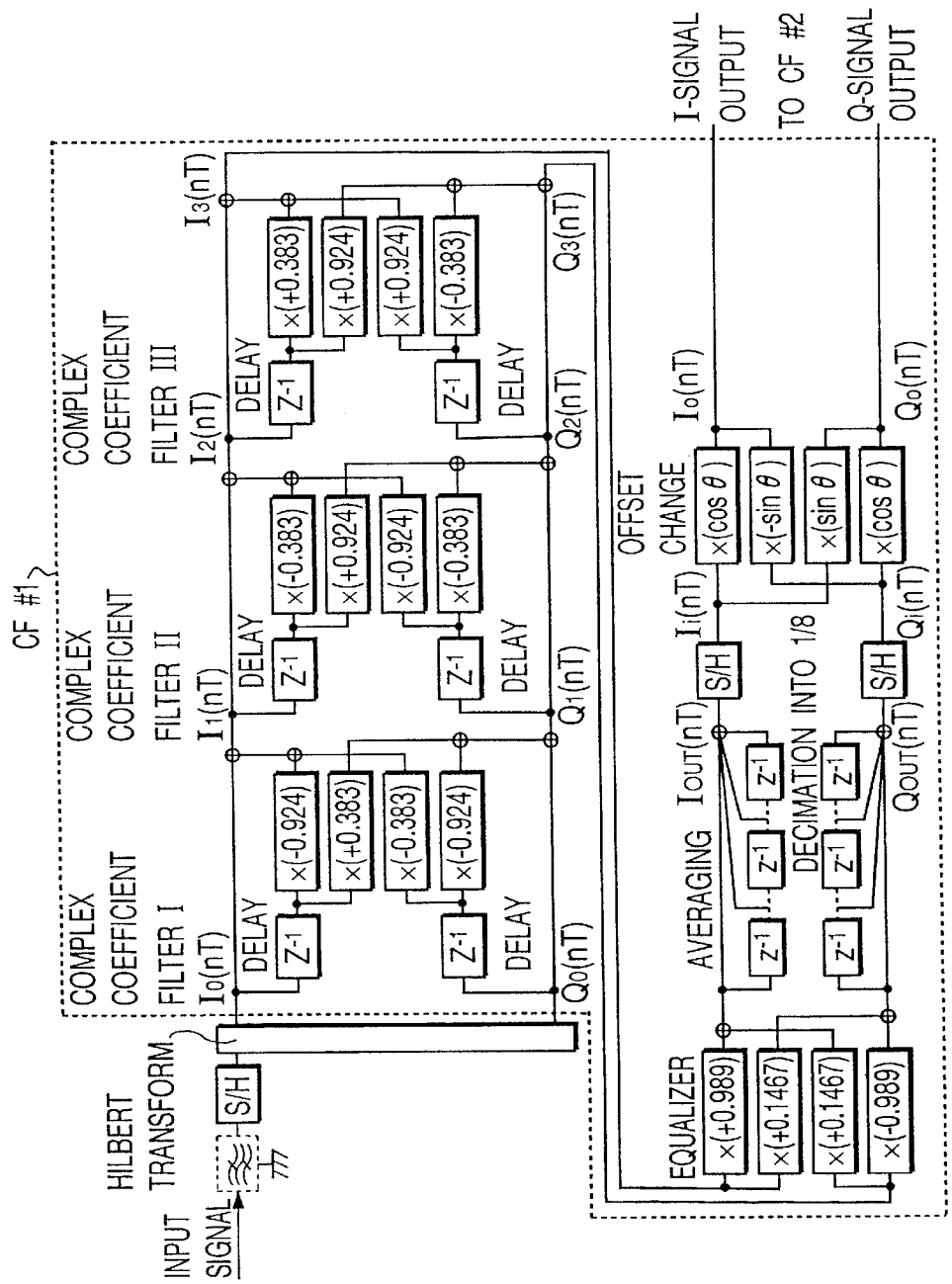
FIG. 43 shows the basic configuration of a channel filter including complex coefficient filters.

A theory of frequency characteristics of three complex coefficient filters shown in FIG. 43, which are the heart of the channel filter.

Figure 44:
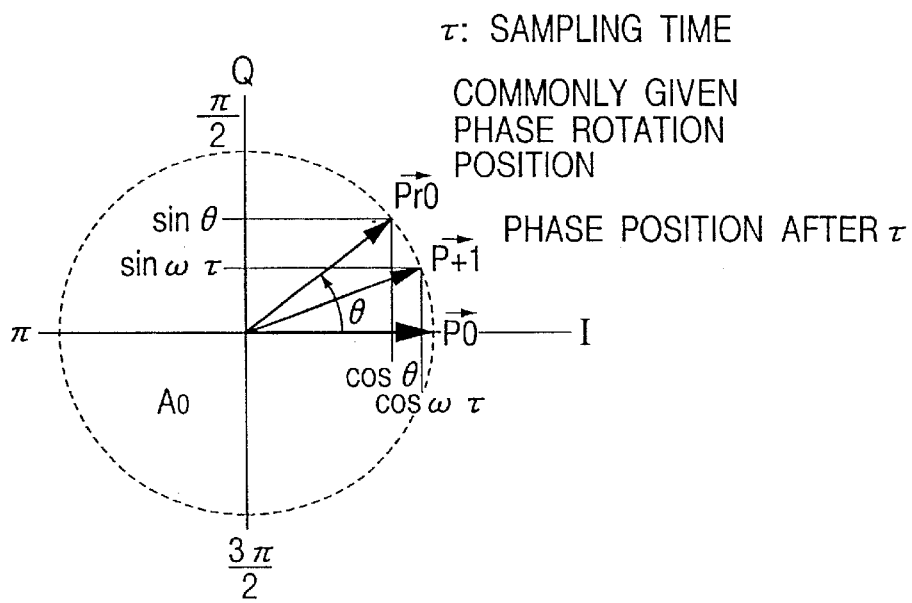
FIG. 44 is a phase diagram that is used to describe the frequency characteristic of a first-stage complex coefficient filter.

FIG. 44 shows the frequency characteristic of the first-stage complex coefficient filter. Assume that P0 represents a rotational signal vector having amplitude $A_0$ at time $t_0$. If sampling is performed every time period $\tau$, the next signal vector P+1 is located at a position that is rotated by a phase equal to the product of the angular frequency $\omega$ and the time period $\tau$. On the other hand, the vector rotation angle necessary to eliminate adjacent waves is denoted by $\theta$, vector Pr0 at time $t_0$ is obtained from vector P0. Since outputs of the complex coefficient filter is a vector sum of P+1 and Pr0, its orthogonal components, i.e., an I component (Ir(nT)) and a Q component (Qr(nT)), are expressed as $$Ir(nT)=I(\tau)+Ir=A_0(\cos \omega\tau+\cos \theta)$$

$$Qr(nT)=Q(\tau)+Qr=jA_0(\sin \omega\tau-\sin \theta).$$

The frequency characteristic of this vector is represented by power, i.e., an envelope of the vector. Thus, $$Power = |Ir(nT) + Qr(nT)|^2$$
$$= \{A_0(\cos\omega\tau + \cos\theta) + jA_0(\sin\omega\tau - \sin\theta)\} \times$$

-continued $$\{A_0(\cos\omega\tau + \cos\theta) - jA_0(\sin\omega\tau - \sin\theta)\}$$

$$= \{A_0(\cos\omega\tau + \cos\theta)\}^2 + \{A_0(\sin\omega\tau - \sin\theta)\}^2$$

$$= A_0^2\{\cos^2\omega\tau + 2\cos\omega\tau\cos\theta + \cos^2\theta\} +$$

$$A_0^2\{\sin^2\omega\tau - 2\sin\omega\tau\sin\theta + \sin^2\theta\}$$

$$= A_0^2\{\cos^2\omega\tau + \sin^2\omega\tau + \cos^2\theta + \sin^2\theta\} +$$

$$A_0^2\{2\cos\omega\tau\cos\theta - 2\sin\omega\tau\sin\theta\}$$

$$= 2A_0^2\{1 + \cos(\omega\tau + \theta)\}.$$

This equation indicates that the frequency characteristic has an angular frequency $\omega$ and two parameters, i.e., the sampling interval $\tau$ and the phase rotation angle $\theta$.

FIGS. 45(a)–45(d) show frequency characteristics as functions of the angular frequency $\omega$ in which both of the gain of the complex coefficient filter and the sampling interval $\tau$ are assumed to be 1.

Figure 45A:
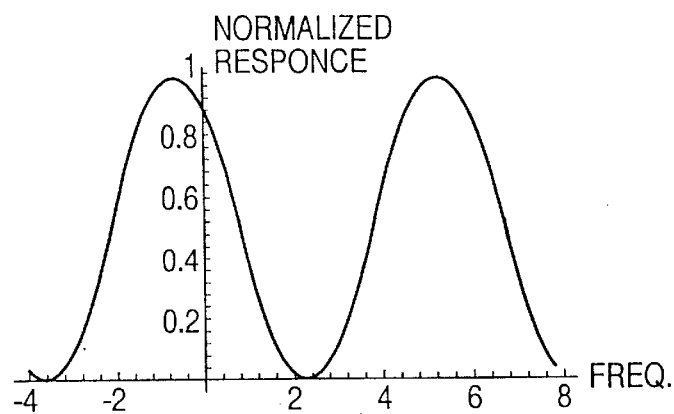
FIGS. 45(a)–45(d) show theoretical characteristics of the channel filter including the complex coefficient filters.
Figure 45B:
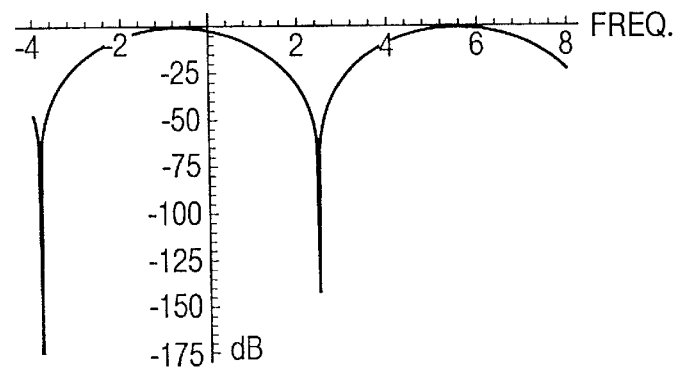
Figure 45C:
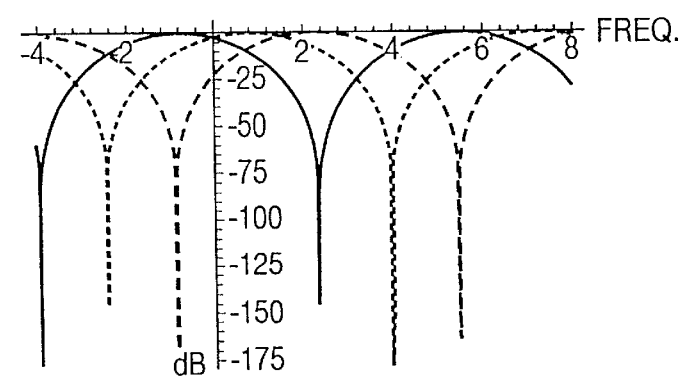
Figure 45D:
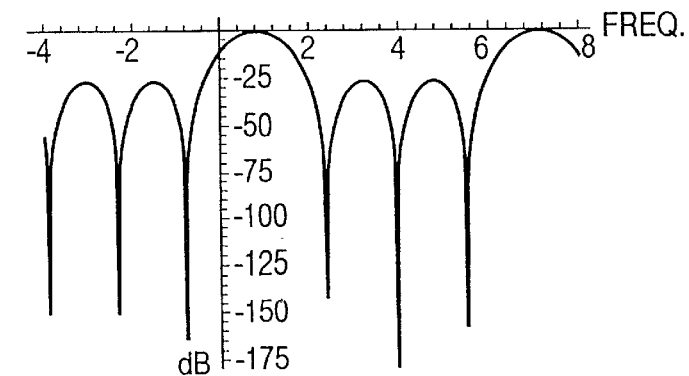

FIG. 45(a) corresponds a case where the phase rotation angle $\theta$ is $-\pi/4$, and shows a characteristic of the first-stage complex coefficient filter block of FIG. 43. FIG. 45(b) shows the same characteristic represented in dB. FIG. 45(c) shows characteristics of the first, second, and third complex coefficient filters of FIG. 43 in which the phase rotation angle $\theta$ is $-\pi/4$, $-2\pi/4$, and $-3\pi/4$, respectively. FIG. 45(c) shows a composite characteristic of the three filters in which attenuation of more than 125 dB is obtained at the center frequencies of the adjacent waves. Attenuation of 25 dB is obtained at the boundaries between the adjacent waves.

As already described in the early part of the description of the embodiments, the above characteristic results from the facts that the filter frequency regions of four channels is secured on each of the upper and lower sides by a 16-fold oversampling frequency, and that the null-point frequencies of the 3-stage comb filters except for the desired wave are set at the center frequencies of the adjacent waves by effecting an offset of the baseband frequency in the frequency conversion. In terms of the channel frequency width, four channels can be inserted between image frequencies of the sampling frequency.

Therefore, it is understood that decimating the sampling frequency into ¼ in the next stage in cascading channel filters each including the above complex coefficient filters allows realization of a very efficient filter having a highly symmetrical frequency characteristic.

Figure 46A:
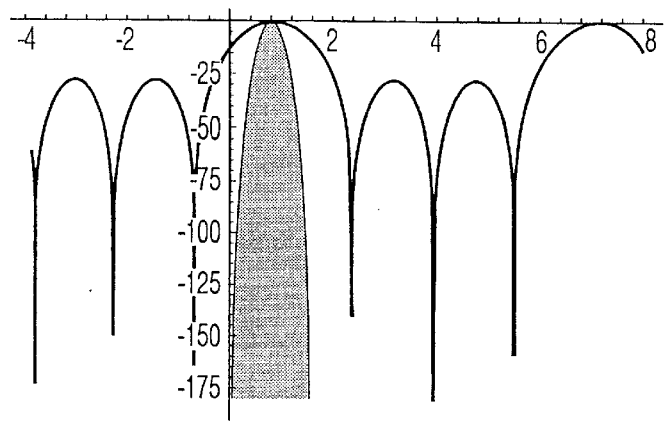
FIGS. 46(a)–46(c) show a total frequency characteristic of a 2-stage cascade connection of channel filters each including complex coefficient filters in which the sampling frequency of the second stage is decimated into ¼.
Figure 46B:
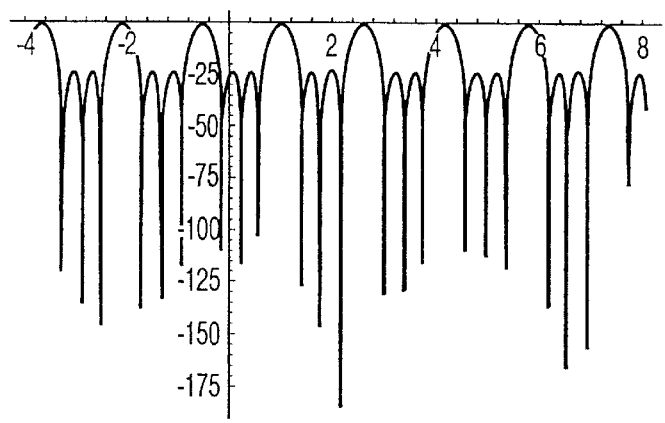
Figure 46C:
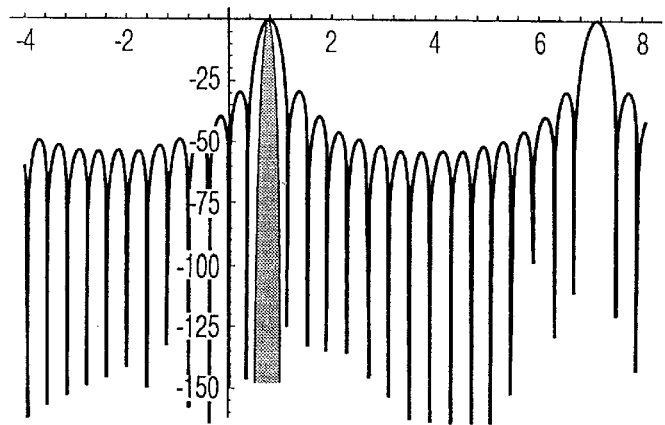

FIGS. 46(a)–46(c) show theoretical characteristics of a two-stage cascade connection of channel filters.

FIG. 46(a) shows a frequency characteristic that is obtained when the channel filter of FIG. 43 is driven by 64-fold oversampling with respect to the frequency bandwidth. FIG. 46(b) shows a frequency characteristic that is obtained when the channel filter of FIG. 43 is driven by 16-fold oversampling with respect to the frequency bandwidth. FIG. 46(c) shows a frequency characteristic of a cascade connection of the above two channel filters. It is seen from FIG. 46(c) that 16 channels are accommodated below the sampling frequency. Attenuation of more than 30 dB is obtained at the boundary between the second adjacent wave and the third adjacent wave, and attenuation reaches 60 dB at the boundary between the seventh and eighth adjacent waves. Apparently, the null-points of the filter are located at the center frequencies of the adjacent waves, where attenuation amounts to more than 125 dB.

Figure 47:
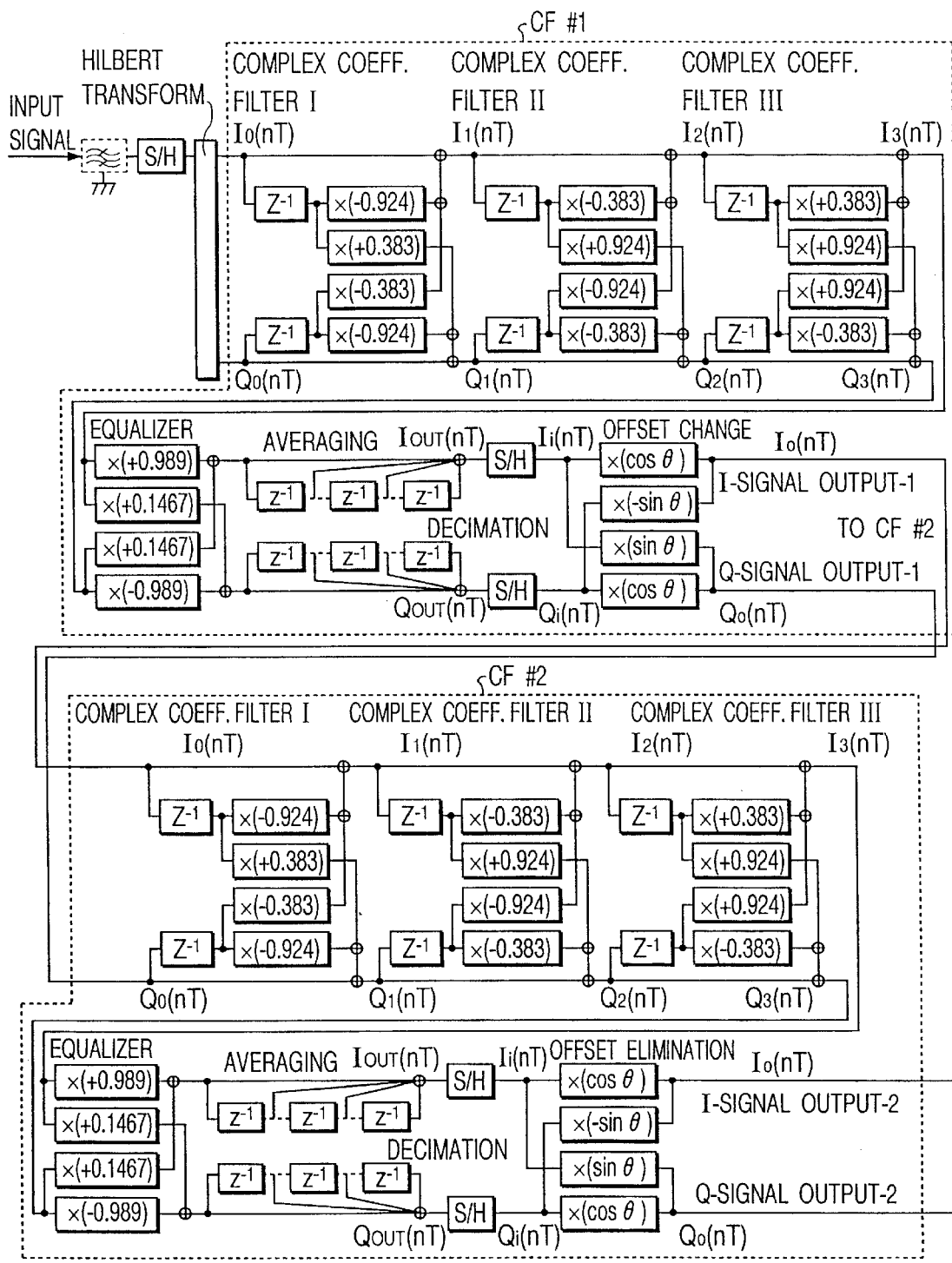
FIG. 47 shows a specific configuration according to the sixth embodiment of the invention in which channel filters each including complex coefficient filters are connected to each other in cascade.

FIG. 47 shows a specific example of a cascade connection of channel filters each including complex coefficient filters. Referring to FIG. 47, the bandpass filter passes only a component of the desired band of an input signal. A resulting signal is sampled by the sample-and-hold circuit at the frequency of a sampling clock signal. The Hilbert transform section separates an output of the sample-and-hold circuit into orthogonal components, which are supplied to a first channel filter. (There exist first and second channel filters that are connected to each other in cascade.)

First, in the first channel filter, complex coefficient filters I to III pass only a component of the desired band, and a phase rotation error caused therein is compensated for by an equalizer at the next stage. An output of the equalizer is supplied to an averaging circuit as a lowpass filter for eliminating high-frequency folding noise, and then to a decimation circuit as a sample-and-hold circuit for conversion into a low-rate sampling frequency, which is needed in the second channel filter of the next stage. Thereafter, the offset frequency is changed. The offset frequency should be kept the same even after the decimation.

This will be explained with reference to FIGS. 46(a) and 46(b). As shown in FIG. 46(a), in the first channel filter, the desired-wave band is given a frequency offset that is ½ of the bandwidth, i.e., ¼ of the pass bandwidth of the first channel filter. If outputs of the first channel filter were decimated and then supplied to the second channel filter, the frequency offset would be ¼ of the pass bandwidth of the second channel filter, causing a difference between the center frequencies of the pass bands of FIGS. 46(a) and 46(b). To correct for this deviation, a frequency offset circuit is provided at the final stage of the first channel filter. The outputs of the first channel filter are supplied to the second channel filter, which has the same configuration and performs the same operation as the first channel filter except the difference in sampling frequency. Thus, the filtering effect of FIG. 46(b) is obtained.

As described above, the filter for receiving multi-band signals according to the invention has the total characteristic shown in FIG. 46(c). In a frequency offset circuit at the final stage of the second channel filter, the frequency offset so far maintained is eliminated, to output I and Q signals as complete baseband signals.

In the first channel filter, signals having bandwidths respectively obtained by multiplying the bandwidth of an input signal to the sample-and-hold circuit by 1, ½, and ¼ can be extracted by switching the frequency of the sampling clock signal for the sample-and-hold circuit. This is because there are three null points between adjacent pass bands as shown in FIG. 46(a).

Similarly, in the second channel filter, signals having bandwidths respectively obtained by multiplying the bandwidth of an input signal to the sample-and-hold circuit by ¼, ⅛, and ¹⁄₁₆ can be extracted. That is, it is apparent that the bandwidth variable ratio per channel filter is 1:4.

Therefore, it is understood that if a multi-band radio receiver is to accommodate a bandwidth ratio of M, N channel filters may be prepared and connected to each other in cascade, where N is equal to $4^N$. However, since M needs to be an integer, processing for rounding up the decimal portion is needed.

That is, the invention can provide a multi-band radio receiver for a bandwidth ratio of M by preparing and cascading channel filters in a number obtained by rounding up the decimal portion of N that satisfies $M=4^N$.

EMBODIMENT 7

Figure 48:
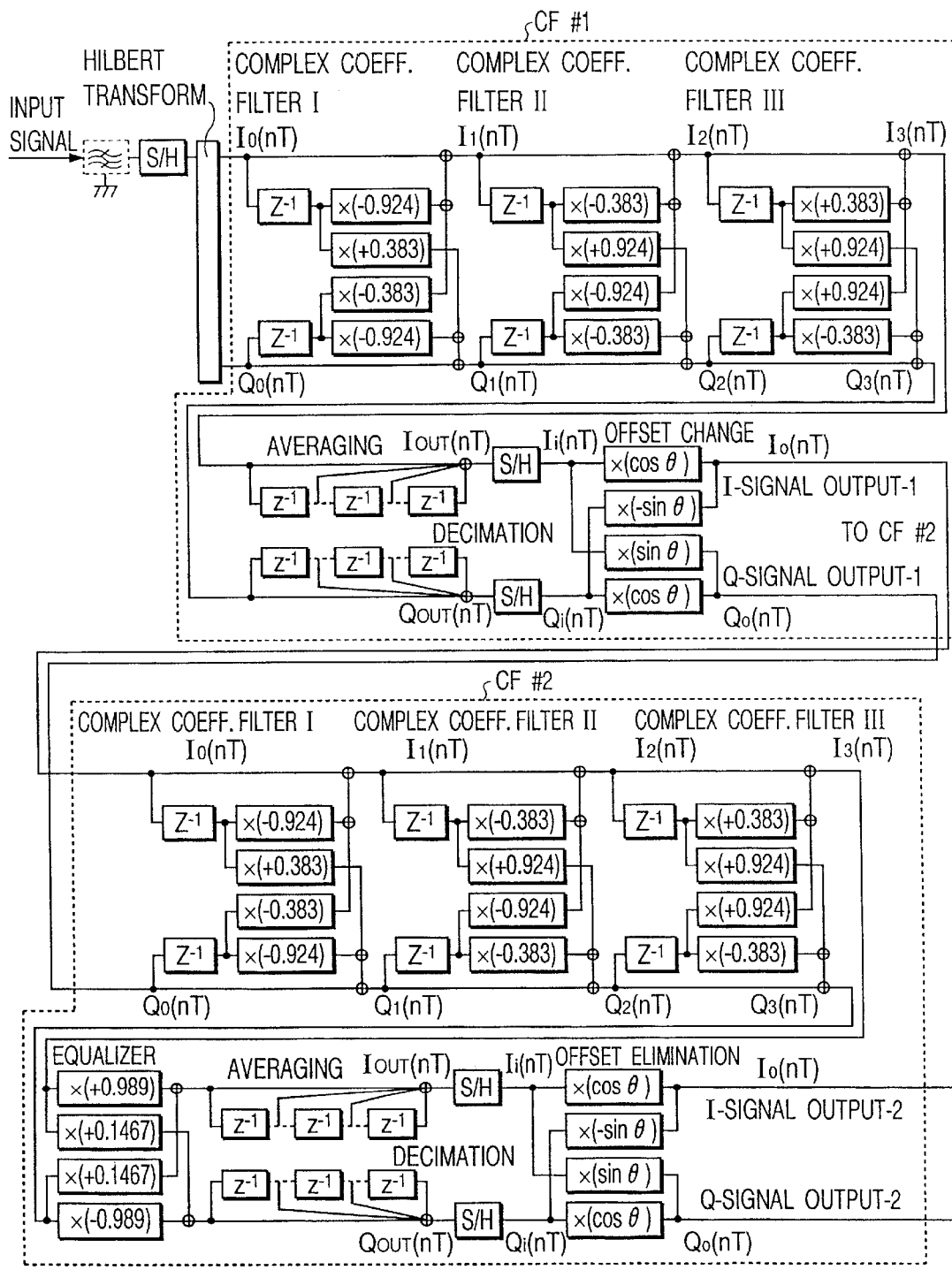
FIG. 48 shows a specific configuration according to an eighth embodiment of the invention in which channel filters each including complex coefficient filters are connected to each other in cascade.

FIG. 48 shows the configuration of a radio receiving apparatus according to a seventh embodiment of the invention. The first channel filter of this embodiment has the same configuration as that of FIG. 47 except that there is no equalizer. That is, the equalizer of the final-stage channel filter can also attain the function of the equalizer of the first channel filter.

Figure 49A:
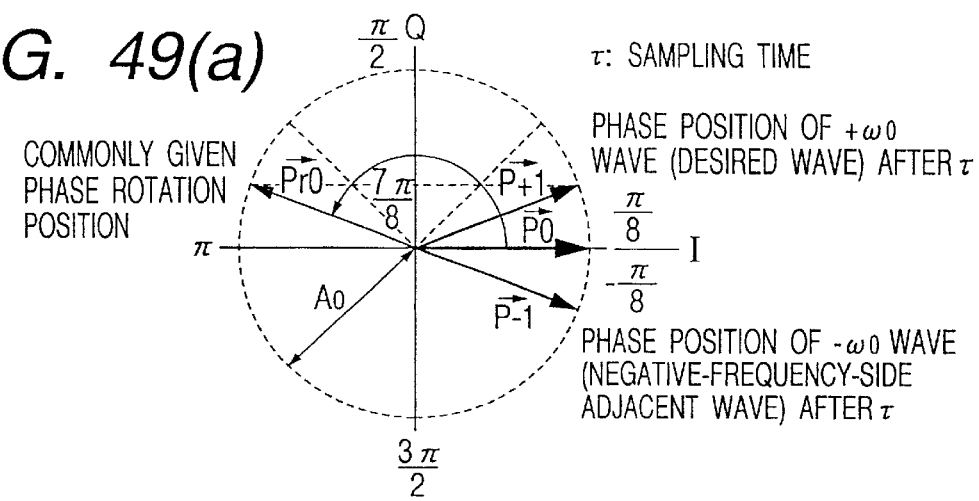
FIGS. 49(a)–49(c) show phase rotation in the respective stages of complex coefficient filters in the seventh embodiment of the invention.

Referring to FIGS. 49(a)–49(c) and 50, the phase compensation angle of the equalizer will be described theoretically. FIG. 49(a) shows the operation of the complex coefficient filter I for eliminating the first adjacent wave. Referring to FIG. 49(a), if it is assumed that vector P0 of phase 0 represents a negative frequency adjacent wave ($-\omega_0$) at time $t_0$, vector P−1, which is obtained by rotating vector P0 clockwise by $\pi/8$, should represent the negative frequency adjacent wave after a lapse of one sampling clock period. Vector Pr0 for canceling out vector P−1 can be generated from vector P0 by rotating it counterclockwise by $7\pi/8$. This is expressed in formulae as follows, which clearly show that vector Pr0 can be obtained by multiplying the components of vector P0 at time to by $\cos\theta$ and $\sin\theta$.

$$Ir(nT) = A_0\cos(-\omega_0 t_0 + \theta)$$
$$= A_0\cos(-\omega_0 t_0)\cos\theta - A_0\sin(-\omega_0 t_0)\sin\theta$$
$$= I_0(t_0)\cos\theta - Q_0(t_0)\sin\theta$$
$$Qr(nT) = A_0\sin(-\omega_0 t_0 + \theta)$$
$$= A_0\sin(-\omega_0 t_0)\cos\theta + A_0\cos(-\omega_0 t_0)\sin\theta$$
$$= Q_0(t_0)\cos\theta + I_0(t_0)\sin\theta$$

Figure 49B:
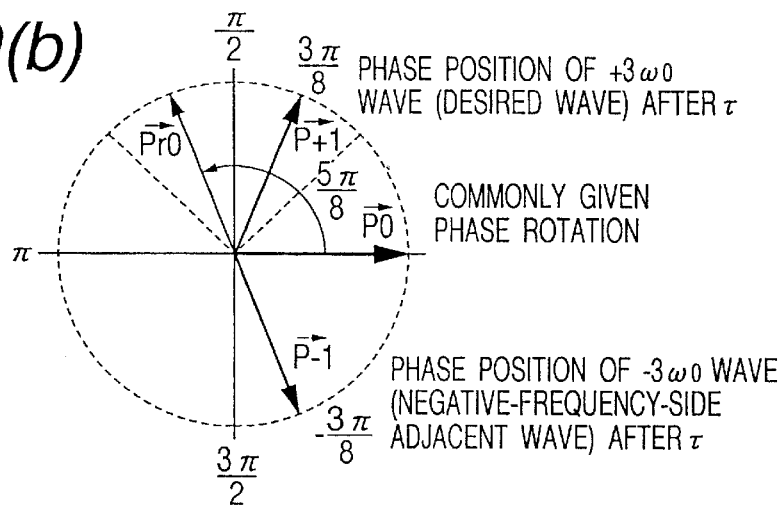
Figure 49C:
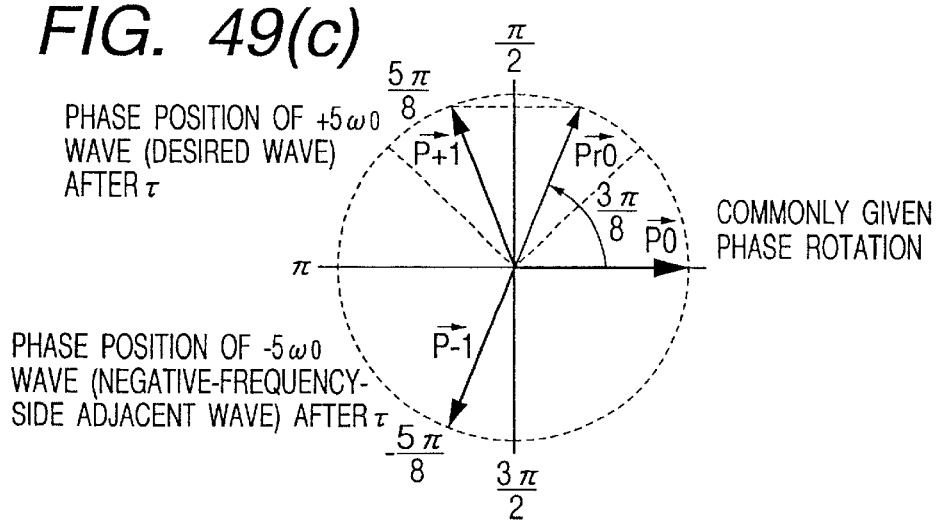

FIGS. 49(b) and 49(c) show phase rotation angles $5\pi/8$ and $3\pi/8$ for eliminating the second and third adjacent channels, respectively, in similar manners.

Figure 50:
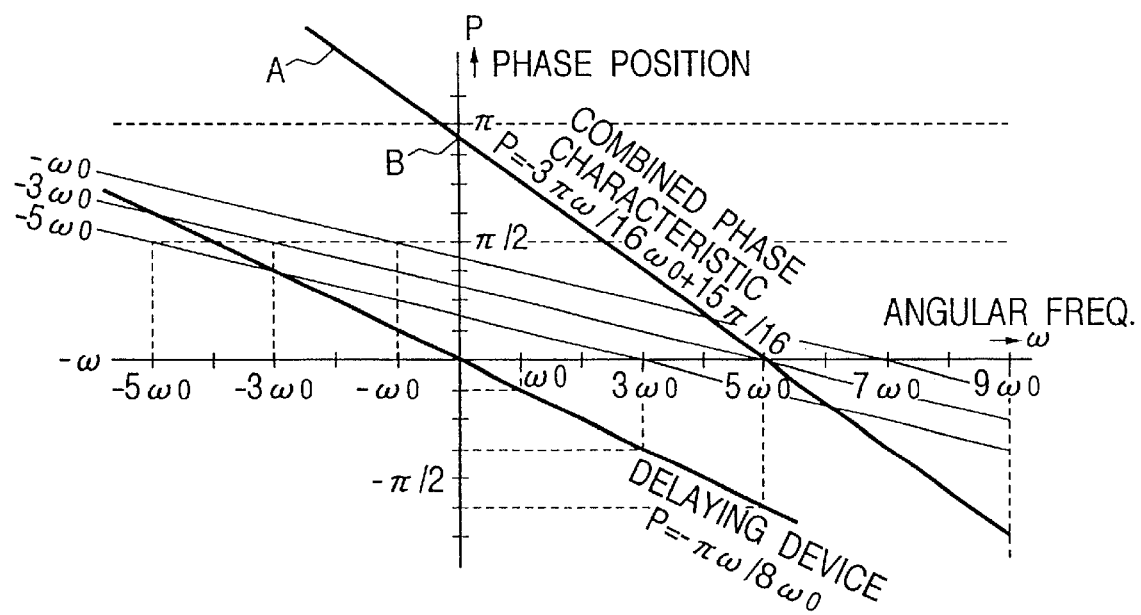
FIG. 50 shows phase characteristics of the respective complex coefficient filters and a phase characteristic of a channel filter as a combination thereof.

On the other hand, as mentioned above, the application of phase rotation means occurrence of distortion in the phase characteristic. FIG. 50 shows phase distortion caused by each complex coefficient filter. The phase characteristic of the three stages of filters is indicated by character A in FIG. 50 in which the phase offset is $15\pi/16$ as indicated by character This will be explained below. The null points of the complex coefficient filters I, II, and III are set at the center frequencies −fb, −3 fb, and −5 fb of the adjacent channels. The phase variation of the desired wave caused by the 16-fold oversampling in one sample period is $\pi/8$. As for the adjacent wave having the center frequency −fb, the phase difference occurring in one sample period is $-\pi/8$. To cancel out a signal of one sample later by rotating a signal vector of one sample before by $7\pi/8$. The desired wave, which has a phase difference $6\pi/8$, survives as a vector of $2\sin(\pi/8)$. If it is assumed that I-axis and Q-axis sample values at time t0 are $I_0$ and $Q_0$, rotation vectors at time t1 are calculated as I-axis rotation vector=$I_0 \cos 7\pi/8 - Q_0 \sin 7\pi/8$ Q-axis rotation vector=$I_0 \sin 7\pi/8 + Q_0 \cos 7\pi/8$.

By combining sample values at time t1 with values obtained by rotating a vector of one sample before, I-axis and Q-axis outputs $I_1$, and $Q_1$ of the complex coefficient filter I are calculated as $$I_1 = I_0(t = to + ts) - I_0(t = to)\cos 7\pi/8 - Q_0(t = to)\sin 7\pi/8 \quad (10)$$

$$Q_1 = Q_0(t = to + ts) + I_0(t = to)\sin 7\pi/8 + Q_0(t = to)\cos 7\pi/8. \quad (11)$$

where t and t0 represent time and ts denotes one sample period.

Similarly, in the complex coefficient filter II for eliminating the second adjacent channel, the rotation angle of a vector is set at $5\pi/8$, while in the complex coefficient filter III for eliminating the third adjacent channel the rotation angle of a vector is set at $3\pi/8$.

Hence, I-axis and Q-axis outputs of the complex coefficient filter II are calculated as $$I_2 = I_1(t = to + ts) + I_1(t = to)\cos 5\pi/8 - Q_1(t = to)\sin 5\pi/8 \quad (12)$$

$$Q_2 = Q_1(t = to + ts) + I_1(t = to)\sin 5\pi/8 + Q_1(t = to)\cos 5\pi/8. \quad (13)$$

I-axis and Q-axis outputs of the complex coefficient filter III are calculated as $$I_3 = I_2(t = to + ts) + I_2(t = to)\cos 3\pi/8 - Q_2(t = to)\sin 3\pi/8 \quad (14)$$

$$Q_3 = Q_2(t = to + ts) + I_2(t = to)\sin 3\pi/8 + Q_2(t = to)\cos 3\pi/8. \quad (15)$$

In FIG. 50, the center angular frequency of the desired wave is denoted by $+\omega_0$, and the center angular frequencies of the three lower adjacent channel waves are respectively represented by $-\omega_0$, $-3\omega_0$, $-5\omega_0$, phase characteristics P of the complex coefficient filters I, II, and III for eliminating the adjacent channel waves assume three rightwardly descending parallel lines corresponding to the following:

Complex coefficient filter I ($-\omega_0$ elimination):

P=$-\pi\omega/16\omega_0+3\pi/16$

Complex coefficient filter II ($-3\omega_0$ elimination):

P=$-\pi\omega/16\omega_0+5\pi/16$

Complex coefficient filter III ($-5\omega_0$ elimination):

P=$-\pi\omega/16\omega_0+7\pi/16$

If these three filter phase characteristics are combined, we obtain line A in FIG. 50, which is expressed by P=$-3\pi\omega/16\omega_0+15\pi/16$ An intercept B at $\omega=0$ is equal to $15\pi/16$. Thus, the equalizer should provide a phase shift that cancels out the above value $15\pi/16$.

It is seen from FIG. 50 that the respective phase characteristics of the complex coefficient filters I–III are linear. Therefore, it is apparent that the combined characteristic is also linear.

Where a plurality of channel filters are cascaded, the total characteristic is represented by a first-order function of the frequency as described below. The phase characteristic of the first-stage channel filter is $$P1 = (-\pi\omega/16\omega_0 + 3\pi/16) + (-\pi\omega/16\omega_0 + 5\pi/16) +$$
$$(-\pi\omega/16\omega_0 + 7\pi/16)$$
$$= -3\pi\omega/16\omega_0 + 15\pi/16.$$

If the sampling clock frequency is decimated into ¼ in the next-stage channel filter, the frequency of the desired wave becomes $\omega_0$ in that stage. Therefore, the phase characteristic P2 of the second-stage channel filter is $$P2 = (-4\pi\omega/16\omega_0 + 3\pi/16) + (-4\pi\omega/16/\omega_0 + 5\pi/16) +$$
$$(-4\pi\omega/16\omega_0 + 7\pi/16)$$
$$= (-\pi\omega/4\omega_0 + 3\pi/16) + (-\pi\omega/4\omega_0 + 5\pi/16) +$$
$$(-\pi\omega/4\omega_0 + 7\pi/16)$$
$$= -3\pi\omega/4\omega_0 + 15\pi/16.$$

The phase characteristic Pn of the nth-stage channel filter is $$Pn = (-4n\pi\omega/64\omega_0 + 3\pi/16) + (-4n\pi\omega/64\omega_0 + 5\pi/16) +$$
$$(-4n\pi\omega/64\omega_0 + 7\pi/16)$$
$$= (-n\pi\omega/16\omega_0 + 3\pi/16) + (-n\pi\omega/16\omega_0 + 5\pi/16) +$$
$$(-n\pi\omega/16\omega_0 + 7\pi/16)$$
$$= -3n\pi\omega/16\omega_0 + 15\pi/16.$$

Therefore, the total characteristic Ptotal of the n stages is $$Ptotal = \sum_{i=1}^{n} (-3i\pi\omega/16\omega_0 + 15\pi/16)$$
$$= -3n(n-1)\pi\omega/32\omega_0 + 15n\pi/16.$$

It is apparent that this is a first-order function of the frequency ω. Therefore, the phase distortion can be eliminated by performing phase compensation of 15nπ/16 by the equalizer of the final stage. That is, although in the sixth embodiment the equalizer is provided in each of the channel filters, the same characteristic can be obtained even if the equalizer is provided only in the final stage, whereby the circuits of the equalizers can be greatly reduced.

EMBODIMENT 8

Figure 51:
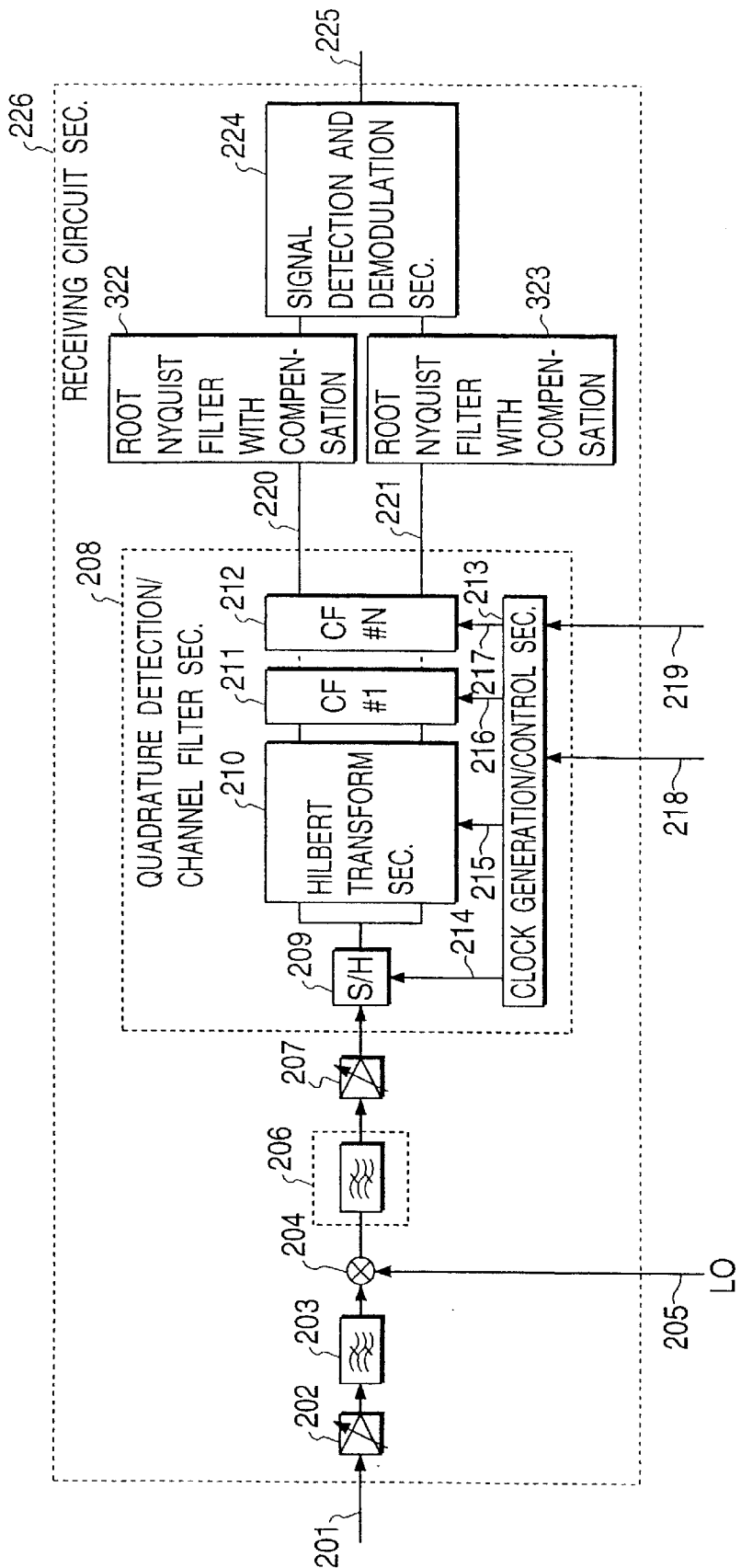
FIG. 51 is a block diagram showing the configuration of a radio receiving apparatus for receiving multi-band signals according to an eighth embodiment of the invention.

FIG. 51 shows the configuration of a radio receiving apparatus according to an eighth embodiment of the invention. This configuration is the same as that of FIG. 41 or 47 except that root Nyquist filters 322 and 323 with compensation are provided on the output side of the channel filters instead of the root Nyquist filters 222 and 223. That is, this embodiment is intended to maintain Nyquist transmission by compensating for, by the root Nyquist filters 322 and 323, deterioration that is introduced into the transmission characteristic by the channel filters.

Figure 52A:
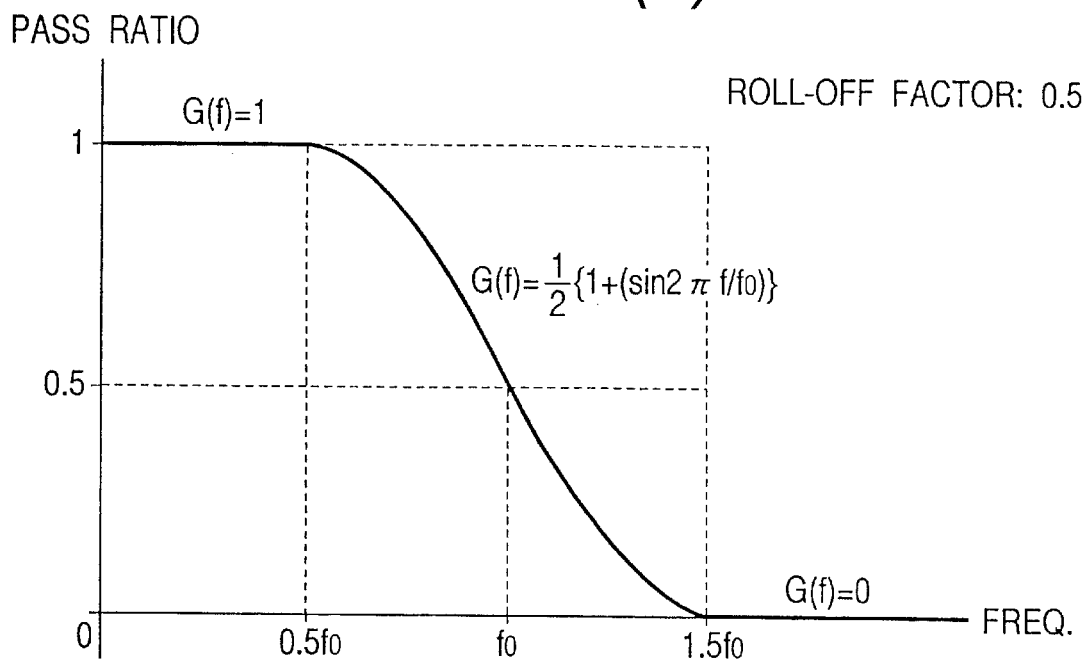
FIGS. 52(a) and 52(b) show a characteristic of a root Nyquist filter with compensation according to the eighth embodiment of the invention.
Figure 52B:
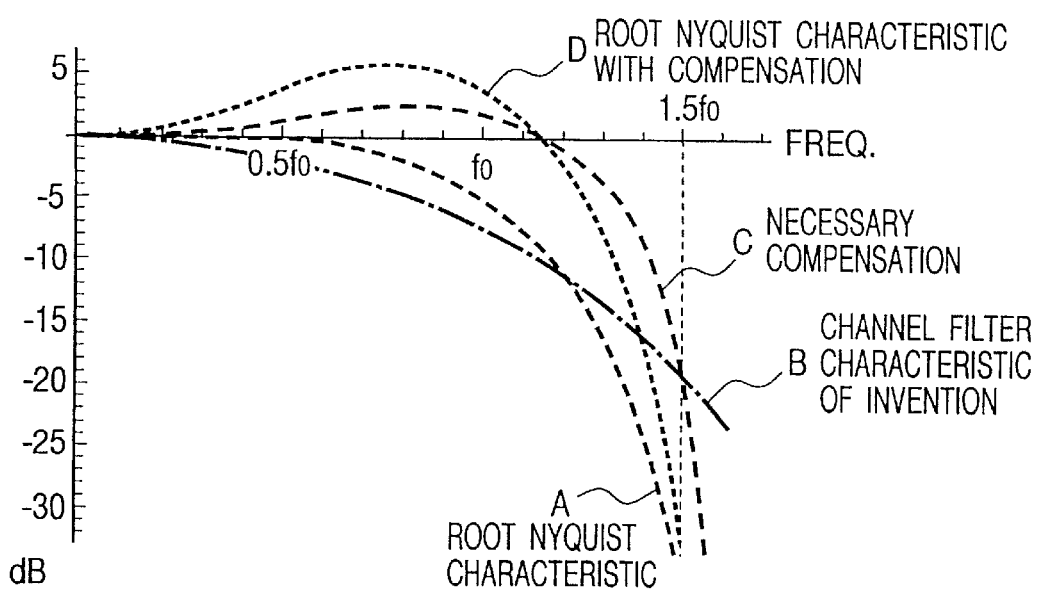

FIG. 52(a) shows a Nyquist frequency characteristic necessary for Nyquist transmission, and FIG. 52(b) shows deterioration with respect to the Nyquist frequency characteristic which occurs in the radio receiving apparatus of the sixth or seventh embodiment.

In general digital transmission, information is transmitted by using quantized levels, and a transmission waveform is converted into a Nyquist waveform to eliminate interference between information-bearing codes which is caused by a transient response. Since the Nyquist waveform is realized by the overall transmission system, the Nyquist waveform itself is generated at a discriminator of an input section of a decoder of a receiver. Therefore, to realize the Nyquist waveform, it is necessary to manage the total characteristic of the transmission system so that it has a roll-off characteristic that is symmetrical with respect to the point corresponding to a transmission frequency f0 as shown in FIG. 52(a). In general, the intended characteristic is equally allotted to the transmission and reception sides; therefore, a root Nyquist characteristic is established in each side.

In FIG. 52(b), character A denotes a root Nyquist characteristic. Usually, to avoid deterioration, attempts are made to maintain a flat frequency characteristic from the low-frequency range to f0. However, where the channel filters of the invention is used which provide a frequency characteristic 0.5(1+cos 2 πf/f0), the characteristic assumes curve B shown in FIG. 52(b) which includes large attenuation in the range below f0. Curve C of FIG. 52(b) represents compensation values for such errors. It is seen that corrections from +5 dB to −15 dB are needed in a frequency range below 1.5f0.

Figure 53:
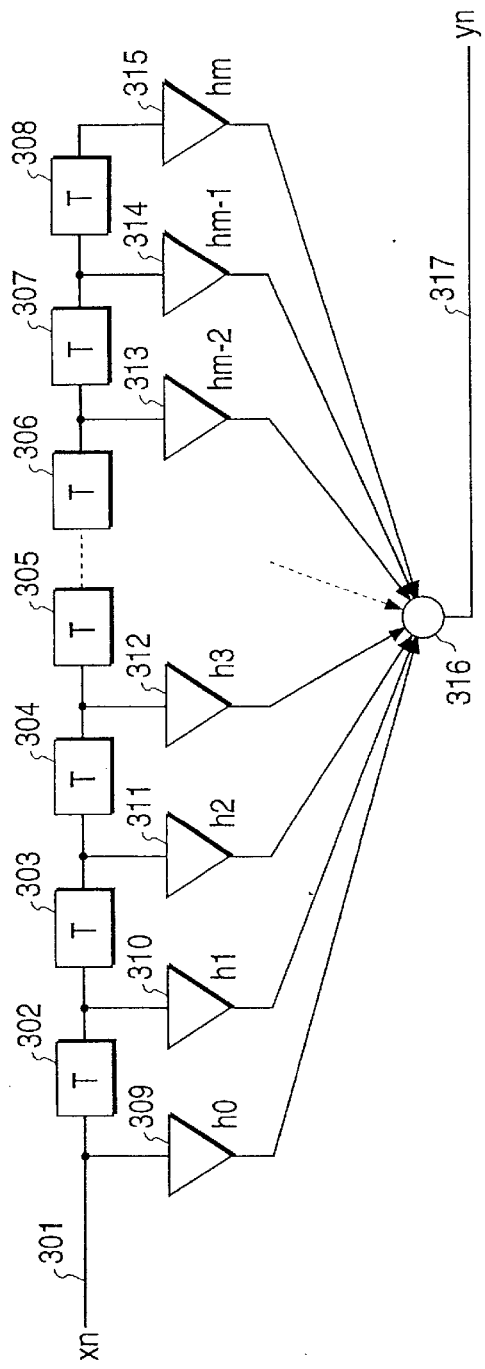
FIG. 53 shows the configuration of the root Nyquist filter with compensation according to the eighth embodiment of the invention.
Figure 54:
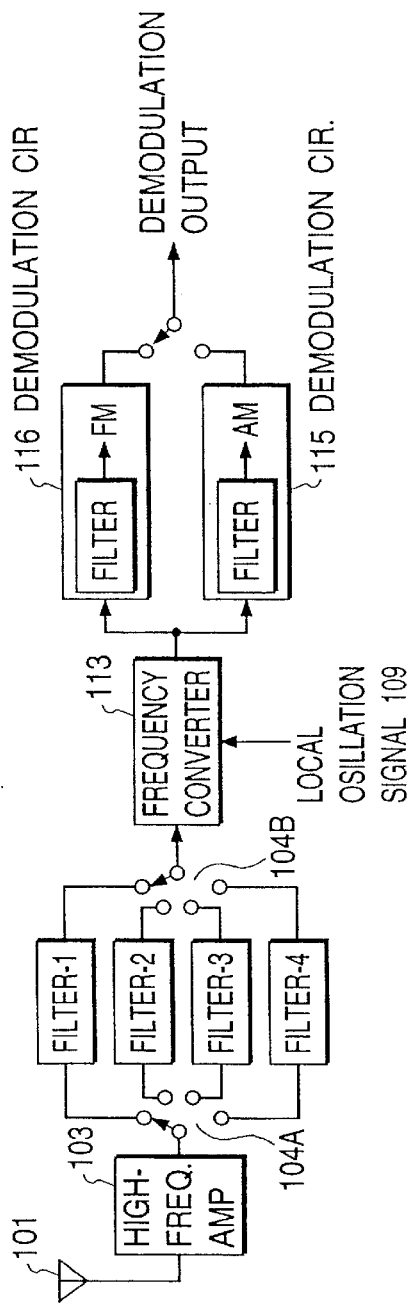
FIG. 54 shows the main part of a conventional radio receiving apparatus for receiving multi-band signals.
Figure 55A:
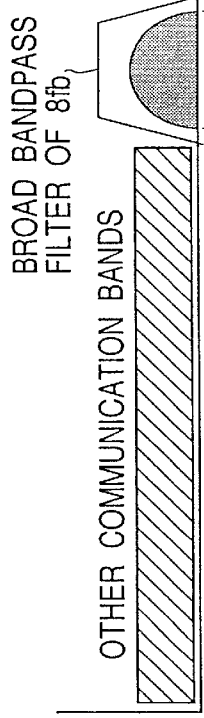
FIGS. 55(a)–55(d) show channel arrangements on the frequency axis in multi-band communications systems of the equi-frequency-interval channel arrangement scheme.
Figure 55B:
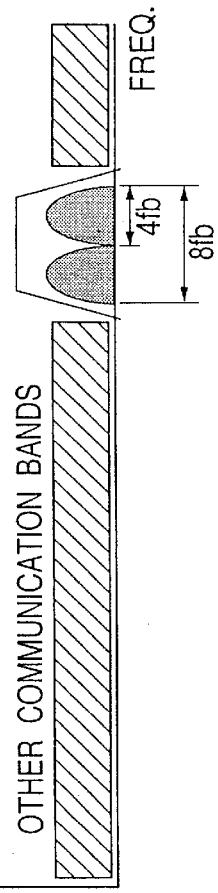
Figure 55C:
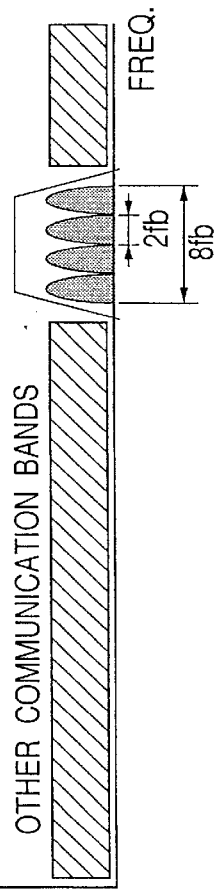
Figure 55D:

FIG. 53 shows the configuration of a digital signal processing system for realizing a root Nyquist filter which employs a commonly used digital filter. This root Nyquist filter is composed of signal delay devices 302–308 corresponding to a transmission sampling time, amplifiers 309–315 for weighting, and an adder 316.

If weighting coefficients h0, h2, h3, . . . , hm-2, hm-1, and hm of the amplifiers 309–315 are set equal to 1, a well-known comb filter characteristic is obtained. A root Nyquist filter is realized by setting the weighting coefficients h0, h2, h3, . . . , hm-2, hm-1, and hm to proper values. In the invention, the weighting coefficients h0, h2, h3, . . . , hm-2, hm-1, and hm of the root Nyquist filters 322 and 323 are so set as to provide the compensation characteristic of FIG. 52(b), to thereby provide a means for compensating for deterioration from the Nyquist transmission characteristic which is caused by the channel filters. It is apparent that in this manner not only can the advantages of the channel filter characteristics be obtained but also the root Nyquist characteristic can be secured without changing the circuit volume of the receiver system.

As described above, according to the invention, each of the channel filters includes complex coefficient filters, and the sampling frequency of each channel filter is decimated properly when necessary to enable reception of multi-band signals having a bandwidth ration N, the channel filters being connected in cascade in a number obtained by rounding up the decimal portion of a number N that satisfies $M=4^N$. In contrast to the conventional case in which to receive multiband signals filters are needed in the number N that is equal to the number kinds of multiple bands, in the invention the number of filters can be greatly reduced to approximately M. Further, the circuits can be implemented as integrated circuits, whereby the receiving apparatus can be reduced in size and power consumption.

What is claimed is:

1. A radio receiving apparatus for receiving multi-band signals, comprising a plurality of channel filters connected in cascade, each of the channel filters comprising a lattice-type complex coefficient filter, a sampling frequency of each of the channel filters being decimated properly when necessary to enable reception of multi-band signals having a bandwidth ratio M, the channel filters being provided in a number obtained by rounding up a decimal portion of a number N that satisfies $M=4^N$.

2. The radio receiving apparatus according to claim 1, wherein the channel filters further comprise an equalizer that is commonly used by at least part of the channel filters.

3. The radio receiving apparatus according to claim 2, further comprising a root Nyquist filter provided downstream of the channel filters, for compensating for a deterioration component that is added to a Nyquist characteristic by a receiving characteristic for a desired channel.

4. The radio receiving apparatus according to claim 1, further comprising a root Nyquist filter provided downstream of the channel filters, for compensating for a deterioration component that is added to a Nyquist characteristic by a receiving characteristic for a desired channel.

5. The radio receiving apparatus according to claim 1, further comprising a first frequency offset circuit for changing the offset frequency and a second frequency offset circuit for eliminating the offset frequency.

* * * * *

UNITED STATES PATENT AND TRADEMARK OFFICE
CERTIFICATE OF CORRECTION

PATENT NO. : 6,307,897 B1
DATED : October 23, 2001
INVENTOR(S) : Gen-ichiro Ohta et al.

It is certified that error appears in the above-identified patent and that said Letters Patent is hereby corrected as shown below:

Column 27,
Line 26, please delete "$_0$," and insert therefor -- $\omega_0$, --;
Line 29, please delete "$\sin \pi/8 = \cos 3\pi/8 = -\cos 5\pi/8 = \sin 7\pi/8 = 0.92388 = \beta$" and insert therefore -- $\cos \pi/8 = \sin 3\pi/8 = -\sin 5\pi/8 = \cos 7\pi/8 = 0.92388 = \beta$ --;
Line 42, please delete "However,." and insert therefor -- However, --;

Column 31,
Line 66, please delete "US" and insert therefor -- U5 --;

Column 32,
Line 9, please delete "US" and insert therefor -- U5 --;

Column 38,
Line 56, please delete "N" and insert therefor -- M --;

Column 39,
Line 61, please delete "$I_1 = I_0(t=to+ts) - I_0(t=to)\cos 7\pi/8 - Q_0(t=to)\sin 7\pi/8$" and insert therefor -- $I_1 = I_0(t=to+ts) + I_0(t=to)\cos 7\pi/8 - Q_0(t=to)\sin 7\pi/8$ --;

Signed and Sealed this

Twenty-third Day of April, 2002

Attest:

*Attesting Officer*

JAMES E. ROGAN
*Director of the United States Patent and Trademark Office*